(12) United States Patent
Kato et al.

(10) Patent No.: US 8,502,364 B2
(45) Date of Patent: Aug. 6, 2013

(54) SEMICONDUCTOR DEVICE MEMBER, PRODUCTION METHOD OF SEMICONDUCTOR-DEVICE-MEMBER FORMATION LIQUID AND SEMICONDUCTOR DEVICE MEMBER, AND SEMICONDUCTOR-DEVICE-MEMBER FORMATION LIQUID, PHOSPHOR COMPOSITION, SEMICONDUCTOR LIGHT-EMITTING DEVICE, LIGHTING SYSTEM AND IMAGE DISPLAY SYSTEM USING THE SAME

(75) Inventors: Hanako Kato, Fukuoka (JP); Yutaka Mori, Fukuoka (JP); Hiroshi Kobayashi, Fukuoka (JP); Tsubasa Tomura, Fukuoka (JP)

(73) Assignee: Mitsubishi Chemical Corporation, Tokyo (JP)

( * ) Notice: Subject to any disclaimer, the term of this patent is extended or adjusted under 35 U.S.C. 154(b) by 579 days.

(21) Appl. No.: 12/438,283

(22) PCT Filed: Aug. 22, 2007

(86) PCT No.: PCT/JP2007/066310
§ 371 (c)(1),
(2), (4) Date: Apr. 2, 2009

(87) PCT Pub. No.: WO2008/023746
PCT Pub. Date: Feb. 28, 2008

(65) Prior Publication Data
US 2009/0309116 A1    Dec. 17, 2009

(30) Foreign Application Priority Data
Aug. 22, 2006  (JP) ................... 2006-225410

(51) Int. Cl.
H01L 35/24    (2006.01)
H01L 31/0312  (2006.01)
H01L 23/58    (2006.01)
H01L 23/02    (2006.01)
H01L 51/00    (2006.01)

(52) U.S. Cl.
USPC ............... 257/678; 257/77; 257/40; 257/642

(58) Field of Classification Search
USPC ............... 257/678, 77, 79, 81, 687, 734, 794, 257/100, 91, 791, 792, 642, 40
See application file for complete search history.

(56) References Cited

U.S. PATENT DOCUMENTS
5,648,687 A   7/1997  Matsuo et al.
6,642,618 B2  11/2003 Yagi et al.
(Continued)

FOREIGN PATENT DOCUMENTS
EP    0 806 450    11/1997
JP    4-89871      3/1992
(Continued)

OTHER PUBLICATIONS
U.S. Appl. No. 12/950,128, filed Nov. 19, 2010, Kato, et al.
(Continued)

*Primary Examiner* — Chuong A. Luu
(74) *Attorney, Agent, or Firm* — Oblon, Spivak, McClelland, Maier & Neustadt, L.L.P.

(57) ABSTRACT

To provide a semiconductor device member that is superior in heat resistance, light resistance, film-formation capability and adhesion, and is capable of sealing a semiconductor device and holding a phosphor without causing cracks, peelings and colorings even after used for a long period of time, the weight loss at the time of heating, measured by a predetermined weight-loss at-the-time-of-heating measurement method, is 50 weight % or lower and the ratio of peeling, measured by a predetermined adhesion evaluation method, is 30% or lower, in the semiconductor device member.

16 Claims, 18 Drawing Sheets

U.S. PATENT DOCUMENTS

| | | | |
|---|---|---|---|
| 7,928,457 B2 | 4/2011 | Kato et al. | |
| 2002/0070449 A1 | 6/2002 | Yagi et al. | |
| 2004/0198924 A1 | 10/2004 | Young et al. | |
| 2005/0022697 A1* | 2/2005 | Benrashid et al. | 106/287.13 |
| 2006/0081864 A1 | 4/2006 | Nakazawa | |
| 2007/0191553 A1 | 8/2007 | Dhaler et al. | |
| 2008/0042142 A1 | 2/2008 | Sugawara et al. | |

FOREIGN PATENT DOCUMENTS

| | | |
|---|---|---|
| JP | 4293962 | 10/1992 |
| JP | 6273942 | 9/1994 |
| JP | 6-314816 | 11/1994 |
| JP | 8236271 | 9/1996 |
| JP | 8302211 | 11/1996 |
| JP | 1087993 | 4/1998 |
| JP | 11-116240 A | 4/1999 |
| JP | 11335493 | 12/1999 |
| JP | 2000-198930 | 7/2000 |
| JP | 2000-298352 A | 10/2000 |
| JP | 2001-192641 | 7/2001 |
| JP | 2001-230452 A | 8/2001 |
| JP | 2002-33517 | 1/2002 |
| JP | 3275308 | 2/2002 |
| JP | 2002-203989 | 7/2002 |
| JP | 2003-179270 | 6/2003 |
| JP | 2003-197976 | 7/2003 |
| JP | 2004-40031 | 2/2004 |
| JP | 2004140220 | 5/2004 |
| JP | 2004-162039 | 6/2004 |
| JP | 2004-221186 | 8/2004 |
| JP | 2004-231947 | 8/2004 |
| JP | 2004-266138 A | 9/2004 |
| JP | 2004269819 | 9/2004 |
| JP | 2004-359756 | 12/2004 |
| JP | 2005-22899 | 1/2005 |
| JP | 2005-509046 | 4/2005 |
| JP | 2005-159276 | 6/2005 |
| JP | 2006077234 | 3/2006 |
| JP | 2007-112973 | 5/2007 |
| WO | 2004/074885 | 9/2004 |
| WO | WO 2006/080338 A1 | 8/2006 |
| WO | 2007/034919 | 3/2007 |

OTHER PUBLICATIONS

Japanese Office Action issued Jul. 13, 2010, in Japanese Patent Application No. 2009-3366, filed Jan. 9, 2009 (with English-language Translation).

Japanese Trial Decision issued Jan. 18, 2011, in Patent Application No. 2009-3366 (with partial English-language translation).

Office Action mailed Mar. 27, 2012, in Japanese Patent Application No. 2007-216452 (with English-language Translation).

Yukio Narikawa, et al., "Development of high-luminance white light source using GaN-based light emitting devices", Publication of the Japan Society of Applied Physics, vol. 74, No. 11, pp. 1423-1432 (with partial English translation).

Office Action issued Dec. 4, 2012, in Japenese Patent Application No. 2008-212445 (with English Translation).

* cited by examiner

SEMICONDUCTOR DEVICE MEMBER, PRODUCTION METHOD OF SEMICONDUCTOR-DEVICE-MEMBER FORMATION LIQUID AND SEMICONDUCTOR DEVICE MEMBER, AND SEMICONDUCTOR-DEVICE-MEMBER FORMATION LIQUID, PHOSPHOR COMPOSITION, SEMICONDUCTOR LIGHT-EMITTING DEVICE, LIGHTING SYSTEM AND IMAGE DISPLAY SYSTEM USING THE SAME

TECHNICAL FIELD

The present invention relates to a novel semiconductor device member, to a production method of a semiconductor-device-member formation liquid and a semiconductor device member, and to a semiconductor light-emitting device, a semiconductor-device-member formation liquid and a phosphor composition. More specifically, the present invention relates to a semiconductor device member that is superior in heat resistance, light resistance, film-formation capability and adhesion, to a production method of a semiconductor-device-member formation liquid and a semiconductor device member, and to a semiconductor light-emitting device with a large-size semiconductor element that can be used at high temperatures. In addition, the present invention relates to a lighting system and an image display which are formed using the above-mentioned semiconductor light-emitting device.

BACKGROUND ART

In a semiconductor device, especially in a semiconductor light-emitting device such as a light emitting diode (hereinafter abbreviated as "LED" when appropriate) and a semiconductor laser, a semiconductor element (this is also referred to as "semiconductor luminous element") is generally sealed by a transparent member (semiconductor device member) made of resin or the like.

In recent years, the above-mentioned semiconductor light-emitting devices have been put to practical use as information displays used outdoors, such as traffic lights and outdoor displays, automotive headlights, and lighting systems, in place of incandescent lamps and fluorescent lamps, because of their high emission efficiency, viewability, ruggedness and the like. However, it is preferable to use a high-power light emitting device (so-called, a "power device") for those purposes. As a high-power semiconductor light-emitting device, a semiconductor element (chip) measuring 1 mm per side was disclosed, for example, (Non-Patent Document 1). However, it has been difficult to use a semiconductor light-emitting device generally as power device. Therefore, plurally-provided low-power elements have been used conventionally to circumvent the difficulty.

The reason why semiconductor light-emitting devices are difficult to be used generally as power devices is as follows. Namely, in order to increase light output of an LED, for example, the electric power to be supplied should be increased first. However, heat generation also comes to be increased, with increase in electric power supplied. If the LED chip is upsized, for the purpose of preventing increase in heat density, there will be unevenness in thermal expansion coefficients of the sealant and the chip, leading to low adhesion, as peeling of the sealant from the chip.

Epoxy resin, for example, has been used conventionally as the aforementioned semiconductor device member. In addition, a sealing resin that contains a pigment such as a phosphor so as to convert the luminous wavelength of the light emitted from the semiconductor element has also been known.

However, due to high hygroscopicity of epoxy resin, there have been problems of cracks caused by heat from the semiconductor element when the semiconductor device is used for a long time and degradation of the phosphor or the luminous element caused by moisture infiltration.

Also in recent years, with shortening of the luminous wavelength, there has been a problem of dramatic decrease in brightness of the semiconductor device because the epoxy resin degrades and colors when the device is used illuminated for a long time at a high output level.

In view of these problems, silicone resin, which is superior in heat resistance and ultraviolet-ray resistance, has been used as a substitute for epoxy resin. However, silicone resin does not yet have sufficient adhesion, transparency and weather resistance. Meanwhile, inorganic sealants, which are materials excelling in heat resistance and ultraviolet-ray resistance, and semiconductor devices using such sealants have been proposed (Refer, for example, to Patent Documents 1 to 6).

Non-Patent Document 1: Yukio Narikawa et al., "Oyo Butsuri", Vol. 74, 11th issue, p. 1423 to p. 1432, 2005
Patent Document 1: Japanese Patent Publication No. 3275308
Patent Document 2: Japanese Patent Laid-Open Publication No. 2003-197976
Patent Document 3: Japanese Patent Laid-Open Publication No. 2004-231947
Patent Document 4: Japanese Patent Laid-Open Publication No. 2002-33517
Patent Document 5: Japanese Patent Laid-Open Publication No. 2002-203989
Patent Document 6: Description of Japanese Patent Application No. 2006-047274

DISCLOSURE OF THE INVENTION

Problem to be Solved by the Invention

However, the treatment temperature of inorganic materials such as molten glass is as high as 350° C. or more and thus luminous elements will be damaged. Therefore, use of them as inorganic sealants has not been industrially realized.

On the other hand, glasses produced by sol gel methods have a problem of film-formation capability, such as crack generation and peeling, due to shrinkage on curing at the time of molding as semiconductor device member. Therefore, no such kind of glasses whose thick film state is stable over a long period of time have not yet been obtained.

Since the reactivity in sol-gel production methods is extremely high, condensation is difficult, and therefore, a large amount of solvent is often used. A large amount of solvent reduces the ratio of the solid portion of the sol. Therefore, when producing a semiconductor device member by applying the sol on a semiconductor device, it should be applied repeatedly until it reaches a predetermined thickness. This leads to low production efficiency. In addition, since the solvent is volatilized during the curing, an internal stress is liable to be generated in the cured semiconductor device member, leading frequently to crack generations and peelings. It is also unfavorable from the standpoint of burden on the environment.

Furthermore, these inorganic sealants are very hard and fragile, and therefore they are insufficient in film-formation capability. This leads to a problem of frequent generations of peelings, cracks and breaking of wires during use, since they can not follow the thermal expansion and thermal shrinkage of each of the members, which are different in thermal expansion coefficient, used in the semiconductor device. Those excelling in reflow resistance and temperature cycling resistance have not yet been realized, either. In this context, reflow means a soldering process in which soldering pastes are printed on a substrate and components are mounted thereon so as to be heated and connected. The above reflow resistance means a characteristic of ability to resist the thermal shock of up to 260° C. for 10 seconds.

For example, Patent Documents 1 and 2 describe a technology for forming a glass material using tetrafunctional alkoxysilane. However, in inorganic materials obtained from the technologies described in Patent Documents 1 and 2, a hydrolyzing liquid of tetrafunctional alkoxysilane was coated on a semiconductor light-emitting device and cured for several hours at a mild cure temperature of about 150° C., which does not damage performance of the semiconductor light-emitting device. In these cases, the obtained glass material was an incomplete glass body that usually contains more than 10 weight % of silanol. Thus, it has been impossible to obtain a glass body consisting entirely of siloxane bonds like molten glasses, by the technologies described in Patent Documents 1 and 2.

The reason is considered as follows. In contrast to general organic resins, the inorganic materials used in Patent Documents 1 and 2 have quite a lot of crosslinking points and therefore, the constraints by structure are considerable and the reactive ends cannot be condensed since they are isolated. Since such a glass body is not fine and the surface thereof is in a very highly hydrophilic state like silica gel, the glass body does not have sufficient sealing properties.

Such less reactive silanol generally starts to decrease very slightly when heated up to 250° C. or higher, and by burning the inorganic material at a high temperature of normally 350° C. or higher and preferably 400° C. or higher, the amount of silanol can actively be reduced. However, even if an attempt is made to remove silanol from the inorganic materials described in Patent Documents 1 and 2 using the above process, its realization is difficult to achieve because the heat-resistant temperature of a semiconductor device is normally 260° C. or lower.

Further, since tetrafunctional alkoxysilane eliminates a large amount of components during dehydration/dealcoholization condensation, the shrinkage factor during curing is substantially large. Moreover, because of high reactivity of tetrafunctional alkoxysilane, in the drying process, its curing starts from a surface portion from which part of a diluent solvent has evaporated and there is a tendency of forming a hard gel body including a solvent before discharging the internal solvent. This leads to a large shrinkage amount accompanying the solvent evaporation during and after the curing. Thus, inorganic materials described in Patent Documents 1 and 2 result in frequent cracks due to large internal stress caused by the shrinkage. Therefore, it has been difficult to obtain a large bulk body or thick film that is useful as a semiconductor device member using only tetrafunctional alkoxysilane as its material.

Also, for example, Patent Document 3 describes a technology for producing a three-dimensional phosphor layer with good dimensional accuracy by sol gel method using a silane compound containing organic groups as material. However, there is no detailed description of the degree of crosslinking in Patent Document 3, and high-concentration phosphor particles are required to obtain the inorganic material described in Patent Document 3. Since these phosphor particles act substantially as an aggregate to maintain the three-dimensional shape, no thick-film glass coated article that is transparent and contains no cracks has been obtainable without any phosphor contained in the inorganic material.

Further, acetic acid is used as catalyst in the technology of Patent Document 3. However, because acetic acid is not removed from the resultant inorganic material, the acetic acid affects a semiconductor element adversely. In addition, when forming the inorganic material described in Patent Document 3, it is practically impossible to heat the inorganic material together with a semiconductor device because its curing process requires a high temperature of 400° C. Furthermore, distortions in its structure are accumulated due to impractical condensation at high temperatures, and therefore, crack generations are not suppressed.

Also, for example, Patent Document 4 describes a technology for obtaining a semiconductor device member by means of coating with an inorganic coating agent that is obtained by mixing an inorganic sol having silica or siloxane as its skeletal structure with an inorganic light scattering agent. However, the inorganic material described in Patent Document 4 requires an inorganic light scattering agent, and further, Patent Document 4 provides no detailed description of the material and producing method thereof. This makes it impossible to correctly reproduce the technology.

Further, for example, Patent Document 5 describes a technology for obtaining a semiconductor device member by means of coating with a sol gel method glass. However, in the same way as in Patent Document 3, a phosphor is necessary to obtain the inorganic material described in Patent Document 5. In addition, though a resultant inorganic material is a thick film, due to the fact that the phosphor acts as an aggregate, the film thickness does not exceed 100 μm. Furthermore, Patent Document 5 provides no detailed description of the material and producing method thereof, and thus it is impossible to steadily reproduce the technology using a general alkoxysilane.

In addition, the present inventors disclosed a specific silicon-containing semiconductor device member that can solve the above-mentioned problems in Patent Document 6. However, it has been desirable to improve the heat stability further, while maintaining the light resistance, film-formation capability and adhesion, when it is used for a semiconductor power device, which is high in heat dissipation. It has also been desirable to inhibit the volatilization of the low-boiling impurities so as to enhance the yield by weight of the cured product in the manufacturing process of the semiconductor device member.

Moreover, various surface treatments are provided on a package of a semiconductor light-emitting device for the purpose of improving brightness (reflectance), durability/heat resistance, light resistance, adhesion, heat dissipating property and the like. In particular, power devices are often subjected to a surface treatment and the material thereof is often selected for the purpose of improving durability and heat resistance. In addition, a semiconductor element (chip) is often provided with a protective layer from the standpoint of manipulation or the like. In these ways, the surface materials of members that are in contact with the sealant in the semiconductor light-emitting device, such as the package and the semiconductor element, contain a peculiar component. This leads to a further cause for accelerating a problem of peeling.

With circumstances described above as a background, a semiconductor device member that is superior in heat resistance, light resistance, film-formation capability and adhesion, and is capable of sealing a semiconductor device and holding a phosphor without causing cracks, peelings and colorings even after used for a long period of time has been demanded.

The present invention has been made in view of the above problems. Namely, the first object of the present invention is to provide a novel semiconductor device member that is superior in heat resistance, light resistance, film-formation capability and adhesion, and is capable of sealing a semiconductor device and holding a phosphor without causing cracks, peelings and colorings even after used for a long period of time, a production method of a semiconductor-device-member formation liquid and a semiconductor device member, and a semiconductor-device-member formation liquid and a phosphor composition using the same. The second object of the present invention is to provide a semiconductor light-emitting device without cracks and peelings generated even after used for a long period of time and with superior brightness (reflectance), durability/heat resistance, light resistance, adhesion and the like even when used particularly for a power device, and a lighting system and an image display using the same.

Means for Solving the Problem

As a result of intensive investigation to achieve the above-mentioned objects, the inventors made the following findings. That is, a specific polymer that has small thermogravimetric reduction and a specified degree of film-formation capability can be formed into a thick film when used as semiconductor device member, and even at the thick film portion, such a polymer can be reduced in crack generation and excellent in heat resistance and light resistance. In addition, a sealant that is extremely high in adhesion to a material of which surface is treated and excellent in heat resistance and light resistance can be used even in a power device especially with a large-size semiconductor light-emitting chip. These findings have led to the completion of the present invention.

Namely, the subject matter of the present invention lies in a semiconductor device member whose weight loss at the time of heating, measured by the weight-loss at-the-time-of-heating measurement method (I) below, is 50 weight % or lower and ratio of peeling, measured by the adhesion evaluation method (II) below, is 30% or lower.

Weight-loss at-the-time-of-heating Measurement Method (I):

The weight loss is measured by a thermogravimetric/differential thermal analyzer for a 10-mg fragment of the semiconductor device member when it is heated from 35° C. to 500° C. at a temperature rising rate of 10° C/min under 200 -ml/min flow of air.

Adhesion Evaluation Method (II):

(1) A semiconductor-device-member formation liquid is dropped into a silver-plated copper cup having a diameter of 9 mm and a depth at the recess of 1 mm, and then cured under a predetermined curing condition, thereby preparing a semiconductor device member.

(2) The obtained semiconductor device member is let absorb moisture in an atmosphere of 85-° C. temperature and 85-% humidity for 20 hours.

(3) The semiconductor device member that absorbed moisture is heated from room temperature to 260° C. in 50 seconds, and then kept at 260° C. for 10 seconds.

(4) The heated semiconductor device member is cooled to room temperature, and then the existence or the nonexistence of a peeling of the semiconductor device member from the above-mentioned copper cup is observed both by visual inspection and with a microscope.

(5) The ratio of peeling of the semiconductor device member is determined by conducting the above operations (2), (3) and (4) for each of 10 the semiconductor device members.

Another subject matter of the present invention lies in a semiconductor device member whose weight loss at the time of heating, measured by the weight-loss at-the-time- of-heating measurement method (I) described above, is 50 weight % or lower and measurement value of hardness (Shore A) by durometer type A is 5 or larger and 90 or smaller.

In this case, it is preferable that the skeletal structure thereof is a metalloxane bond.

Further, it is preferable that the semiconductor device member of the present invention contains inorganic particle.

Further, it is preferable that the semiconductor device member of the present invention contains a phosphor.

Still another subject matter of the present invention lies in a production method of a semiconductor-device-member formation liquid containing a polycondensate obtained by performing hydrolysis and polycondensation of a compound represented by the following formula (1) and/or an oligomer thereof, wherein the hydrolysis and polycondensation are performed in the presence of an organometallic compound catalyst containing at least one kind of element selected from zirconium, hafnium, tin, zinc and titanium.

[Chemical Formula 1]

$$M^{m+}X_nY^1_{m-n} \qquad (1)$$

(In the formula (1), M represents at least one element selected from silicon, aluminum, zirconium and titanium, X represents a hydrolyzable group, $Y^1$ represents a univalent organic group, m represents an integer of 1 or larger representing the valence of M, and n represents an integer of 1 or larger representing the number of X groups, where m>n.)

Still another subject matter of the present invention lies in a production method of a semiconductor-device-member formation liquid containing a polycondensate obtained by performing hydrolysis and polycondensation of a compound represented by the following formula (2) and/or an oligomer thereof, wherein the hydrolysis and polycondensation are performed in the presence of an organometallic compound catalyst containing at least one element selected from zirconium, hafnium, tin, zinc and titanium.

[Chemical Formula 2]

$$(M^{s+}X_tY^1_{s-t-1})_uY^2 \qquad (2)$$

(In the formula (2), M represents at least one element selected from silicon, aluminum, zirconium and titanium, X represents a hydrolyzable group, $Y^1$ represents a univalent organic group, $Y^2$ represents a u-valent organic group, s represents an integer of 2 or larger representing the valence of M, t represents an integer of 1 or larger and s−1 or smaller, and u represents an integer of 2 or larger.)

Still another subject matter of the present invention lies in a production method of a semiconductor device member, comprising a step of drying a polycondensate obtained by performing hydrolysis and polycondensation of a compound represented by the following formula (1) and/or an oligomer thereof, wherein the hydrolysis and polycondensation are performed in the presence of an organometallic compound catalyst containing at least one element selected from zirconium, hafnium, tin, zinc and titanium.

Still another subject matter of the present invention lies in a production method of a semiconductor device member, comprising a step of drying a polycondensate obtained by performing hydrolysis and polycondensation of a compound represented by the following formula (2) and/or an oligomer thereof, wherein the hydrolysis and polycondensation are performed in the presence of an organometallic compound catalyst containing at least one element selected from zirconium, hafnium, tin, zinc and titanium.

Still another subject matter of the present invention lies in a semiconductor light-emitting device comprising at least the semiconductor device member described above.

Still another subject matter of the present invention lies in a semiconductor-device-member formation liquid produced by a production method of semiconductor-device-member formation liquid described above.

Still another subject matter of the present invention lies in a semiconductor light-emitting device comprising an (A) package, (B) semiconductor element and (C) sealant, wherein the surface materials of the (A) package and/or the (B) semiconductor element contain one or more of Si, Al and Ag, and the (C) sealant is in direct contact with the surface materials of the (A) package and/or the (B) semiconductor element and satisfies all of the following conditions (i) to (iii).

(i) The sealant has a functional group capable of forming a hydrogen bond with an oxygen in a metalloxane bond or a hydroxyl group, which is present on the surface of a ceramic or a metal, (ii) The maintenance rate of transmittance with respect to light of 400-nm wavelength before and after kept at temperature of 200° C. for 500 hours is 80% or more and 110% or less, and (iii) The maintenance rate of transmittance with respect to the light of 400-nm wavelength before and after being irradiated with light having wavelength of 370 nm or longer and center wavelength of 380 nm and radiant intensity of 0.6 kW/m$^2$ for 72 hours is 80 % or more and 110% or less.

In this case, it is preferable that the semiconductor light-emitting device of the present invention further satisfies the following condition (iv).

(iv) The ratio of brightness after 500 hours illumination, in which a square semiconductor element measuring 900 μm per side having 460±10 nm of luminous wavelength is illuminated at 85-° C. temperature and 85-% relative humidity for 500 hours in a continuous manner with 350 mA of driving current while maintaining the temperature of the emission surface at 100±10°C., relative to that of just after switched on is 90% or higher.

Further, it is preferable that the semiconductor light-emitting device of the present invention contains the (C) sealant of the semiconductor device member of the present invention.

Further, it is preferable that the surface materials of the (A) package and/or the (B) semiconductor element contain one or more of SiNx, SiC and SiO2.

Further, it is preferable that the surface materials of the (A) package and/or the (B) semiconductor element contain one or more of Al, AlN and Al2O3.

Further, it is preferable that the (B) semiconductor element of the semiconductor light-emitting device of the present invention contains the surface material in its substrate part.

Further, it is preferable that the area of the emission surface of the (B) semiconductor element of the semiconductor light-emitting device of the present invention is 0.15 mm$^2$ or larger.

Further, it is preferable that the surface temperature of the emission surface of the (B) semiconductor element of the semiconductor light-emitting device of the present invention during operation is 80° C. or higher and 200° C. or lower.

Further, it is preferable that the amount of electric power during operation of the semiconductor light-emitting device of the present invention is 0.1 W or larger.

Still another subject matter of the present invention lies in a lighting system formed using the semiconductor light-emitting device of the present invention.

Still another subject matter of the present invention lies in an image display formed using the semiconductor light-emitting device of the present invention.

ADVANTAGEOUS EFFECT OF THE INVENTION

The semiconductor device member of the present invention is superior in heat resistance, light resistance, film-formation capability and adhesion, and capable of sealing a semiconductor device without causing cracks or peelings even after used for a long period of time. Usually, it can be applied in a thicker film state than the previous inorganic semiconductor device member. It can easily seal the semiconductor device and hold the phosphor just by applying it on the semiconductor device and drying With the semiconductor-device-member formation liquid and the phosphor composition of the present invention, the semiconductor device member of the present invention can be produced.

By the production methods of the semiconductor-device-member formation liquid and the semiconductor device member of the present invention, the semiconductor-device-member formation liquid and the semiconductor device member of the present invention can be produced.

The semiconductor light-emitting device of the present invention can maintain its performance for a long period of time without causing cracks, peelings or colorings even after used for a long time, because the sealant thereof is superior in heat resistance, light resistance, film-formation capability and adhesion.

BRIEF DESCRIPTION OF THE DRAWINGS

FIG. 3 shows Embodiment B-1.

EXPLANATION OF LETTERS OR NUMERALS

Figure 1:
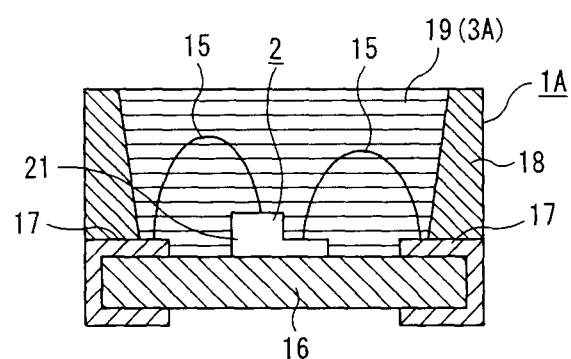
FIG. 1 is a schematic sectional view showing Embodiment A-1.

1, 1A, 1B Light emitting device (semiconductor light-emitting device)
2 Luminous element
3A Transparent member (semiconductor light-emitting device member)
3B Phosphor part (semiconductor light-emitting device member)
**4*a*, 4*b*** Part of light emitted from a luminous element
5 Light of wavelengths specific to phosphor components, such as phosphor particles, fluorescent ions and fluorescent dyes, contained in the phosphor part
11 Mold part
12, 13 Lead terminal
14 Mirror (cup part)
15 Conductive wire
16 Insulating substrate
**16*a*** Hollow
17 Printed wiring
18 Frame
19 Sealing part
**19*a*** Sealing function part
**19*b*** Lens function part
**19*c*** Recess
**19*d*** Through-hole
21 Luminous layer part
23 Reflecting layer
24 Bump
33, 34 Phosphor part
35 Solid medium
36 Lid
101 Cup
102 LED chip
103 Light emitting device

BEST MODES FOR CARRYING OUT THE INVENTION

The present invention will be described in detail below, but it is to be understood that the present invention is not limited to the embodiment shown below and any modification can be added thereto insofar as they do not depart from the scope of the present invention.

[1] Semiconductor Device Member

The first semiconductor device member of the present invention has characteristics (1) and (2) shown below.

Characteristic (1): The weight loss at the time of heating, measured by the specific weight-loss at-the-time-of-heating measurement method (1) below, is 50 weight % or lower.

Characteristic (2): The ratio of peeling, measured by the specific adhesion evaluation method (II) below, is 30% or lower.

The second semiconductor device member of the present invention has the above-mentioned characteristic (1) and the characteristic (3) shown below.

Characteristic (3): The measurement value of hardness (Shore A) by durometer type A is 5 or larger and 90 or smaller.

In the following, these characteristics (1), (2) and (3) will be explained first. In the following explanation, the first and second semiconductor device members of the present invention will be referred to simply as "the semiconductor device member of the present invention" when no distinction is made between them.

[1-1] Weight Loss at the Time of Heating

Weight loss at the time of heating is an index for evaluating the high-level heat resistance of the semiconductor device member of the present invention. It is measured by the weight-loss at-the-time-of-heating measurement method (I) to be described later.

The weight loss at the time of heating of the semiconductor device member of the present invention is 50 weight % or lower, preferably 40 weight % or lower, and more preferably 35 weight % or lower, and there is no lower limit specially, but it is usually 5 weight % or higher, preferably 10 weight % or higher (characteristic (1)). When the weight loss at the time of heating is too large, a long-term use of the semiconductor device induces a shrinkage, leading possibly to failing in maintenance of the initial performance. As the reason why the weight loss at the time of heating becomes large can be cited, for example, a large amount of volatile low-molecular-weight component contained in the semiconductor device member, a proneness to cleavage of the main chain which forms the semiconductor device member by heat, and so on. A small amount of weight loss at the time of heating makes the semiconductor device member superior in heat stability, but such a semiconductor device member will be a hard film because it generally contains much polyfunctional Si component. Therefore, a semiconductor device member with too small weight loss at the time of heating is inferior in heat cycle resistance, reflow resistance and the like, which is not unfavorable for a semiconductor device member.

[Weight-loss at-the-time-of-heating Measurement Method (I)]

The weight loss is measured by a thermogravimetry/differential thermal analysis (hereinafter abbreviated as "TG-DTA" as appropriate) apparatus for a 10-mg fragment of the above-mentioned semiconductor device member when it is heated from 35° C. to 500° C. at a temperature rising rate of 10° C./min under 200-ml/min flow of air.

Satisfying the following requirements, for example, can realize the above-mentioned characteristic (1) of the semiconductor device member of the present invention.

(i) Selecting raw materials properly. For example, the materials having constructions described in [1-4-1], to be described later, can be selected, or the materials described in [2-1], to be described later, can be used.

(ii) Selecting catalysts in the process of hydrolysis and polycondensation described in [2-2], to be described later.

(iii) Molecular weight control in the process of hydrolysis and polycondensation described in [2-2], to be described later, and/or during storage of the hydrolyzate/polycondensate.

[1-2] Adhesion

Ratio of peeling in the adhesion evaluation is an index for evaluating the adhesion of the semiconductor device member of the present invention. It is measured by the adhesion evaluation method (II) to be described later.

The ratio of peeling of the semiconductor device member of the present invention is usually 30% or lower, preferably 20% or lower, and more preferably 10% or lower (characteristic (2)). Among them, 0% is the most preferable. Too large ratio of peeling degrades the adhesion and chemical stability of the semiconductor device member against the substrate, frame or the like, leading possibly to proneness to denaturation or shrinkage of the sealant when it is subjected to a temperature shock or a thermal, optical or electrochemical reaction. This may lead to a peeling of the semiconductor device member from the substrate, frame or the like and a breaking of wire in the semiconductor device. In addition, too low adhesion may induce a peeling of the semiconductor device member from the surface of the electrode or reflector, which are often formed of a silver material particularly in a semiconductor light-emitting device, leading possibly to a breaking of wire, failure in illumination and reduction in brightness of the semiconductor light-emitting device.

[Adhesion Evaluation Method (II)]

(1) A semiconductor-device-member formation liquid (to be described later) is dropped into a silver-plated copper cup having a diameter of 9 mm and a depth at the recess of 1 mm, and then cured under a predetermined curing condition, thereby preparing a semiconductor device member (hereinafter, this semiconductor device member is referred to as "sample for measurement" in the explanation for the adhesion evaluation method (II)).

(2) The obtained sample for measurement is let absorb moisture in an atmosphere of 85-° C. temperature and 85-% humidity for 20 hours.

(3) The sample for measurement that absorbed moisture was heated from room temperature to 260° C. in 50 seconds and then kept at 260° C. for 10 seconds. In this context, the room temperature means 20° C. to 25° C.

(4) The heated sample for measurement is cooled to room temperature, and then the existence or the nonexistence of a peeling of the sample for measurement from the copper cup is observed both by visual inspection and with a microscope. Even a sample observed to have just a small peeling is labeled as "peeling generated".

(5) The ratio of peeling of the above-mentioned sample for measurement is determined by conducting the above operations (2), (3) and (4) for each of 10 samples for measurement. In this context, the ratio of peeling is the ratio that can be calculated as "the number of samples for measurement in which a peeling is generated/the total number of samples for measurement".

Satisfying the following requirements, for example, can realize the above-mentioned characteristic (2) of the semiconductor device member of the present invention.

(i) Selecting raw materials properly. For example, the materials having constructions described in [1-4-1], to be described later, can be selected, or the materials described in [2-1], to be described later, can be used.

(ii) Selecting catalysts in the process of hydrolysis and polycondensation described in [2-2], to be described later.

(iii) Molecular weight control in the process of hydrolysis and polycondensation described in [2-2], to be described later, and/or during storage of the hydrolyzate/polycondensate.

[1-3] Hardness Measurement Value

Hardness measurement value is an index for evaluating the hardness of the semiconductor device member of the present invention. It is measured by the hardness measurement method described below.

The semiconductor device member of the present invention is preferably a member presenting elastomer properties. This is because a semiconductor device uses a plurality of members whose thermal expansion coefficients are different but the semiconductor device member of the present invention can relieve stress caused by expansion and contraction of each of the above members with the elastomer properties described above. Therefore, a semiconductor device that is resistant to a peeling, crack, and breaking of wire while in use and superior in reflow resistance and temperature cycling resistance can be provided.

More specifically, the hardness measurement value (Shore A) by durometer type A, of the semiconductor device member of the present invention, is usually 5 or larger, preferably 7 or larger, and still preferably 10 or larger, and usually 90 or smaller, preferably 80 or smaller, and still preferably 70 or smaller (characteristic (3)). With the hardness measurement value in the above range being provided, the semiconductor device member of the present invention can obtain such an advantage as being more resistant to cracks and superior in reflow resistance and temperature cycling resistance.

[Hardness Measurement Method]

The above hardness measurement value (Shore A) can be measured according to a method described in JIS K6253. More specifically, the measurement can be made using an A-type rubber hardness scale manufactured by Kori Seiki MFG. Co., Ltd.

In this way, the first semiconductor device member of the present invention can realize a cured product that is superior in film-formation capability, adhesion and resistance to light and heat after the curing, by exhibiting the characteristic (1) explained in [1-1] and the characteristic (2) explained in [1-2]. On the other hand, the second semiconductor device member of the present invention can also realize a cured product that is superior in film-formation capability and resistance to light and heat after the curing, by exhibiting the characteristic (1) explained in [1-1] and the characteristic (3) explained in [1-3].

In addition, a semiconductor device member exhibiting all the above-mentioned characteristics (1), (2) and (3) is more preferable because it satisfies all the requirements of the first and second semiconductor device members of the present invention.

[1-4 Other Physicochemical Properties]

The semiconductor device member of the present invention has the above-mentioned major characteristics, but it is preferable that it has also additional structures and characteristics described in the following.

[1-4-1] Basic Skeleton

The basic skeleton of the conventional semiconductor device member is an organic resin such as an epoxy resin having carbon-carbon and carbon-oxygen bonds as its basic skeleton. In contrast, it is preferable that the basic skeleton of the semiconductor device member of the present invention is usually a metalloxane skeletal structure, and preferably an inorganic siloxane skeletal structure (siloxane bond) like glasses (silicate glasses). As is evident from Table 1 below, which shows a comparison of chemical bonds, siloxane bonds have the following superior features for a semiconductor device member.

(I) Having superior light resistance because the bond energy is large and thus pyrolysis and photolysis rarely occur.

(II) Electrically polarized slightly.

(III) The chain structure thereof has a high degree of freedom, leading to a highly flexible structure and free rotation about the siloxane chain.

(IV) Highly oxidized so that further oxidization is impossible.

(V) High in electrical insulating properties.

[Table 1]

TABLE 1

Chemical bonds comparison table

| Bond | Bond distance (Å) | Bond energy (kcal/mol) | Bond angle (°) |
|---|---|---|---|
| Si—O—Si | 1.64 | 108 | 130 to 160 |
| C—O—C | 1.43 | 86 | 110 |
| C—C—C | 1.54 | 85 | 109 |

From these features, it can be understood that a semiconductor device member based on silicon, which is formed by a skeletal structure in which siloxane bonds are connected three-dimensionally with a high degree of crosslinking, can become a protective film that is similar to minerals such as glasses and rocks and excellent in heat resistance and light resistance, in contrast to the conventional semiconductor device member based on a resin such as an epoxy resin. Particularly, a semiconductor device member based on silicon having a methyl group as its substituent is superior in light resistance, because such a member does not have an absorption region in the ultraviolet region and therefore photolysis is unlikely to occur.

The silicon content of the semiconductor device member of the present invention, when it comprises a siloxane skeletal structure, is usually 20 weight % or more, preferably 25 weight % or more, and more preferably 30 weight % or more. On the other hand, the upper limit thereof is usually 47 weight %, because the silicon content of a glass that consists only of $SiO_2$ is 47 weight %. Meanwhile, when the semiconductor device member is intended to be high in refractive index, the above content is usually 10 weight % or more and 47 weight % or less, since a component necessary for the higher refractive index may be contained.

The silicon content of a semiconductor device member can be calculated based on the result of inductively coupled plasma spectrometry (hereinafter abbreviated as "ICP" when appropriate) analysis according to, for example, the method described below.

[Measurement of Silicon Content]

A singly cured product of the semiconductor device member is ground to pieces of about 100 μm and kept in a platinum crucible in the air at 450° C. for 1 hour and then at 750° C. for 1 hour and at 950° C. for 1.5 hours for firing. After removal of carbon components, the small amount of residue obtained is added with a 10-fold amount or more of sodium carbonate, and then heated by a burner to melt it. Then the melted product is cooled and added with desalted water, being diluted to several ppm in silicon, while adjusting pH value to around neutrality using hydrochloric acid. And then ICP analysis is performed.

[1-4-2] Silanol Content

The silanol content of the semiconductor device member of the present invention, when it comprises a siloxane skeletal structure, is in the range of usually 0.01 weight % or more, preferably 0.1 weight % or more, and more preferably 0.3 weight % or more, and usually 12 weight % or less, preferably 8 weight % or less, and more preferably 6 weight % or less.

A glass body produced by sol gel method from a material of alkoxysilane usually does not completely polymerize to become an oxide under a mild curing condition such as 150° C. of curing temperature and about three hours of curing time, and a certain amount of silanol remains. A glass body obtained exclusively from tetraalkoxysilane has high hardness and high light resistance, but a large amount of silanol remains because a molecular chain has a low degree of freedom due to its high degree of crosslinking and thus no complete condensation occurs. Also, when a hydrolyzed/condensed liquid is dried and cured, thickening is swift due to a large number of crosslinking points and the drying and curing proceed simultaneously, resulting in a bulk body with a large distortion. If such a member is used as a semiconductor device member for a long period of time, new internal stress is likely to arise due to condensation of the residual silanols, leading to the proneness to such malfunctions as cracks, peelings and breakings of wires. Also, in the fractured surface of the member, more silanol is found and thus moisture infiltration is likely to occur because, though moisture permeability is low, its surface hygroscopicity is high. The silanol content can be reduced by high-temperature firing at 400° C. or higher, but it is not practical because the heat-resistant temperature of most semiconductor devices is 260° C. or lower.

The semiconductor device member of the present invention, on the other hand, has superior capabilities such as little variation over time because it is low in silanol content, superiority in long-term performance stability, and low hygroscopicity. However, no silanol content in a member results only in poor adhesion to the semiconductor device, and therefore, there is such an appropriate range of the silanol content as described above in the present invention.

Since the semiconductor device member of the present invention contains an appropriate amount of silanol, the silanol is bound to a polar portion existing on the device surface through hydrogen bond so that the adhesion develops. The polar portion includes, for example, a hydroxyl group and an oxygen in a metalloxane bond.

The semiconductor device member of the present invention can form, due to dehydration condensation, a covalent bond with a hydroxyl group on the device surface when heated in the presence of an appropriate catalyst, leading to a development of still firmer adhesion.

If too much content of silanol is contained, on the other hand, thickening in the system, as described above, may make the application difficult, and also, with increased activity, the occurance of curing before light-boiling components volatilize by heating may induce a foaming and an increase in internal stress, which may result in a crack generation.

The silanol content of a semiconductor device member can be decided by the method to be described later, for example, using a solid Si-NMR spectrum measurement. Namely, it can be calculated by comparing the ratio (%) of silicon atoms in silanol to all silicon atoms, decided from the ratio of peak areas originating from silanol to all peak areas, with the silicon content analyzed separately.

[Solid Si-NMR Spectrum Measurement and Calculation of the Silanol Content]

When measuring the solid Si-NMR spectrum of a semiconductor device member, the solid Si-NMR spectrum measurement and the data analysis are performed first under the following conditions. Then, the ratio (%) of silicon atoms in silanol to all silicon atoms is determined from the ratio of peak areas originating from silanol to all peak areas and, by comparing the determined silicon ratio with the silicon content analyzed separately, the silanol content is calculated.

In this context, the analysis of the measured data (namely, the analysis of the silanol amount) is carried out by a method in which each peak is divided and extracted by the waveform separation analysis or the like utilizing, for example, the Gauss function or Lorentz function.

[Example of Device Conditions]
Device: Infinity CMX-400 nuclear magnetic resonance spectroscope manufactured by Chemagnetics Inc.
$^{29}$Si resonance frequency: 79.436 MHz
Probe: 7.5 mm φ CP/MAS probe
Temperature: Room temperature
Rotational frequency of sample: 4 kHz
Measurement method: Single pulse method
$^1$H decoupling frequency: 50 kHz
$^{29}$Si flip angle: 90°
$^{29}$Si 90° pulse width: 5.0 μs
Repetition time: 600 s
Total count: 128 times
Observation width: 30 kHz
Broadening factor: 20 Hz

[Example of Data Processing]
For the semiconductor device member, 512 points are taken in as measured data and zero-filled to 8192 points before Fourier transformation is performed.

[Example of Waveform Separation Analysis]
For each peak of the spectrum after Fourier transformation, an optimization calculation is performed by the nonlinear least square method using the center position, height and full width at half maximum of a peak shape that are created by a Lorentz waveform, Gauss waveform or a mixture of both, as variable parameters.

For identification of a peak, refer to AIChE Journal, 44(5), p. 1141, 1998, or the like.

The silanol content of a semiconductor device member can also be determined by IR measurement described below. In the IR measurement, identification of a silanol peak is not difficult, but the shape of the peak is broad and thus error in estimating the area is unavoidable. Further, in quantative measurement, it is essential to prepare a sample of constant thickness accurately, which is a cumbersome work. For accurate quantative measurement, therefore, use of solid Si-NMR is preferable. In measurement based on solid Si-NMR, IR measurement can be used complementarily to determine silanol content in such cases that silanol content is too small for detection, or isolation of silanol peak is difficult because of overlapping of several peaks, or chemical shift of silanol peak is unknown because of an unknown sample.

[Calculation of Silanol Content by IR Measurement]
Fourier Transform Infrared Spectroscopy
Instrument: NEXUS670 and Nic-Plan (Manufactured by Thermo Electron)
Limit of resolution: 4 cm$^{-1}$
Total count: 64 times
Purge: N$_2$
Example of measurement: A thin-film sample of 200 μm in thickness is applied on an Si wafer, and an infrared absorption spectrum is measured by the transmission method together with the Si wafer. The total area of silanol peaks at wave numbers of 3751 cm$^{-1}$ and 3701 cm$^{-1}$ is determined. A trimethylsilanol, as a sample of known concentration, is diluted with anhydrous carbon tetrachloride and its infrared absorption spectrum is measured by the transmission method using a liquid cell of 200 μm in light path, and the peak area is compared with that of the actual sample to obtain the silanol concentration of the actual sample. Since a peak due to water adsorbed on the sample appears in the background of the silanol peak in the infrared absorption spectrum, the thin-film sample should be heated at 150° C. for 20 minutes or longer at normal pressure or at 100° C. for 10 minutes or longer in vacuo to remove the adsorbed water before measurement.

[Ratio Between Total Amounts of Silanol Content and Alkoxy Group Content]

Regarding each total amount of silanol content and alkoxy group content in the semiconductor device member of the present invention, the amount of silanol is preferably equal to or larger than that of alkoxy group in molar ratio. In theory, silanol and alkoxy group react to form methanol and siloxane bond with equivalent molar ratios to each other. Therefore, a silanol amount that is equal to or more of the alkoxy group amount can proceed with the curing and condensation just by heat, namely, without moisture supply form the air. In such a case, the semiconductor device member is superior in hardenability at the deep portion, even when applied in a deep package.

An amount of silanol, in large excess of the amount of alkoxy group, improves reactivity of adhesion to the surface of the semiconductor device, because of a heightened reaction activity of the semiconductor device member. This further enables inhibition of poor curing due to remaining alkoxy group, which has low chemical reactivity, and reduction in deformation, shrinkage and weight loss during a high-temperature storage. This is why, the ratio represented by {the number of alkoxy groups/(the number of silanols+the number of alkoxy groups)}×100 (namely, the proportion of the alkoxy groups in the unreacted ends that can be subjected to dehydration and dealcoholization condensation) is usually 0% or larger, and usually 50% or smaller, preferably 30% or smaller, and particularly preferably 25% or smaller. This ratio can be decided from a measurement value of liquid-state $^{29}$Si-NMR.

In order for the ratio to fall within the above-mentioned range, for example, the material alkoxysilane should be hydrolyzed sufficiently, the alcohol formed should be distilled off out of the system securely, and as little alcohol as possible should be used as solvent, in the synthesis process. Or otherwise, for preparing a semiconductor-device-member formation liquid that is superior in storage stability even when containing a large amount of silanol ends, components having a structural unit (B) below should be used as raw materials more in molar ratio than the components having a structural unit (A) below, for example.

(In the formula (A), $R^1$ represents an organic group.)

(In the formula (B), $R^2$s represent organic groups, independently of each other.)

The method for measuring liquid-state $^{29}$Si-NMR spectrum is as follows.

[Method for Measuring Liquid-state $^{29}$Si-NMR Spectrum]

The measurement and data analysis of the liquid-state $^{29}$Si-NMR spectrum is carried out under the following conditions.

[Example of Sample Conditions]

50 g of heavy acetone, 2.5 g of tetramethylsilane and 1.5 g of chromium acetylacetonate as relaxation reagent are mixed. This mixture will be referred to as "X liquid".

3.0 g of measurement sample, 0.5 g of the above-mentioned X liquid and 1.0 g of heavy acetone are mixed. The whole of them are thrown into a 10-mm sample tube made of Teflon (registered trademark) for measurement.

A two-pack type commercially available silicone resin, for example, is unmeasurable after they are blended because it is thickened during the measurement. NMR measurements are then performed for each of the base resin and the curing agent separately before they are mixed, and the data is calculated assuming that the spectrum after mixing will be the quantity sum of each single spectrum with consideration for the mixing ratio. The influences of errors at each measurement are removed from peak intensities of the base resin and the curing agent respectively, by normalization with the area of the internal standard tetramethylsilane taken as 1.

[Example of Device Conditions]

Device: JNM-AL400 nuclear magnetic resonance spectroscope manufactured by JEOL Ltd.

$^{29}$Si resonance frequency: 78.50 MHz

Probe: AT 10 probe

Measurement temperature: 25.0° C.

Rotational frequency of sample: no rotation

Measurement method: Single pulse method

Pulse delay time: 12.7 s

Total count: 512 times

Broadening factor: 1.0 Hz

[Example of Waveform Processing Analysis]

For each peak of the spectrum after Fourier transform, the chemical shift is decided from each peak top position and the integration is performed. For identification of a peak, refer to AIChE Journal, 44(5), p. 1141, 1998, or the like.

For example when a peak of hydrosilyl group silicon originating from (—Si—O—)$_2$CH$_3$SiH is detected from −30 ppm to −40 ppm in an analysis of commercially available silicone resin, this peak is categorized as bifunctional silicon.

[1-4-3] UV Transmittance

The semiconductor device member of the present invention preferably has light transmittance, with respect to the luminous wavelength of a semiconductor light-emitting device, of usually 80% or more, among others 85% or more, and further 90% or more, when used for a semiconductor light-emitting device and having a film thickness of 1.0 mm. The efficiency of extracting light in the semiconductor light-emitting device has been enhanced by various technologies. However, if the transparency of a translucent member for sealing a semiconductor element or holding a phosphor is low, the brightness of a semiconductor light-emitting device using the translucent member will be reduced, making it difficult to obtain a high-brightness semiconductor light-emitting device product.

In this context, a "luminous wavelength of a semiconductor light-emitting device" varies depending on the type of semiconductor light-emitting device, but it generally refers to wavelengths in a range of usually 300 nm or longer, preferably 350 nm or longer, and usually 900 nm or shorter, preferably 500 nm or shorter. If the light transmittance is low with respect to the wavelengths in this range, the semiconductor device member absorbs the light and the efficiency of extracting light decreases, making it impossible to obtain a high-brightness semiconductor light-emitting device. Further, such a low light transmittance is undesirable because energy for the reduced efficiency of extracting light is converted into heat, leading to the thermal degradation of the semiconductor light-emitting device.

Incidentally, sealing members tend to degrade due to light of which wavelength is in the ultraviolet to blue region (300 nm to 500 nm). Therefore, the semiconductor device member of the present invention, which is superior in durability, can be preferably used for a semiconductor light-emitting device having its luminous wavelength in this region for achieving a considerably advantageous effect.

Light transmittance of a semiconductor device member can be measured with an ultraviolet spectrophotometer by, for example, a technique described below, using a sample of singly cured film with a smooth surface having a thickness of 1 mm.

[Measurement of Transmittance]

Transmittance is measured using a singly cured film of a semiconductor device member of about 1 mm in thickness with a smooth surface and without defects or unevenness that may cause scatterings, using an ultraviolet spectrophotometer (UV-3100, manufactured by Shimadzu Corporation) in the wavelength range of 200 nm to 800 nm.

The shape of the semiconductor light-emitting device is diverse, but mostly it is used in a thick-film state having thickness exceeding 0.1 mm. However, it is sometimes used as a thin film, in such cases as providing a thin-film phosphor layer (for example, a layer containing nanometer-size phosphor particles or fluorescent ions, having thickness of several µm) at the position apart from the LED chip (luminous element) or providing a high refractive-index light extracting film on a thin film right above the LED chip. In such cases, it is preferable that the transmittance of the film with this thickness is 80% or more. Even when applied to such a thin-film, the semiconductor device member of the present invention shows superiority in light resistance, heat resistance and sealing properties, as well as capability of being formed into a film steadily without generating cracks or the like.

[1-4-4 Peak Area Ratio]

The semiconductor device member of the present invention preferably satisfies the following condition. That is, in the semiconductor device member of the present invention, the ratio of (total area of peaks of the chemical shift of −40 ppm or more and 0 ppm or less)/(total area of peaks of the chemical shift of less than −40 ppm) in a solid Si-nuclear magnetic resonance spectrum (hereinafter referred to as "peak area ratio according to the present invention" when appropriate) is usually 3 or more, preferably 5 or more, and still preferably 10 or more, and usually 200 or less, preferably 100 or less, and still preferably 50 or less.

That the peak area ratio according to the present invention is within the above range means that the semiconductor device member of the present invention has more bifunctional silane than silanes of trifunctional or more, such as trifunctional silane and tetrafunctional silane. With more bifunctional silanes being provided, as described above, the semiconductor device member of the present invention can present elastomer properties and thus the stress can be relieved.

However, the semiconductor device member of the present invention may present elastomer properties even without satisfying the above-mentioned condition of the peak area ratio according to the present invention. This is a case when, for example, the semiconductor device member of the present invention is produced by using a coupling agent such as alkoxide of metal excluding silicon as a crosslinking agent. The technique used for making the semiconductor device member of the present invention present elastomer properties is arbitrary and is not limited to the above-mentioned condition with respect to the peak area ratio according to the present invention.

[1-4-5] Functional Group

The semiconductor device member of the present invention comprises a functional group capable of forming a hydrogen bond with a predetermined functional group (for example, a hydroxyl group or an oxygen in a metalloxane bond) that is present on the surface of a resin like polyphthalamide, ceramic or a metal. A container (such as a cup described later, hereinafter referred to as "container of semiconductor device" as appropriate) for a semiconductor device is usually formed of a ceramic or a metal. Also, a hydroxyl group usually exists on the surface of a ceramic and a metal. On the other hand, the semiconductor device member of the present invention usually comprises a functional group capable of forming a hydrogen bond with that hydroxyl group. Therefore, the semiconductor device member of the present invention is superior in adhesion to the containers of semiconductor devices due to the above-mentioned hydrogen bond.

Functional groups of the semiconductor device member of the present invention that can be bound to the hydroxyl group through hydrogen bond include, for example, silanol, alkoxy group, amino group, imino group, methacryl group, acryl group, thiol group, epoxy group, ether group, carbonyl group, carboxyl group and sulfonate group. Of these, silanol, and alkoxy group are preferable, from the standpoint of heat resistance. At this point, only one functional group or two or more types of functional groups may be used.

Whether the semiconductor device member of the present invention has any functional group that can be bound to the hydroxyl group through hydrogen bond, as described above, can be checked by a technique of spectroscopy such as solid Si-NMR, solid $^1$H-NMR, infrared absorption spectrum (IR) and Raman spectrum.

[1-4-6] Heat Resistance

The semiconductor device member of the present invention is superior in heat resistance. That is, the semiconductor device member of the present invention has a property that transmittance thereof with respect to light having a predetermined wavelength hardly varies even when left under a high temperature condition. More specifically, the maintenance rate of transmittance of the semiconductor device member of the present invention with respect to the light having a wavelength of 400 nm before and after being kept for 500 hours at temperature of 200° C. is usually 80% or more, preferably 90% or more, and more preferably 95% or more, and usually 110% or less, preferably 105% or less, and more preferably 100% less.

The above ratio of variation can be measured in the same way as the method of measuring the transmittance, described earlier in [1-4-3], by means of measuring transmittance using an ultraviolet/visible spectrophotometer.

[1-4-7] UV Resistance

The semiconductor device member of the present invention is superior in light resistance. That is, the semiconductor device member of the present invention has a property that transmittance thereof with respect to the light having a predetermined wavelength hardly varies even when irradiated with UV (ultraviolet light). More specifically, the maintenance rate of transmittance with respect to light of 400-nm wavelength of the semiconductor device member of the present invention before and after being irradiated with light whose center wavelength is 380 nm and radiant intensity is 0.6 kW/m² for 72 hours is usually 80% or more, preferably 90% or more, and more preferably 95% or more, and usually 110% or less, preferably 105% or less, and more preferably 100% or less.

The above ratio of variation can be measured in the same way as the method of measuring the transmittance, described earlier in [1-4-3], by means of measuring transmittance using an ultraviolet/visible spectrophotometer.

[1-4-8] Residual Amount of Catalyst

The semiconductor device member of the present invention is usually produced using an organometallic compound catalyst containing at least one kind of element selected from zirconium, hafnium, tin, zinc and titanium. Therefore, usually in the semiconductor device member of the present invention, these catalysts are remained. Specifically, the semiconductor device member of the present invention contains the above-mentioned organometallic compound catalysts in the amount of usually 0.001 weight % or more, preferably 0.01 weight % or more, more preferably 0.02 weight % or more, and usually 0.3 weight % or less, preferably 0.2 weight % or less, more preferably 0.1 weight % or less, in terms of metal element.

The above-mentioned content of the organometallic compound catalyst can be measured by ICP analysis.

[1-4-9] Low-boiling Component

It is preferable for the semiconductor device member of the present invention that the integrated area of chromatogram, in TG-mass (pyrolysis-mass spectrometry chromatogram), of the gas generated by heating at the temperature from 40° C. to 210° C. is small.

TG-mass detects low-boiling components in a semiconductor device member by heating the semiconductor device member. A large integrated area of chromatogram in the range from 40° C. to 210° C. indicates that low-boiling components such as water, solvent and three-membered to five-membered cyclic siloxane are present in the component. In such a case, there are such possibilities that (i) the large amount of low-boiling components induces occurrence of air bubbles or bleedout in the curing process, thereby lowering the adhesion to the container of semiconductor device, and (ii) a heat generated during use induces occurrence of air bubbles or bleedout. Therefore, it is preferable for the semiconductor device member of the present invention to contain less low-boiling components.

As methods can be cited the followings, for example, by which the amount of above-mentioned low-boiling components, which can be detected by TG-mass, is reduced in the semiconductor device member of the present invention.

(i) Inhibiting the low-molecular weight materials from remaining by carrying out polymerization reaction or the like sufficiently. For example when a polycondensate prepared by a hydrolysis and polycondensation reaction of a specific compound, such as in "[2] Production method of semiconductor device member" to be described later, is used as the semiconductor device member of the present invention, the hydrolysis and polycondensation is performed under normal pressure usually at 15° C. or higher, preferably at 20° C. or higher, more preferably at 40° C. or higher, and usually at 140° C. or lower, preferably at 135° C. or lower, more preferably at 130° C. or lower. The reaction time of the hydrolysis and polycondensation depends on the reaction temperature. But the reaction proceeds over a period of usually 0.1 hour or longer, preferably 1 hour or longer, more preferably 3 hours or longer, and usually 100 hours or shorter, preferably 20 hours or shorter, more preferably 15 hours or shorter. It is preferable that the reaction time is adjusted as appropriate successively with carrying out a molecular weight control by means of GPC or viscosity measurement. Furthermore, the reaction time is preferably adjusted in consideration of the heating-up period.

(ii) Removing the low-boiling components efficiently in processes other than the polymerization reaction or the like. For example when a polycondensate prepared by a hydrolysis and polycondensation reaction of a specific compound, such as in "[2] Production method of semiconductor device member" to be described later, is used as the semiconductor device member of the present invention, the low-boiling components are removed in processes of solvent distillation and drying after the polycondensation reaction process, preventing the polycondensation reaction from proceeding. Specifically, the temperature condition for distilling off the solvent is set at usually 60° C. or higher, preferably 80° C. or higher, and more preferably 100° C. or higher, and usually 150° C. or lower, preferably 130° C. or lower, and more preferably 120° C. or lower, for example. In addition, the pressure condition for the solvent distillation is set usually at normal pressure. Further, the pressure is reduced when necessary so that the boiling point of the reaction liquid during the solvent distillation should not reach the curing start temperature (usually 120° C. or higher). Moreover, the processes of solvent distillation and drying are carried out in an inert gas atmosphere, such as argon gas, nitrogen gas and helium gas.

[1-4-10] Combined Use with Other Members

The semiconductor device member of the present invention may be used as a sealant singly. However, it may also be used together with another member for more complete cutoff of oxygen or moisture for example when it seals an organic phosphor, a phosphor that is liable to deteriorate by oxygen or moisture, a semiconductor light-emitting device or the like. In such a case, an air-tight sealing, using such a highly air-tight sealant as glass plate or epoxy resin, or vacuum sealing may be added from outside of the semiconductor device member of the present invention, which is provided for retention of the phosphor, sealing the semiconductor element or extracting light. In this case, the shape of the device is not specially limited. Namely, it is enough for the sealant, coating or coated layer, made of the semiconductor device member of the present invention, to be substantially protected and blocked from outside by an air-tight material such as metal, glass or highly air-tight resin, so as to allow no passage of oxygen and moisture.

In addition, the semiconductor device member of the present invention may be used as adhesive agent for a semiconductor light-emitting device because it excels in adhesion as described above. More specifically, for example, the semiconductor device member of the present invention can be used for bonding a semiconductor element and a package, a semiconductor element and a sub mount, package constituents together, a semiconductor light-emitting device and an external optical element, by means of application, printing or potting. Since the semiconductor device member of the present invention excels particularly in light resistance and heat resistance, it provides a semiconductor light-emitting device with high reliability enough to stand a long-time use, when it is used as adhesive agent for a high-power semiconductor light-emitting device that is exposed to high temperature or ultraviolet rays for a long time.

The semiconductor device member of the present invention can achieve sufficient adhesion just by itself. However, for more sufficient adhesion, various surface treatments for improving adhesion may be performed on the surface that will be directly in contact with the semiconductor device member. Examples of such surface treatment include: a formation of an adhesion-improving layer using a primer or a silane coupling agent, a chemical surface treatment using such an agent as acids or bases, a physical surface treatment using plasma irradiation, ion irradiation or electron beam irradiation, a surface-roughening procedure by sandblasting, etching or microparticles coating. Other examples of the surface treatment for improving adhesion include known surface treatment methods such as described in Japanese Patent Laid-Open Publication (Kokai) No. Hei 5-25300, "Hyomen Kagaku", Vol. 18 No. 9, pp 21-26, written by Norihiro Inagaki, and "Hyomen Kagaku", Vol. 19 No. 2, pp 44-51 (1998), written by Kazuo Kurosaki.

[1-4-11] Others

There is no limitation on the shape and the dimension of the semiconductor device member of the present invention, and they can be decided arbitrarily. For example when the semiconductor device member is used as a sealant with which the inside of a certain container of a semiconductor device is filled, the shape and the dimension of the semiconductor device member of the present invention are decided according to the shape and the dimension of the container of the semiconductor device. On the other hand, when the semiconductor device member is formed on the surface of a certain substrate, it is often formed into a film shape, and the dimension thereof is set arbitrarily depending on its use.

However, one of the advantageous effects of the semiconductor device member of the present invention is that it can be formed into a thick film when it is formed into a film shape. Conventional semiconductor device members are difficult in forming them into thick films, due to occurrence of cracks or the like caused by an internal stress or the like. However, there are no such problems in the semiconductor device member of the present invention, and it can be formed into a thick film steadily. Regarding its specific range, it is preferable for the semiconductor device member of the present invention to be formed with thickness of usually 0.1 µm or larger, preferably 10 µm or larger, and more preferably 100 µm or larger. There is no limitation on the upper limit thereof, but it is usually 10 mm or smaller, preferably 5 mm or smaller, and more preferably 1 mm or smaller. In this context, when the thickness of the film is not uniform, "thickness of the film" indicates the thickness of the film at its thickest portion.

In addition, the semiconductor device member of the present invention can usually seal a semiconductor device for a longer period of time than conventional ones without generating cracks or peelings. More specifically, when a semiconductor light-emitting device, sealed with the semiconductor device member of the present invention, is illuminated in a continuous manner at 85-° C. temperature and 85-% relative humidity with usually 20 mA or more, preferably 350 mA or more of driving current, the brightness after usually 500 hours or longer, preferably 1000 hours or longer, more preferably 2000 hours or longer of the illumination relative to that of just after switched on is not decreased.

The semiconductor device member may contain another component, depending on its use. For example when the semiconductor device member of the present invention is used as a constituent of a semiconductor light-emitting device, it may contain a phosphor, inorganic particle or the like. Explanation will be given on this point later, together with an explanation on the use of the member.

The other components may be used either as a single kind thereof or as a mixture of two or more kinds in any combination and in any ratio.

In addition, a minute amount of alkoxy group usually remains in the semiconductor device member of the present invention. A semiconductor device member containing less of this terminal alkoxy group shows small weight loss, measured with TG-DTA, leading to high heat resistance.

[2] Production Method of Semiconductor Device Member

The production method of the semiconductor device member of the present invention is not particularly limited. It can be produced, for example, by performing hydrolysis and polycondensation of a compound represented by the general formula (1) or (2) shown below and/or its oligomer and drying the obtained polycondensate (hydrolyzate/polycondensate). However, since it is preferable for the semiconductor device member of the present invention to consist of siloxane bonds as its main body, a compound represented by the general formula (1) or its oligomer is preferably used as the main material. When the hydrolyzate/polycondensate contains a solvent, the solvent may be distilled off in advance before the drying process.

In the following explanation, the above-mentioned hydrolyzate/polycondensate or a composite containing it, which is obtained before the drying process, is referred to as "semiconductor-device-member formation liquid". Accordingly, when a semiconductor device member of the present invention is produced by the production method described in this section (hereinafter referred to as "production method of the present invention" as appropriate), the semiconductor device member will be obtained by drying the semiconductor-device-member formation liquid. The production method of the semiconductor device member will be described below in detail.

[2-1] Material

A compound represented by the general formula (1) shown below (hereinafter called "compound (1)" when appropriate) and/or its oligomer are used as material.

[Chemical Formula 3]

$$M^{m+}X_nY^1_{m-n} \qquad (1)$$

In the general formula (1), M represents at least one element selected from the group consisting of silicon, aluminum, zirconium and titanium. Of these, silicon is preferable.

In the general formula (1), m represents the valence of M and is an integer of 1 or larger and 4 or smaller. In addition, "m+" indicates that it is a positive valence.

n represents the number of X groups and is an integer of 1 or greater and 4 or smaller. However, m≧n holds.

In the general formula (1), X is a hydrolyzable group that generates a highly reactive hydroxyl group after being hydrolyzed by water in the solution, moisture in the air or the like. As X, any conventionally known one can arbitrarily be used. For example, a low-grade alkoxy group of C1 to C5, acetoxy group, butanoxy group and chlorine group can be cited. In this context, the expression of Ci (i is an integer) indicates that the number of carbon atoms is i. Furthermore, X may be a hydroxyl group. One hydrolyzable group may be used alone or two or more hydrolyzable groups may be used together in any combination at any ratio.

Of these, the low-grade alkoxy group of C1 to C5 is preferable, since component liberated after the reaction is neutral. Particularly, methoxy group or ethoxy group is preferable because these groups are highly reactive and the liberated solvent is low-boiling.

Further, when X in the general formula (1) is an acetoxy group or chlorine group and insulating property is needed for the semiconductor device member, it is preferable to add a process of removing acid components, because acetic acid or hydrochloric acid is then liberated after the hydrolysis reaction.

As $Y^1$ in the general formula (1), any known monovalent organic group of the so-called silane coupling agent can arbitrarily be selected and used. Among others, an organic group particularly useful as $Y^1$ in the general formula (1) in the present invention can be selected from the group $Y^0$ (group of useful organic groups) shown below. Another organic group can also be selected as appropriate, for the purpose of improving the affinity to other materials constituting the semiconductor device, improving the adhesion, adjusting the refractive index of the semiconductor device member and the like.

<Group of Useful Organic Groups $Y^0$>

$Y^0$: Monovalent or higher organic groups derived from aliphatic compounds, alicyclic compounds, aromatic compounds and aliphatic-aromatic compounds.

The number of carbon atoms of the organic groups belonging to the group $Y^0$ is usually 1 or more, and usually 1000 or less, preferably 500 or less, more preferably 100 or less, and still more preferably 50 or less.

Further, at least a part of hydrogen atoms in the organic group belonging to the group $Y^0$ may be substituted by atoms and/or substituents such as organic functional groups exemplified below. In this case, a plurality of hydrogen atoms in the organic group belonging to the group $Y^0$ may be substituted by the following substituents. In such a case, a combination of one kind of substituent or two or more kinds of substituents, selected from the substituents shown below, may be used for the substitution.

Examples of substituents that can be substituted for the hydrogen atom in the organic groups belonging to the group $Y^0$ include: atoms such as F, Cl, Br and I; and organic functional groups such as vinyl group, methacryloxy group, acryloxy group, styryl group, mercapto group, epoxy group, epoxy cyclohexyl group, glycidoxy group, amino group, cyano group, nitro group, sulfonic acid group, carboxy group, hydroxy group, acyl group, alkoxy group, imino group and phenyl group.

Among substituents that can be substituted for the hydrogen atom in the organic groups belonging to the group $Y^0$, the organic functional groups may have a substituent of a halogen atom, such as F, Cl, Br and I, for at least a part of hydrogen atoms in the organic functional groups, in all the cases described above.

Among the substituents exemplified above as substitutable for the hydrogen in the organic groups belonging to the group $Y^0$, the above-listed organic functional groups are examples that can be introduced easily. Therefore, another organic functional group having various physicochemical functionalities may be introduced in accordance with the purposes of use.

In addition, organic groups belonging to the group $Y^0$ may also have therein various atoms such as O, N and S or atomic groups as connecting groups.

As $Y^1$ in the general formula (1), various groups can be selected, for example from the organic groups belonging to the above group of useful organic groups $Y^0$, in accordance with the purposes. However, in terms of superiority in UV resistance and heat resistance, it is preferable for $Y^1$ to consist mainly of methyl group.

Concrete examples of the above compound (1) where M is silicon include: dimethyldimethoxysilane, dimethyldiethoxysilane, diphenyldimethoxysilane, diphenyldiethoxysilane, vinyl trimethoxysilane, vinyl triethoxysilane, vinyl triacethoxysilane, γ-aminopropyl trimethoxysilane, γ-glycidoxypropyl trimethoxysilane, γ-glycidoxypropyl triethoxysilane, β-(3, 4-epoxy cyclohexyl) ethyltrimethoxysilane, γ-(3, 4-epoxy cyclohexyl) ethyltriethoxysilane, γ-(meth)acryloxypropyl trimethoxysilane, phenyl trimethoxysilane, phenyl triacethoxysilane, γ-mercaptopropyl trimethoxysilane, γ-chloropropyl trimethoxysilane, β-cyanoethyl triethoxysilane, methyltrimethoxysilane, methyltriethoxysilane, methyltripropoxysilane, methyltributoxysilane, ethyltrimethoxysilane, ethyltriethoxysilane, tetramethoxysilane, tetraethoxysilane, tetrapropoxysilane, tetrabutoxysilane, dimethyldichlorosilane, diphenyldichlorosilane, methylphenyl dimethoxysilane, trimethylmethoxysilane, trimethylethoxysilane, trimethylchlorosilane, methyltrichlorosilane, γ-aminopropyl triethoxysilane, 4-aminobutyl triethoxysilane, p-aminophenyl trimethoxysilane, N-(2-aminoethyl)-3-aminopropyl trimethoxysilane, aminoethyl aminomethylphenethyl trimethoxysilane, 3-glycidoxypropyl trimethoxysilane, 2-(3, 4-epoxy cyclohexyl) ethyltrimethoxysilane, 3-aminopropyl trimethoxysilane, 3-aminopropyl triethoxysilane, 4-aminobutyl triethoxysilane, N-(6-aminohexyl) aminopropyl trimethoxysilane, 3-chloropropyl trimethoxysilane, 3-chloropropyltrichlorosilane, (p-chloromethyl) phenyltrimethoxysilane, 4-chlorophenyl trimethoxysilane, 3-methacryloxypropyl trimethoxysilane, 3-methacryloxypropyl triethoxysilane, 3-acryloxypropyl trimethoxysilane, styrylethyl trimethoxysilane, 3-mercaptopropyl trimethoxysilane, vinyl trichlorosilane, vinyl tris (2-methoxyethoxy) silane, and trifluoropropyl trimethoxysilane.

Concrete examples of the compounds (1) where M is aluminum include: aluminum triisopropoxide, aluminum tri-n-butoxide, aluminum tri-t-butoxide, and aluminum triethoxide.

Concrete examples of the compounds (1) where M is zirconium include: zirconium tetramethoxide, zirconium tetraethoxide, zirconium tetra-n-propoxide, zirconium tetra-1-propoxide, zirconium tetra-n-butoxide, zirconium tetra-1-butoxide, zirconium tetra-t-butoxide, and zirconium dimethacrylate dibutoxide.

Concrete examples of the compounds (1) where M is titanium include: titanium tetraisopropoxide, titanium tetra-n-butoxide, titanium tetra-1-butoxide, titanium methacrylate triisopropoxide, titanium tetramethoxypropoxide, titanium tetra-n-propoxide, and titanium tetraethoxide.

However, these compounds exemplified above are only a part of coupling agents easily available on the market. More detailed list thereof can be shown, for example, by the list of coupling agents and the related products in Chapter 9 of "Coupling-Zai Saiteki Riyo Gijutsu" issued by Institute for Science and Technology. Of course, the coupling agents that can be used for the present invention are not limited to these examples.

A compound represented by the general formula (2) below (hereinafter called "compound (2)" when appropriate) and/or its oligomer can also be used in the same manner as the above-mentioned compound (1) and/or its oligomer.

[Chemical Formula 4]

$$(M^{s+}X_tY^1_{s-t-1})_uY^2 \qquad (2)$$

In the general formula (2), M, X, and $Y^1$ represent, independently of each other, the same things as those in the general formula (1). Particularly as $Y^1$, in the same way as the general formula (1), various groups can be selected, for example from the organic groups belonging to the above-mentioned group of useful organic groups $Y^1$ in accordance with the purposes. However, in terms of superiority in UV resistance and heat resistance, it is preferable for $Y^1$ to consist mainly of methyl group.

In the general formula (2), s represents the valence of M and is an integer of 2 or larger and 4 or smaller. In addition, "s+" indicates that it is a positive valence.

Further, in the general formula (2), $Y^2$ represents a u-valent organic group. At this point, u represents an integer of 2 or larger. As $Y^2$ in the general formula (2), any known bivalent or higher organic group of the so-called silane coupling agent can arbitrarily be selected and used.

Also, in the general formula (2), t represents an integer of 1 or larger and s−1 or smaller, where t≦s.

Examples of the above-mentioned compound (2) include: various organic polymers and oligomers to which a plurality of hydrolytic silyl groups are bound as side chains, siloxane polymers to which a hydrolytic silyl group is bound through an organic connecting group such as methylene chain, and molecules to which hydrolytic silyl groups are bound at the position of plural ends of the molecules.

Concrete examples of the above compound (2) and its product names are listed below:

Bis (triethoxysilylpropyl) tetrasulfide
(Manufactured by Shin-Etsu Chemical Co., Ltd., KBE-846)

2-diethoxymethyl ethylsilyldimethyl-2-furanylsilane
(Manufactured by Shin-Etsu Chemical Co., Ltd., LS-7740)

N,N'-bis[3-(trimethoxysilyl) propyl]ethylenediamine
(Manufactured by Chisso Corporation, Sila-Ace XS1003)
N-glycidyl-N,N-bis[3-(methyldimethoxysilyl)propyl]
  amine
(Manufactured by Toshiba Silicones Co., Ltd., TSL8227)
N-glycidyl-N,N-bis[3-(trimethoxysilyl)propyl]amine
(Manufactured by Toshiba Silicones Co., Ltd., TSLB228)
N,N-bis[(methyldimethoxysilyl)propyl]amine
(Manufactured by Toshiba Silicones Co., Ltd., TSL8206)
N,N-bis[3-(methyldimethoxysilyl)propyl]ethylenedi-
  amine
(Manufactured by Toshiba Silicones Co., Ltd., TSL8212)
N,N-bis[(methyldimethoxysilyl)propyl]methacrylamide
(Manufactured by Toshiba Silicones Co., Ltd., TSL8213)
N,N-bis[3-(trimethoxysilyl) propyl]amine
(Manufactured by Toshiba Silicones Co., Ltd., TSL8208)
N,N-bis[3-(trimethoxysilyl) propyl]ethylenediamine
(Manufactured by Toshiba Silicones Co., Ltd., TSL8214)
N,N-bis[3-(trimethoxysilyl)propyl]methacrylamide
(Manufactured by Toshiba Silicones Co., Ltd., TSL8215)
N,N',N"-tris[3-(trimethoxysilyl)propyl]isocyanurate
(Manufactured by Hydrus Chemical Inc., 12267-1)
1,4-bis hydroxy dimethylsilyl benzene
(Manufactured by Shin-Etsu Chemical Co., Ltd., LS-7325)

The compound (2) can also be synthesized by a hitherto known synthesis method other than hydrolysis and polycondensation. For example, a hydrolyzable silyl group can be introduced by addition condensation of alkoxysilane containing vinyl group to a polydimethylsiloxane chain having SiH group via hydrosilylation reaction. Or otherwise, a hydrolyzable silyl group can be introduced by copolymerization of vinyl trialkoxysilane with acrylic monomer or vinyl monomer. In such cases, unreacted residue originating from the synthesis of compound (2) or catalyst may remain in the system. However, it is preferable that the amount of such unreacted residue or catalyst is reduced to the degree that the semiconductor device member can maintain its performance. Specifically, it is preferable to use a fixed catalyst and remove it after the reaction, or to keep the catalyst concentration as low as possible enough for the reaction to proceed.

As the material, compound (1), compound (2), and/or their oligomers can be used. That is, in the production method of the present invention, compound (1), oligomer of the compound (1), compound (2), oligomer of the compound (2), or oligomer of the compound (1) and compound (2) may be used as the material. If oligomer of compound (1) or oligomer of compound (2) is used as the material, the molecular weight of the oligomer is arbitrary as long as the semiconductor device member of the present invention can be obtained. However, it is usually 400 or larger.

If compound (2) and/or oligomer thereof are used as main material, a main chain structure in the system will consist principally of organic bonds, leading possibly to a low durability. Thus, it is desirable to use a minimum amount of compound (2) in order to provide mainly functionality such as adhesion addition, refractive index adjustment, reactivity control, and inorganic-particles dispersibility addition. If compound (1) and/or its oligomer (compound-(1) derived component) and compound (2) and/or its oligomer (compound-(2) derived component) are used simultaneously, it is desirable that the ratio of usage of compound-(2) derived component to the total weight of the material is usually 30 weight % or less, preferably 20 weight % or less, and more preferably 10 weight % or less.

If, in the production method of the semiconductor-device-member formation liquid and the semiconductor device member of the present invention, an oligomer of compound (1) or compound (2) is used as material, the oligomer may be prepared in advance, but it may also be prepared during the production process. That is, it is possible to use a monomer such as compound (1) or compound (2) as material in order to form an oligomer during the production process before the subsequent reactions are allowed to proceed using the oligomer.

As oligomer, the one having, as a result, a similar structure to the oligomer that can be obtained from a monomer such as compound (1) or compound (2) can be used. A commercially available oligomer having such a structure can also be used. Concrete examples of such an oligomer include the following ones.

<Example of Oligomers Consisting Only of Bifunctional Silicon>

Examples of dimethyl polysiloxane with terminal hydroxyl group manufactured by GE Toshiba Silicones Co., Ltd. include XC96-723, XF3905, YF3057, YF3800, YF3802, YF3807 and YF3897.

Examples of methylphenyl polysiloxane with terminal hydroxyl group manufactured by GE Toshiba Silicones Co., Ltd. include YF3804.

Examples of double-ended silanol polydimethylsiloxane manufactured by Gelest Inc. include DMS-S12 and DMS-S14.

Examples of double-ended silanol diphenylsiloxane-dimethylsiloxane copolymer manufactured by Gelest Inc. include PDS-1615.

Examples of double-ended silanol polydiphenylsiloxane manufactured by Gelest Inc. include PDS-9931.

<Example of Oligomers Containing Trifunctional or More of Silicon>

Examples of silicone alkoxy oligomer (methyl/methoxy type) manufactured by Shin-Etsu Chemical Co., Ltd. include KC-89S, KR-500, X-40-9225, X-40-9246 and X-40-9250.

Examples of silicone alkoxy oligomer (phenyl/methoxy type) manufactured by Shin-Etsu Chemical Co., Ltd. include KR-217.

Examples of silicone alkoxy oligomer (methylphenyl/methoxy type) manufactured by Shin-Etsu Chemical Co., Ltd. include KR-9218, KR-213, KR-510, X-40-9227 and X-40-9247.

Of these, oligomers consisting only of bifunctional silicon are instrumental in giving plasticity to the semiconductor device member of the present invention, but the mechanical strength of the member tends to be insufficient. Therefore, through copolymerization with an monomer comprising trifunctional or more of silicon or with an oligomer containing trifunctional or more of silicon, the semiconductor device member of the present invention can be equipped with a mechanical strength necessary as sealant. In addition, those having silanol as reactive group need not be hydrolyzed beforehand and are advantageous in that the use of such solvent as alcohol as water miscible solvent is not necessary. When oligomers having alkoxy group are used as material, water for effecting hydrolysis is needed, as is the case of monomers having alkoxy group.

Further, as the material, any single one of compound (1), compound (2) and their oligomers may be used, or otherwise, two or more of them may be mixed to be used in an arbitrary combination and composition. Further, compound (1), compound (2) and their oligomers that are hydrolyzed in advance (namely, X in general formulas (1) and (2) is OH group) may also be used.

However, in the present invention, at least one of compound (1), compound (2) and their oligomers (including those hydrolyzed), containing silicon as M and having at least one of the organic group $Y^1$ and organic group $Y^2$, is necessary to be used. Since it is preferable that crosslinkings in the system are formed mainly by inorganic components including siloxane bond, when both compound (1) and compound (2) are used, it is preferable that compound (1) is mainly used.

To obtain a semiconductor device member consisting principally of siloxane bond, compound (1) and/or an oligomer thereof are preferably used as main component of the material. Further, it is more preferable that the oligomer of compound (1) and/or the oligomer of compound (2) are mainly composed of bifunctional components. Particularly, the bifunctional unit of the oligomer of compound (1) and/or the oligomer of compound (2) are preferably used as bifunctional oligomers.

Further, if the bifunctional component (hereinafter called "bifunctional component oligomer" when appropriate) of the oligomer of compound (1) and/or the oligomer of compound (2) are mainly used, the ratio of usage of the bifunctional component oligomers to the total weight of the material (that is, the sum of the weights of compound (1), compound (2) and their oligomers) is usually 50 weight % or more, preferably 60 weight % or more, and more preferably 70 weight % or more. The upper limit of the above ratio is usually 97 weight %. This is because using a bifunctional component oligomer as main component of the material is one of the factors that make it easy to produce the semiconductor device member of the present invention by the production method of the semiconductor device member of the present invention.

Advantages of using a bifunctional component oligomer as main component of the material will be described below in detail.

In a semiconductor device member produced by conventional sol gel method, the hydrolyzate/polycondensate (including the hydrolyzate/polycondensate contained in the coating liquid (hydrolyzing liquid)) obtained by hydrolysis and polycondensation of the material showed high reaction activity. Thus, unless the hydrolyzate/polycondensate was diluted by a solvent such as alcohol, polymerization in the system would proceed rapidly before being cured, making molding and handling difficult. For example, if not diluted by a solvent, the hydrolyzate/polycondensate was sometimes cured even at a temperature around 40° C. to 50° C. Therefore, it was necessary to cause a solvent to exist with the hydrolyzate/polycondensate in order to ensure handleability of the hydrolyzate/polycondensate obtained after the hydrolysis.

If a hydrolyzate/polycondensate is dried and cured with the solvent coexisting with the hydrolyzate/polycondensate, shrinkage caused by desolvation (desolvation shrinkage) is added to the shrinkage caused by dehydration condensation, during the curing. Accordingly, in a conventional semiconductor device, the cured product tended to have large internal stress, and therefore, crack generations, peelings, and breakings of wires, caused by the internal stress, were more likely to occur.

Further, if more bifunctional component monomers are used as material for the purpose of softening the semiconductor device member in order to relieve the above internal stress, there was a possibility of increasing low-boiling cyclic material in the polycondensation product. Since the low-boiling cyclic material is volatilized during the curing, the increase of low-boiling cyclic material will lead to a lower yield by weight. The low-boiling cyclic material is also volatilized from the cured product, leading possibly to generation of stress. Further, heat resistance of the semiconductor device member that contains a large amount of low-boiling cyclic material may decrease. For the above reasons, it has been difficult to produce a semiconductor device member as a cured product in an elastomer state with good performances conventionally.

In contrast, in the production method of the semiconductor device member of the present invention, bifunctional components that are oligomerized in advance in another system (that is, in a system not involved in the hydrolysis and polycondensation process) and of which low-boiling impurities without reactive ends are distilled off are used as material. Therefore, even if a large amount of bifunctional component (that is, the above bifunctional component oligomer) is used, low-boiling impurities thereof will not be volatilized, enabling realization of improvement in yield by weight of the cured product and producing a cured product in an elastomer state with good performances.

Further, the reaction activity of the hydrolyzate/polycondensate can be inhibited by using a bifunctional component oligomer as main material. This phenomenon can be considered to be caused by a steric hindrance and an electron effect of the hydrolyzate/polycondensate, as well as by reduction in amount of silanol ends due to the use of the bifunctional component oligomer. Because the reaction activity is inhibited, the hydrolyzate/polycondensate is not cured even without a coexisting solvent, and thus, the hydrolyzate/polycondensate can be made both one-component type and a non-solvent system.

Also, because the reaction activity of the hydrolyzate/polycondensate is reduced, the curing start temperature can be set higher than before. Therefore, when a solvent whose temperature is lower than the curing start temperature of the hydrolyzate/polycondensate coexists, the solvent will be volatilized before the curing of the hydrolyzate/polycondensate starts in the drying process of the hydrolyzate/polycondensate. This makes it possible to inhibit the generation of an internal stress caused by a desolvation shrinkage even when a solvent is used.

[2-2] Hydrolysis and Polycondensation Process

In the present invention, the above-mentioned compound (1), compound (2) and/or oligomers thereof are first subjected to hydrolysis and polycondensation reaction (hydrolysis and polycondensation process). This hydrolysis and polycondensation reaction can be performed by a known method. Hereinafter, the compound (1), compound (2) and oligomers thereof are referred to as "material compound" as appropriate, when no distinction is made among them.

A theoretical amount of water, used for performing the hydrolysis and polycondensation reaction of the material compound, is based on a reaction formula shown by the following formula (3), and it turns out to be half the molar ratio of the total amount of the hydrolyzable groups in the system.

[Chemical Formula 5]

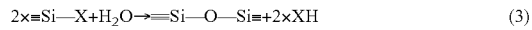

(3)

The above formula (3) represents a case in which M in general formulas (1) and (2) is silicon as an example. "≡Si" and "Si≡" represent three of the four bonds held by a silicon atom in an abbreviated manner.

In the present description, the theoretical amount of water required for the hydrolysis, that is, the amount of water corresponding to half the molar ratio of the total amount of the hydrolizable groups is selected as a reference (the ratio of hydrolysis is 100%). And therefore, the amount of water used for the hydrolysis is represented as a percentage to this reference value, that is, it is represented as "ratio of hydrolysis."

In the present invention, the amount of water used for performing the hydrolysis and polycondensation reaction is, when expressed by the above-mentioned ratio of hydrolysis, preferably in the range of usually 80% or more and particularly 100% or more. If the ratio of hydrolysis is lower than this range, the hydrolysis/polycondensation may be insufficient, and consequently, the material may volatilize during the curing or the strength of the cured product may be insufficient. If the ratio of hydrolysis exceeds 200%, on the other hand, liberated water always remains in the system in the course of the curing. This fact may cause the semiconductor element or phosphor to degrade or the cup part to absorb water, which may lead to a cause of the foamings, cracks or peelings during the curing. What is important in a hydrolysis reaction is to perform the hydrolysis and polycondensation using water of the ratio of hydrolysis that is close to 100% or more (for example, 80% or more). However, by adding a process in which liberated water is removed before the coating process, the ratio of hydrolysis even exceeding 200% can be applied. However, in this case, using too much water will increase the amounts of water to be removed and solvent to be used as compatibilizer, which may complicate the concentration process or lower the coating properties of the member due to an excessive polycondensation. Thus, it is preferable that the upper limit of the ratio of hydrolysis is usually set to 500% or lower, among others, 300% or lower, and preferably 200% or lower.

It is preferable that a catalyst coexists during the hydrolysis and polycondensation of the material compound, in order to promote the hydrolysis and polycondensation. In this case, the examples of the catalyst used include: organic acids such as acetic acid, propionic acid and butyric acid; inorganic acids such as nitric acid, hydrochloric acid, phosphoric acid and sulfuric acid; and organometallic compound catalysts. For a member to be used for a portion that is directly in contact with the semiconductor device, organometallic compound catalysts that do not have much effect on the insulating property are preferable. In this context, the organometallic compound catalyst indicates not only a catalyst comprised of a narrowly-defined organometallic compound, in which organic groups are directly bound to metal elements, but also a catalyst comprised of broadly-defined organometallic compound including organometallic complexes, metal alkoxides, salts of organic acids and metals and the like.

Among the organometallic compound catalysts, those containing at least one element selected from zirconium, hafnium, tin, zinc and titanium are preferable. Of these, organometallic compound catalysts containing zirconium are particularly preferable.

Concrete examples of the organometallic compound catalyst containing zirconium include: zirconium tetraacetylacetonate, zirconium tributoxyacetylacetonate, zirconium dibutoxydiacetylacetonate, zirconium tetranormalpropoxide, zirconium tetraisopropoxide, zirconium tetranormalbutoxide, zirconium acylate and zirconium tributoxystearate.

Concrete examples of the organometallic compound catalyst containing hafnium include: hafnium tetraacetylacetonate, hafnium tributoxyacetylacetonate, hafnium dibutoxydiacetylacetonate, hafnium tetranormalpropoxide, hafnium tetraisopropoxide, hafnium tetranormalbutoxide, hafnium acylate and hafnium tributoxystearate.

Examples of the organometallic compound catalyst containing titanium include: titanium tetraisopropoxide, titanium tetranormalbutoxide, butyltitanate dimmer, tetraoctyltitanate, titanium acetylacetonato, titanium octyleneglycolate and titanium ethylacetoacetate.

Examples of the organometallic compound catalyst containing zinc include: zinc stearate, zinc octylate, zinc 2-ethylhexanate and zinc triacetylacetonate.

Examples of the organometallic compound catalyst containing tin include: tetrabutyl tin, monobutyl tin trichloride, dibutyl tin dichloride, dibutyl tin oxide, tetraoctyl tin, dioctyl tin dichloride, dioctyl tin oxide, tetramethyl tin, dibutyl tin laurate, dioctyl tin laurate, bis(2-ethylhexanoate)tin, bis(neodecanoate)tin, di-n-butylbis(ethylhexylmalate)tin, di-normalbutylbis(2,4-pentanedionate)tin, di-normalbutylbutoxychloro tin, di-normalbutyldiacetoxy tin, di-normalbutyldilaurylic acid tin and dimethyldineodecanoate tin.

These organometallic compound catalysts can be used either as a single one or as a mixture of two or more kinds in any combination and in any ratio.

By using the above-mentioned preferable organometallic compound catalyst, it is possible to suppress the formation of by-products, low-molecular-weight cyclic siloxane, at the time of hydrolysis and polycondensation of the material compound, and to prepare with high yield the semiconductor-device-member formation liquid.

Furthermore, by using the organometallic compound catalyst, the semiconductor device member of the present invention can be equipped with excellent heat resistance that satisfies the requirement of characteristic (1) described earlier in the above-mentioned [1-1]. The reason is not clear. However, it is thought that the above organometallic compound catalyst not only accelerates hydrolysis and polycondensation reaction of the material compound as catalyst but is capable of attaching to and dissociating from the silanol ends of the hydrolyzate/polycondensate and its cured product temporarily. This mechanism is considered to be instrumental in adjusting reactivity of the silanol-containing polysiloxane, and brings about, under high temperature conditions, (i) prevention of oxidation of the organic groups, (ii) prevention of the formation of unnecessary crosslinkings among the polymers, (iii) prevention of cleavage of the main chain or the like. In the following, these actions (i) to (iii) will be explained.

(i) Prevention of oxidation of organic groups is thought to be achieved as follows. When a heat-induced radical is formed on, for example, a methyl group a transition metal in the organometallic compound catalyst is capable of capturing the radical. On the other hand, the transition metal itself loses its ionic valency as a result of the radical capture and, through its interaction with oxygen, it prevents oxidation of the organic groups. It is inferred that deterioration of the semiconductor device member is thus suppressed.

(ii) Prevention of the formation of unnecessary crosslinkings among the polymers is thought to be achieved as follows. For example, a methyl group is oxidized by oxygen molecules to formaldehyde, leading to formation of a hydroxyl group bonded to a silicon atom. When the hydroxyl groups thus formed are subjected to dehydration condensation, crosslinking points generate among the polymers. If these crosslinkings increase, a semiconductor device member, which is originally rubber-like, may become hard and fragile. However, it is inferred that the organometallic compound catalysts are combined with silanol groups and thus can prevent progress of crosslinkings due to pyrolysis.

(iii) Prevention of cleavage of the main chain or the like is thought to be achieved as follows. The organometallic compound catalysts combine with silanols, which prevents the cleavage of the main chain of the polymer caused by intramolecular attack by the silanol and the weight loss at the time of heating caused by formation of cyclic siloxanes. These mechanisms are considered to lead to improvement in heat resistance.

The proportion of the organometallic compound catalyst used is selected appropriately depending on the kind of catalyst used. It is usually 0.01 weight % or more, preferably 0.05 weight % or more, more preferably 0.1 weight % or more, and usually 5 weight % or less, preferably 2 weight % or less, more preferably 1 weight % or less, relative to the total amount of the material subjected to the hydrolysis and polycondensation. When the proportion of the organometallic compound catalyst is too small, it is possible that the curing takes too much time, or the mechanical strength or durability is not enough because of insufficient curing. On the other hand, when the proportion of the organometallic compound catalyst is too large, it is possible that the control of physicochemical property of the cured product, namely the semiconductor device member, becomes difficult because of too rapid curing, the transparency of the semiconductor device member is impaired because of precipitation of the catalyst due to its inability to be dissolved or dispersed, the semiconductor device member becomes colored when used at a high temperature because the amount of organic material incorporated in the form of the catalyst is large.

These organometallic compound catalysts can be added to the raw material system in one portion at the time of hydrolysis and polycondensation, or they can be added in several divided portions. It is possible that a solvent is used to dissolve the catalysts at the time of hydrolysis and polycondensation, or the catalysts may be dissolved directly in the reaction solution. However, when it is used for the formation liquid for a semiconductor light-emitting device, it is desirable that the solvent is distilled off completely after the process of hydrolysis and polycondensation in order to prevent foaming at the time of curing or coloration caused by heat.

Incidentally, a solid catalyst is low in solubility. When using such a catalyst dissolved insufficiently, a direct temperature rising causes nonuniform reactions locally, leading possibly to white turbidity in the system or formation of insoluble matter in a state of transparent gel. In order to prevent those problems, the following operations can be applied to the catalyst particles, for example. (i) Pulverizing the particles to several tens or several hundreds of micrometers using a mortar for facilitating their dissolution. (ii) Preheating a resin composition mixed with the catalyst at 30 to 50° C. while stirring to dissolve the catalyst before rising the temperature up to the reaction temperature. Incidentally, when mixing siloxane materials having different reactivities, it is recommended that the catalyst is first added and dissolved in the material having lower reactivity before mixing the materials having higher reactivities.

If liquid separation occurs in the system during the hydrolysis and polycondensation reaction and a nonuniformity is generated, a solvent may be used. As the solvent, for example, lower alcohols of C1 to C3, dimethylformamide, dimethylsulfoxide, acetone, tetrahydrofuran, methylcellosolve, ethylcellosolve, methylethylketone, toluene and water can be arbitrarily used. Of these, solvents that are neither strongly acidic nor strongly basic are preferable for reasons of not affecting the hydrolysis and polycondensation adversely. Solvents can be used either as a single one or as a mixture of two or more kinds thereof in any combination and in any ratio. The amount of solvent to be used may be freely selected, but it is preferable to use a minimum amount of it because the solvent is often removed in the process of coating the semiconductor device. It is also preferable to select a solvent whose boiling point is 100° C. or lower, preferably 80° C. or lower, in order to facilitate the removal of the solvent. In some cases, the initial nonuniformity resolves during the reaction because a solvent such as alcohol is generated by the hydrolysis reaction even without the need for adding a solvent from outside.

The hydrolysis and polycondensation reaction of the above material compounds is performed at, in the case of under normal pressure, usually 15° C. or higher, preferably 20° C. or higher, more preferably 40° C. or higher, and usually 140° C. or lower, preferably 135° C. or lower, more preferably 130° C. or lower. A higher temperature may also be allowed by maintaining the liquid phase under an increased pressure, but it is preferable that the temperature does not exceed 150° C.

The reaction time of the hydrolysis and polycondensation reaction depends on the reaction temperature. But the reaction proceeds over a period of usually 0.1 hour or longer, preferably 1 hour or longer, more preferably 3 hours or longer, and usually 100 hours or shorter, preferably 20 hours or shorter, more preferably 15 hours or shorter. It is preferable that the reaction time is adjusted as appropriate with carrying out a molecular weight control.

Under the above hydrolysis and polycondensation conditions, if the reaction time is too short or the reaction temperature is too low, the hydrolysis/polycondensation may be insufficient, leading possibly to the volatilization of the material during the curing or insufficient strength of the cured product. On the other hand, if the reaction time is too long or the reaction temperature is too high, the molecular weight of the polymers may become high and the silanol amount in the system may decrease, leading possibly to defective adhesion in the coating process or crack generations due to a nonuniform structure of the cured body caused by a premature curing. Taking the above tendencies into consideration, it is preferable to select appropriate conditions in accordance with the desired physical property values.

After the above hydrolysis and polycondensation reaction terminates, the resultant hydrolyzate/polycondensate is stored at or below room temperature until the time of use. However, polycondensation slowly proceeds also in the meantime and thus it is preferable that the hydrolyzate/polycondensate is usually used within 60 days of storage at room temperature, after the heated hydrolysis and polycondensation reaction described above terminates, especially when it is used as a thick-film member, preferably within 30 days, and more preferably within 15 days. The above period can be prolonged if necessary by storing the hydrolyzate/polycondensate in a low temperature range in which the hydrolyzate/polycondensate does not freeze. It is preferable that the storage period is adjusted as appropriate with carrying out a molecular weight control.

The hydrolyzate/polycondensate (polycondensate) of the above-mentioned material compounds can be obtained by the operations described above. This hydrolyzate/polycondensate is preferably liquid. However, if a solid hydrolyzate/polycondensate can be made liquid using a solvent, such a hydrolyzate/polycondensate can also be used. The liquid hydrolyzate/polycondensate thus obtained is the semiconductor-device-member formation liquid which will be changed into the semiconductor device member of the present invention by curing in the process to be described later.

[2-3] Solvent Distillation

When a solvent is used in the above hydrolysis and polycondensation process, it is preferable to distill off, usually before the drying process, the solvent from the hydrolyzate/polycondensate (solvent distillation process). Thereby, a semiconductor-device-member formation liquid (a hydrolyzate/polycondensate in a liquid state) without containing a solvent can be obtained. As described above, it has been difficult to handle the hydrolyzate/polycondensate when distilling off the solvent, because it causes curing of the hydrolyzate/polycondensate. However, when a bifunctional component oligomer is used in the production method of the present invention, the solvent can be distilled off because the reactivity of the hydrolyzate/polycondensate is inhibited and thus the hydrolyzate/polycondensate does not cure even with the solvent distillation before the drying process. By distilling off the solvent before the drying process, crack generations, peelings and breakings of wires, due to the desolvation shrinkage, can be prevented.

Usually, water used for the hydrolysis is also distilled off when the solvent is distilled off. Also, solvents to be distilled off include a solvent represented by XH or the like, which is generated by the hydrolysis and polycondensation reaction of the material compounds represented by the general formulas (1) and (2). Furthermore, it also includes low-molecular-weight cyclic siloxane, which is a by-product at the time of the reaction.

Any method of the solvent distillation may be used as long as the advantageous effects of the present invention are not seriously damaged. However, it should be avoided to carry out the distillation of the solvent at a temperature equal to or higher than the curing start temperature of the hydrolyzate/polycondensate.

A concrete range of the temperature condition for distilling off the solvent is usually 60° C. or higher, preferably 80° C. or higher, and more preferably 100° C. or higher, and usually 150° C. or lower, preferably 130° C. or lower, and more preferably 120° C. or lower. If the temperature falls below the lower limit of this range, the solvent distillation may be insufficient. If the temperature exceeds the upper limit of this range, the hydrolyzate/polycondensate may gelate.

A pressure condition for the solvent distillation is usually normal pressure. Further, the pressure is reduced when necessary so that the boiling point of the reaction liquid during the solvent distillation should not reach the curing start temperature (usually 120° C. or higher). The lower limit of the pressure is a level at which the main components of the hydrolyzate/polycondensate are not distilled off.

In general, low-boiling point component can be distilled off efficiently under conditions of high temperature and high vacuum. When the amount of low-boiling point component is very small and its complete removal is difficult due to the shape of the apparatus, the polymerization reaction may proceed too far in a high temperature operation and the molecular weight of the product may become too large. Further, when a catalyst of a specific kind is used, it may lose its catalytic activity under a condition of high temperature for a long period, and thus the semiconductor-device-member formation liquid may become difficult to cure. Therefore, in those instances, it is possible to distill off the low-boiling point component at a low temperature and under normal pressure, by means of nitrogen gas blowing-in or by steam distillation as appropriate.

In any case of distillation, such as under reduced pressure or with nitrogen gas blowing-in, it is preferable to increase the molecular weight in the former process to an appropriate extent, hydrolysis and polycondensation reaction, in order not to distill off the main component of the hydrolyzate/polycondensate.

When the low-boiling point component, such as solvent, water, low-molecular-weight cyclic siloxane formed as by-product or dissolved air, is removed sufficiently by these means from the semiconductor-device-member formation liquid, the semiconductor device member prepared can decrease the foaming during the curing due to vaporization of the low-boiling point component and the peeling from the device during use at high temperatures. This is desirable.

However, the solvent distillation is not an essential operation. Particularly when a solvent whose boiling point is equal to or lower than the curing temperature of the hydrolyzate/polycondensate is used, the solvent will be volatilized before the curing of the hydrolyzate/polycondensate starts in the drying process of the hydrolyzate/polycondensate, and thus the generation of cracks and the like due to the desolvation shrinkage can be prevented without specially performing the solvent distillation process. However, since the volume of the hydrolyzate/polycondensate may change due to the volatilization of the solvent, it is preferable to perform solvent distillation, from the viewpoint of accurate control of the dimension and shape of the semiconductor device member.

[2-4] Drying

By drying (drying process or curing process) the hydrolyzate/polycondensate obtained by the above hydrolysis and polycondensation reaction, the semiconductor device member of the present invention can be obtained. The hydrolyzate/polycondensate is usually liquid, as described above. By drying it in a mold of the desired shape, the semiconductor device member of the present invention in the desired shape can be formed. Also, by drying the hydrolyzate/polycondensate after applying it on the desired region, the semiconductor device member of the present invention can be formed directly on the desired region. Though the solvent does not necessarily evaporate in the drying process, the drying process, in this context, is assumed to include a phenomenon in which a hydrolyzate/polycondensate having fluidity is hardened by losing the fluidity. Therefore, the above "drying" may be interpreted as "curing" when evaporation of the solvent is not involved.

In the drying process, the metalloxane bond is formed by further polymerization of the hydrolyzate/polycondensate, and the polymers are dried and cured, so as to obtain the semiconductor device member of the present invention.

During the drying process, the hydrolyzate/polycondensate is heated to a predetermined curing temperature for curing. The concrete temperature range can be decided arbitrarily as long as the hydrolyzate/polycondensate can be dried. But it is preferably 120° C. or higher and more preferably 150° C. or higher because the metalloxane bond is usually formed efficiently at 100° C. or higher. However, if the hydrolyzate/polycondensate is heated together with the semiconductor device, it is preferable to perform the drying process usually at or below the heat-resistant temperature of the device components, and preferably at 200° C. or lower.

The time for which the curing temperature maintained (namely, curing time) for drying the hydrolyzate/polycondensate is not unconditionally determined because it depends on the concentration of a catalyst used, thickness of the member and the like. However, the drying process is performed for usually 0.1 hour or more, preferably 0.5 hour or more, more preferably 1 hour or more, and usually 10 hours or less, preferably 5 hours or less, more preferably 3 hours or less.

The condition of rising temperature in the drying process is not specially limited. That is, the temperature may be either maintained at a constant level during the drying process or changed continuously or intermittently. Also, the drying process may be performed as a plurality of steps. Further, the temperature may be changed stepwise in the drying process. By changing the temperature stepwise, an advantage of being able to prevent foaming caused by a residual solvent or dissolved water vapor can be achieved. Particularly, when an additional curing at a higher temperature is performed after a curing at a lower temperature, internal stress is not likely to be generated in the obtained semiconductor device member, leading to a further advantage of generating less cracks or peelings.

However, when the above hydrolysis and polycondensation reaction is performed in the presence of a solvent, if no solvent distillation process is performed or a solvent remains in the hydrolyzate/polycondensate even after performing the solvent distillation process, it is preferable that the drying process is divided into a first drying process in which the solvent is substantially removed at a temperature equal to or below the boiling point of the solvent and a second drying process in which the hydrolyzate/polycondensate is dried at a temperature equal to or above the boiling point of the solvent. The "solvent" in this context includes a solvent represented by XH or the like, which is generated by the above hydrolysis and polycondensation reaction of the above-mentioned material compound, and the aforementioned low-molecular-weight cyclic siloxane. The "drying" in the present description refers to a process in which the above-mentioned hydrolyzate/polycondensate of the material compound loses the solvent and the metalloxane bond is formed by further polymerization and curing.

The first drying process substantially removes the contained solvent at a temperature equal to or below the boiling point of the solvent without actively promoting further polymerization of the hydrolyzate/polycondensate of the material compounds. That is, the product obtained in this process is the one in the state of viscous liquid or soft film, due to hydrogen bonds, which is formed by concentrating the hydrolyzate/polycondensate before the drying process, or the hydrolyzate/polycondensate in a liquid state, which is formed by removing the solvent.

However, usually the first drying process is preferably performed at a temperature below the boiling point of the solvent. If the first drying process is performed at a temperature equal to or above the boiling point of the solvent, the resultant film is foamed by vapor of the solvent, making it difficult to produce a uniform film without defects. This first drying process may be performed as a single step, if the evaporation of the solvent is efficient, for example when the member is formed into a thin film. However, the temperature may be risen in two or more steps, if the evaporation efficiency is low, for example when the member is molded in a cup. For a shape for which evaporation efficiency is extremely low, the hydrolyzate/polycondensate may be coated, after the drying/concentration is performed in a separate, more efficient container in advance, in a state still with the fluidity, before further drying is performed. If the evaporation efficiency is low, it is preferable to contrive to dry a whole member uniformly, not by means of promoting the concentration only at the surface of the member, such as a forced-air drying with a large air flow.

In the second drying process, the hydrolyzate/polycondensate is heated at a temperature equal to or above the boiling point of the solvent and metalloxane bonds are formed, after the solvent of the above hydrolyzate/polycondensate is substantially removed in the first drying process, thereby preparing a stable cured product. If a large amount of solvent remains during this process, large internal stress is generated because of the proceeding crosslinking reaction and the volume reduction due to the solvent evaporation, and peelings and cracks occur due to the shrinkage. Since the metalloxane bond is usually formed efficiently at 100° C. or higher, the second drying process is performed preferably at 100° C. or higher and more preferably at 120° C. or higher. However, if the hydrolyzate/polycondensate is heated together with the semiconductor device, it is preferable to perform the drying process usually at or below the heat-resistant temperature of the device components, and preferably at 200° C. or lower. The curing time in the second drying process is not unconditionally determined because it depends on the concentration of a catalyst used, thickness of the member and the like. However, the second drying process is performed for usually 0.1 hour or longer, preferably 0.5 hour or longer, more preferably 1 hour or longer, and usually 10 hours or shorter, preferably 5 hours or shorter, more preferably 3 hours or shorter.

By separating the process of solvent removal (the first drying process) and the curing process (the second drying process) clearly, as described above, the semiconductor device member, having physicochemical properties of the present invention and superior in light resistance and heat resistance, can be obtained without inducing crack generations or peelings, even without the solvent distillation process.

However, it is still possible that the curing may proceed in the first drying process or the removal of the solvent may proceed in the second drying process. However, the curing in the first drying process or the solvent removal in the second drying process is usually too subtle to affect the advantageous effects of the present invention.

The condition of rising temperature in each process is not particularly limited, as long as the above first drying process and second drying process are substantially realized as described above. That is, the temperature may be either maintained at a constant level during each drying process or changed continuously or intermittently. Also, each of the drying processes may be performed in two or more steps. Further, the scope of the present invention is assumed to include such a case that the first drying process has a period when the temperature temporarily rises to or above the boiling point of the solvent or the temperature during the second drying process falls below the boiling point of the solvent, as long as the above process of the solvent removal (the first drying process) and the curing process (the second drying process) are substantially accomplished independently.

Further, when using a solvent whose boiling point is at or below, preferably below, the curing temperature of the hydrolyzate/polycondensate, the solvent coexisting with the hydrolyzate/polycondensate will be distilled off during the drying process at the moment that the temperature reaches the boiling point, even if the hydrolyzate/polycondensate is heated up to its curing temperature without performing a specific temperature adjustment. Namely, in this case, the process (the first drying process) of substantially removing the solvent at a temperature at or below the boiling point of the solvent is performed, before the hydrolyzate/polycondensate is cured, in the course of heating the hydrolyzate/polycondensate up to its curing temperature in the drying process. Thereby, the hydrolyzate/polycondensate is formed into a liquid hydrolyzate/polycondensate without a solvent contained therein. Then, after that process, the process (the second drying process) in which the hydrolyzate/polycondensate is cured by drying it at a temperature (namely, the curing temperature) equal to or above the boiling point of the solvent will be performed. Therefore, when using a solvent whose boiling point is equal to or below the above-mentioned curing temperature, the above-mentioned first drying process and second drying process will be performed even without intending to perform them specially. Consequently, it is preferable to use a solvent whose boiling point is equal to or below, preferably below, the curing temperature of the hydrolyzate/polycondensate, because the quality of the semiconductor device member will not be significantly affected even if the hydrolyzate/polycondensate contains a solvent during the drying process.

[2-5] Others

After the above-mentioned drying process, various types of post-treatments may be added on the resultant semiconductor device member if necessary. Examples of the post-treatment include a surface treatment for improving the adhesion to the mold parts, preparation of antireflection coating, and preparation of a fine uneven surface for improving the efficiency of extracting light.

[3] Semiconductor-device-member Formation Liquid

The semiconductor-device-member formation liquid of the present invention is a liquid material that can be obtained in the process of hydrolysis and polycondensation, as described above. By curing it in the drying process, a semiconductor device member can be prepared.

When the semiconductor-device-member formation liquid is a curable organopolysiloxane, branched organopolysiloxane is more preferable than straight-chain organopolysiloxane, from the standpoint of the thermal expansion coefficients of their cured products. This is because, the thermal expansion coefficient of the cured product of a branched organopolysiloxane is smaller than that of a straight-chain organopolysiloxane, of which cured product is in a state of elastomer having large thermal expansion coefficient, and therefore, change in optical characteristics associated with thermal expansion, of a branched organopolysiloxane, is small.

There is no limitation on viscosity of the semiconductor-device-member formation liquid of the present invention. However, it is usually 20 mPa·s or larger, preferably 100 mPa·s or larger, and more preferably 200 mPa·s or larger, and usually 1500 mPa·s or smaller, preferably 1000 mPa·s or smaller, and more preferably 800 mPa·s or smaller, at a liquid temperature of 25° C. Incidentally, the above-mentioned viscosity can be measured with a RV-type viscosimeter (for example, RV-type viscosimeter "RVDV-II+Pro", manufactured by Brookfield Engineering Laboratories, Inc.).

There is no limitation on the weight-average molecular weight and the molecular weight distribution of the semiconductor-device-member formation liquid of the present invention. However, the weight-average molecular weight (Mw) in terms of polystyrene, measured with GPC (gel permeation chromatography), is usually 500 or larger, preferably 900 or larger, more preferably 3200 or larger, and usually 400000 or smaller, preferably 70000 or smaller, more preferably 27000 or smaller. When the weight-average molecular weight is too small, there is a tendency to form air bubbles during curing after the formation liquid is filled into the container of semiconductor device. When it is too large, there is a tendency of the semiconductor-device-member formation liquid to increase in its viscosity with the passage of time even at low temperatures or to deteriorate its filling efficiency into the container of the semiconductor device.

The molecular weight distribution (Mw/Mn, where Mw means weight-average molecular weight and Mn means number-average molecular weight) is usually 20 or smaller, preferably 10 or smaller, and more preferably 6 or smaller. When the molecular weight distribution is too large, there is a tendency of the member to increase in its viscosity with the passage of time even at low temperatures or to deteriorate its filling efficiency into the container of the semiconductor device. Incidentally, Mn can be measured in the same way as Mw, with GPC in terms of polystyrene.

In addition, it is preferable for the semiconductor-device-member formation liquid of the present invention to contain less low-molecular-weight components having molecular weights at or below a specific size. More specifically, the proportion of the components whose molecular weights are 800 or smaller, in areal ratio of GPC, in the semiconductor device member of the present invention is usually 10% or smaller, preferably 7.5% or smaller, and more preferably 5% or smaller. When the low-molecular-weight components are too much, there is a possibility of forming air bubbles during the curing of the semiconductor-device-member formation liquid or decreasing the yield by weight (solid portion content) during the curing due to volatilization of the main component.

Furthermore, it is preferable for the semiconductor-device-member formation liquid of the present invention to contain less polymer components having molecular weights at or above a specific size. More specifically, the molecular weight of which fraction range of high molecular weight is 5% in the GPC analysis value of the semiconductor-device-member formation liquid of the present invention is usually 1000000 or smaller, preferably 330000 or smaller, and more preferably 110000 or smaller. When the fraction range of the high-molecular weight side is too wide, there are possibilities of the following actions.

a) The semiconductor-device-member formation liquid increases in its viscosity with the passage of time even when stored at a low temperature.

b) Dehydration condensation while storage produces water, which makes it easier for the semiconductor-device-member formation liquid to be peeled from the substrate, package or the like after the semiconductor device member is formed on the surface of the substrate, package or the like.

c) Because of the high viscosity, the semiconductor-device-member formation liquid becomes difficult in getting rid of air bubbles during the curing.

In summary, it is preferable that the molecular weight range of the semiconductor-device-member formation liquid of the present invention falls in the above-mentioned range. Such a molecular weight range can be realized by any one the following methods, for example.

(i) Using up the unreacted materials by performing the polymerization reaction sufficiently at the time of the synthesis.

(ii) Removing the low-boiling point and low-molecular weight residues by distilling off the low-boiling point components sufficiently after the synthesis reaction.

(iii) Preventing the molecular weight distribution from getting wider than necessary by controlling the reaction velocity or the conditions at the time of the synthesis reaction so as to progress the polymerization reaction uniformly.

For example when preparing a semiconductor device member using a polycondensate formed by hydrolysis and polycondensation of a specific compound, as described in "[2] Production method of semiconductor device member", it is preferable to progress the hydrolysis and polycondensation reaction at the time of synthesis of the semiconductor-device-member formation liquid uniformly while keeping an appropriate reaction velocity. The hydrolysis and polycondensation is performed at usually 15° C. or higher, preferably 20° C. or higher, and more preferably 40° C. or higher, and usually 140° C. or lower, preferably 135° C. or lower, and more preferably 130° C. or lower. The length of time for the hydrolysis and polycondensation reaction is, though it differs depending on the reaction temperature, usually 0.1 hour or longer, preferably 1 hour or longer, more preferably 3 hours or longer, and usually 100 hours or shorter, preferably 20 hours or shorter, more preferably 15 hours or shorter. When the reaction time is shorter than the above range, there is a possibility that the molecular weight fails to reach the necessary size or that nonuniform progress of the reaction causes residues of the low-molecular-weight materials while polymer components also exists. Such problems may lead to the formation of a cured product which is poor in quality or in storage stability. On the other hand, when the reaction time is longer than the above range, there is a possibility that the polymerization catalyst deactivates or that the productivity gets worse due to the long synthesis time.

When the reaction is difficult to proceed because of low reaction activity of the material, an inert gas such as argon gas, helium gas or nitrogen gas may be flowed if necessary. Then the water or alcohol generated during the condensation reaction follows it and can be removed, which accelerates the reaction.

It is preferable that the reaction time is adjusted as appropriate with carrying out a molecular weight control by means of GPC and viscosity measurement. Furthermore, the reaction time is preferably adjusted in consideration of the heating-up period.

When using a solvent, it is preferable that the solvent distillation is performed if necessary at a normal pressure. At this point, when the boiling point of the solvent or other low-molecular-weight materials to be removed is equal to the curing start temperature (usually, 120° C. or higher), it is preferable to carry out the distillation under reduced pressure if necessary. Depending on the purpose of use, such as forming a thin light guide film, a part of the solvent can be remained for the purpose of viscosity reduction. In such a case, a solvent different from the reaction solvent can be added after the distillation of the reaction solvent.

It is preferable that the upper and the lower limit of the molecular weight distribution of the semiconductor-device-member formation liquid fall within the above-mentioned range. However, it is not always necessary for the molecular weight distribution to have only one peak, insofar as it is within that range. For example, semiconductor-device-member formation liquids having different molecular weight distributions can be mixed so as to add another function. In such a case, the molecular weight distribution curve may have even two or more peaks. This is in the case, for example, where, to the first semiconductor-device-member formation liquid having high molecular weight so that it can equip the semiconductor device member with mechanical strength, a small amount of the second low-molecular-weight semiconductor-device-member formation liquid containing a large amount of adhesive component is added.

It is preferable that the amount of low-boiling component in the semiconductor-device-member formation liquid of the present invention is small as is the case with the semiconductor device member of the present invention as described in "[1-4-9] low-boiling component".

In addition, a minute amount of alkoxy group usually remains in the semiconductor device member of the present invention. A semiconductor device member and a semiconductor-device-member formation liquid containing less of this terminal alkoxy group show small weight losses, measured with TG-DTA, leading to high heat resistances. The amount of alkoxy group contained in the semiconductor-device-member formation liquid of the present invention is usually 5 weight % or lower, preferably 3 weight % or lower, and more preferably 0.2 weight % or lower.

The semiconductor-device-member formation liquid may contain another component, depending on its use. For example when the semiconductor device member of the present invention is used as a constituent of a semiconductor light-emitting device, the semiconductor-device-member formation liquid may contain a phosphor, inorganic particle or the like. At this point, a material containing a semiconductor-device-member formation liquid and a phosphor is referred to as a "phosphor composition of the present invention" particularly. Explanations will be given on these points later, together with an explanation on the use of them.

The other components may be used either as a single kind thereof or as a mixture of two or more kinds in any combination and in any ratio.

[4] Use of Semiconductor Device Member

The semiconductor device member of the present invention is not particularly limited in its use and can be used for various purposes typified by a member for sealing (namely, a sealant for) a semiconductor element or the like. Among others, by using phosphor particles and/or inorganic particles in combination, it can be more suitably used for specific purposes. Such combined uses of phosphor particles and inorganic particles will be described below.

[4-1] Phosphor

The semiconductor device member of the present invention can be used, for example, as a member for wavelength conversion by dispersing a phosphor in the semiconductor device member, which is molded inside a cup of a semiconductor light-emitting device or applied as a thin film on an appropriate transparent support. A single kind of phosphor can be used alone or as a mixture of two or more kinds in any combination and in any ratio.

[4-1-1] Type of Phosphor

There is no special limitation on the composition of the phosphor. Preferable examples include compositions in which a host crystal such as a metal oxide represented by $Y_2O_3$ or $Zn_2SiO_4$, phosphate represented by $Ca_5(PO_4)_3Cl$, and sulfide represented by ZnS, SrS or CaS, is added with an activator or coactivator such as a rare earth metal ion like Ce, Pr, Nd, Pm, Sm, Eu, Tb, Dy, Ho, Er, Tm or Yb, or metal ion like Ag, Cu, Au, Al, Mn or Sb.

Preferable examples of the host crystal include sulfides such as (Zn,Cd)S, $SrGa_2S_4$, SrS and ZnS; oxysulfides such as $Y_2O_2S$; aluminate compounds such as $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_{12}O_{19}$, $CeMgAl_{11}O_{19}$, $(Ba,Sr,Mg)OAl_2O_3$, $BaAl_2Si_2O_8$, $SrAl_2O_4$, $Sr_4Al_{14}O_{25}$ and $Y_3Al_5O_{12}$; silicate such as $Y_2SiO_5$ and $Zn_2SiO_4$; oxides such as $SnO_2$ and $Y_2O_3$; borates such as $GdMgB_5O_{10}$ and $(Y,Gd)BO_3$; halophosphates such as $Ca_{10}(PO_4)_6(FCl)_2$ and $(Sr,Ca,Ba,Mg)_{10}(PO_4)_6Cl_2$; phosphates such as $Sr_2P_2O_7$ and $(La,Ce)PO_4$.

No particular limitation is imposed on the element composition of the above host crystal and activator/coactivator. Partial substitution with the element of the same group is possible. Any phosphor obtained can be used so long as it absorbs light in the near ultraviolet to visible region and emits visible light.

More concretely, those listed below can be used as phosphor. The list shown below serves just as an example and phosphors that can be used in the present invention are not limited to these examples. In the following examples, phosphors with different partial structure are shown abbreviated as a group for the sake of convenience. For example, 3 compounds of "$Y_2SiO_5:Ce^{3+}$", "$Y_2SiO_5:Tb\ 3+$" and "$Y_2SiO_5:Ce^{3+},Tb^{3+}$" are combined as "$Y_2SiO_5:Ce^{3+},Tb^{3+}$" and 3 compounds of "$La_2O_2S:Eu$", "$Y_2O_2S:Eu$" and "$(La,Y)_2O_2S:Eu$" are combined as "$(La,Y)_2O_2S:Eu$". Abbreviated part is indicated by comma-separation.

[4-1-1-1] Red Phosphor

An example of the wavelength range of fluorescence emitted by a phosphor which emits red fluorescence (hereinafter referred to as "red phosphor" as appropriate) is such that the peak wavelength thereof is usually 570 nm or longer, preferably 580 nm or longer, and usually 700 nm or shorter, preferably 680 nm or shorter.

Examples of such a red phosphor include europium-activated alkaline earth silicon nitride phosphors represented by $(Mg,Ca,Sr,Ba)_2Si_5N_8$:Eu, which are constituted by fractured particles having red fractured surfaces and emit light in the red region, and europium-activated rare earth oxychalcogenide phosphors represented by $(Y,La,Gd,Lu)_2O_2S$:Eu, which are constituted by growing particles having nearly spherical shapes typical of regular crystal growth and emit light in the red region.

Also applicable in the present embodiment is an phosphor, which is described in Japanese Patent Laid-Open Publication (Kokai) No. 2004-300247, containing oxynitride and/or oxysulfide, as well as at least one element selected from the group consisting of Ti, Zr, Hf, Nb, Ta, W and Mo, and an oxynitride having an αsialon structure in which all or part of Al element is replaced by Ga element. These are phosphors containing oxynitride and/or oxysulfide.

Other examples of red phosphors include: Eu-activated oxysulfide such as $(La,Y)_2O_2S$:Eu; Eu-activated oxide such as $Y(V,P)O_4$:Eu and $Y_2O_3$:Eu; Eu,Mn-activated silicate such as $(Ba,Sr,Ca,Mg)_2SiO_4$:Eu,Mn and $(Ba,Mg)_2SiO_4$:Eu,Mn; Eu-activated sulfide such as (Ca,Sr)S:Eu; Eu-activated aluminate such as $YAlO_3$:Eu; Eu-activated silicate such as $LiY_9(SiO_4)_6O_2$:Eu, $Ca_2Y_8(SiO_4)_6O_2$:Eu, $(Sr,Ba,Ca)_3SiO_5$:Eu and $Sr_2BaSiO_5$:Eu; Ce-activated aluminate such as $(Y,Gd)_3Al_5O_{12}$:Ce and $(Tb,Gd)_3Al_5O_{12}$:Ce; Eu-activated nitride such as $(Ca,Sr,Ba)_2Si_5N_8$:Eu, (Mg, Ca,Sr,Ba)SiN$_2$:Eu and (Mg, Ca,Sr,Ba)AlSiN$_3$:Eu; Ce-activated nitride such as (Mg, Ca,Sr,Ba)AlSiN$_3$:Ce; Eu,Mn-activated halophosphate such as $(Sr,Ca,Ba,Mg)_{10}(PO_4)_6Cl_2$:Eu,Mn; Eu,Mn-activated silicate such as $(Ba_3Mg)Si_2O_8$:Eu,Mn and $(Ba,Sr,Ca,Mg)_3(Zn,Mg)Si_2O_8$:Eu,Mn; Mn-activated germanate such as $3.5MgO.0.5MgF_2.GeO_2$:Mn; Eu-activated oxynitride such as Eu-activated α-sialon; Eu,Bi-activated oxide such as $(Gd,Y,Lu,La)_2O_3$:Eu,Bi; Eu,Bi-activated oxysulfide such as $(Gd,Y,Lu,La)_2O_2S$: Eu,Bi; Eu,Bi-activated vanadate such as $(Gd,Y,Lu,La)VO_4$:Eu,Bi; Eu, Ce-activated sulfide such as $SrY_2S_4$:Eu,Ce; Ce-activated sulfide such as $CaLa_2S_4$:Ce; Eu,Mn-activated phosphate such as $(Ba,Sr, Ca)MgP_2O_7$:Eu,Mn and $(Sr,Ca,Ba,Mg,Zn)_2P_2O_7$:Eu,Mn; Eu,Mo-activated tungstate such as $(Y,Lu)_2WO_6$:Eu,Mo; Eu, Ce-activated nitride such as $(Ba,Sr,Ca)_xSi_yN_z$:Eu,Ce (x,y,z being an integer of 1 or larger); Eu,Mn-activated halophosphate such as $(Ca,Sr,Ba,Mg)_{10}(PO_4)_6(F,Cl,Br,OH)$:Eu,Mn; Ce-activated silicate such as $((Y,Lu,Gd,Tb)_{1-x}Sc_xCe_y)_2(Ca, Mg)_{1-r}(Mg,Zn)_{2+r}Si_{z-q}Ge_qO_{12+\delta}$.

Also applicable as the red phosphor are: red organic phosphor consisting of rare earth ion complex containing anions of such as β-diketonate, β-diketone, aromatic carboxylic acid or Broensted acid as ligand, perylene pigment (for example, dibenzo {[f,f']-4,4',7,7'-tetraphenyl}diindeno[1,2,3-cd:1',2',3'-1m] perylene), anthraquinone pigment, lake pigment, azo pigment, quinacridone pigment, anthracene pigment, isoindoline pigment, isoindolinone pigment, phthalocyanine pigment, triphenylmethane series basic dye, indanthrone pigment, indophenol pigment, cyanine pigment and dioxazine pigment.

Also, among red phosphors, those whose peak wavelength is 580 nm or longer, preferably 590 nm or longer, and 620 nm or shorter, preferably 610 nm or shorter can be suitably used as an orange phosphor. Examples of such orange phosphors include: $(Sr, Ba)_3SiO_5$:Eu, $(Sr, Mg)_3(PO_4)_2$: $Sn^{2+}$, SrCaAlSiN$_3$:Eu, and Eu-activated oxynitride such as Eu-activated α-sialon.

[4-1-1-2] Green Phosphor

Examples of the wavelength range of fluorescence emitted by a phosphor which emits green fluorescence (hereinafter referred to as "green phosphor" as appropriate) are such that the peak wavelength thereof is usually 490 nm or longer, preferably 500 nm or longer, and usually 570 nm or shorter, preferably 550 nm or shorter.

Examples of such a green phosphor include europium-activated alkaline earth silicon oxynitride phosphors represented by $(Mg,Ca,Sr,Ba)Si_2O_2N_2$:Eu, which are constituted by fractured particles having fractured surfaces and emit light in the green region, and europium-activated alkaline earth silicate phosphors represented by $(Ba,Ca,Sr,Mg)_2SiO_4$:Eu, which are constituted by fractured particles having fractured surfaces and emit light in the green region.

Other examples of the green phosphors include: Eu-activated aluminate such as $Sr_4Al_{14}O_{25}$:Eu and $(Ba,Sr,Ca)Al_2O_4$:Eu; Eu-activated silicate such as $(Sr,Ba)Al_2Si_2O_8$:Eu, $(Ba,Mg)_2SiO_4$:Eu, $(Ba,Sr,Ca,Mg)_2SiO_4$:Eu and $(Ba,Sr, Ca)_2(Mg,Zn)Si_2O_7$:Eu; Ce,Tb-activated silicate such as $Y_2SiO_5$:Ce,Tb; Eu-activated borophosphate such as $Sr_2P_2O_7$—$Sr_2B_2O_5$:Eu; Eu-activated halosilicate such as $Sr_2Si_3O_8$-$2SrCl_2$:Eu; Mn-activated silicate such as $Zn_2SiO_4$:Mn; Tb-activated aluminate such as $CeMgAl_{11}O_{19}$:Tb and $Y_3Al_5O_{12}$:Tb; Tb-activated silicate such as $Ca_2Y_8(SiO_4)_6O_2$: Tb and $La_3Ga_5SiO_{14}$:Tb; Eu,Tb,Sm-activated thiogalate such as (Sr, Ba, Ca) $Ga_2S_4$:Eu, Tb, Sm; Ce-activated aluminate such as $Y_3(Al,Ga)_5O_{12}$:Ce and $(Y,Ga,Tb,La,Sm,Pr,Lu)_3(Al,Ga)_5O_{12}$:Ce; Ce-activated silicate such as $Ca_3Sc_2Si_3O_{12}$:Ce and $Ca_3(Sc,Mg,Na,Li)_2Si_3O_{12}$:Ce; Ce-activated oxide such as $CaSc_2O_4$:Ce; Eu-activated oxynitride such as $SrSi_2O_2N_2$:Eu, $(Sr,Ba, Ca)Si_2O_2N_2$:Eu and Eu-activated β-sialon; Eu,Mn-activated aluminate such as $BaMgAl_{10}O_{17}$:Eu; Eu-activated aluminate such as $SrAl_2O_4$:Eu; Tb-activated oxysulfide such as $(La,Gd,Y)_2O_2S$:Tb; Ce,Tb-activated phosphate such as $LaPO_4$:Ce,Tb; sulfide such as ZnS:Cu,Al, ZnS:Cu,Au,Al; Ce,Tb-activated borate such as (Y,Ga,Lu,Sc,La)BO$_3$:Ce,Tb, $Na_2Gd_2B_2O_7$:Ce,Tb and $(Ba,Sr)_2(Ca,Mg,Zn)B_2O_6$:K,Ce,Tb; Eu,Mn-activated halosilicate such as $Ca_8Mg(SiO_4)_4Cl_2$:Eu,Mn; Eu-activated thioaluminate or thiogallate such as $(Sr,Ca,Ba)_8(Al,Ga,In)_2S_4$:Eu; Eu,Mn-activated halosilicate such as $(Ca,Sr)_8(Mg,Zn)(SiO_4)_4Cl_2$:Eu, Mn.

Also applicable as the green phosphor are: fluorescent dyes such as pyridine-phthalimide condensation product, benzoxadinone compound, quinazoline compound, coumarine compound, quinophthalone compound and naphtalimide compound; and organic phosphors such as terbium complex having hexylsalicylate as its ligand.

[4-1-1-3] Blue Phosphor

An example of the wavelength range of fluorescence emitted by a phosphor which emits blue fluorescence (referred to as "blue phosphor" as appropriate) is such that the peak wavelength thereof is usually 420 nm or longer, preferably 440 nm or longer, and usually 480 nm or shorter, preferably 470 nm or shorter.

Examples of such a blue phosphor include europium-activated barium magnesium aluminate phosphors represented by $BaMgAl_{10}O_{17}$:Eu, which are constituted by growing particles having nearly hexagonal shapes typical of regular crystal growth and emit light in the blue region, europium-activated calcium halphosphate phosphors represented by (Ca, Sr,Ba) 5 $(PO_4)_3Cl$:Eu, which are constituted by growing particles having nearly spherical shapes typical of regular crystal growth and emit light in the blue region, europium-activated alkaline earth chloroborate phosphors represented by $(Ca,Sr,Ba)_2B_5O_9Cl$:Eu, which are constituted by growing particles having nearly cubic shapes typical of regular crystal growth and emit light in the blue region, and europium-activated alkaline earth aluminate phosphors represented by (Sr,Ca,Ba)Al$_2$O$_4$:Eu or (Sr,Ca,Ba)$_4$Al$_{14}$O$_{25}$:Eu, which are constituted by fractured particles having fractured surfaces and emit light in the blue region.

Other examples of the blue phosphor include: Sn-activated phosphate such as Sr$_2$P$_2$O$_7$:Sn; Eu-activated aluminate such as Sr$_4$AL$_{14}$O$_{25}$:Eu, BaMgAl$_{10}$O$_{17}$:Eu and BaAl$_8$O$_{13}$:Eu; Ce-activated thiogallate such as SrGa$_2$S$_4$:Ce and CaGa$_2$S$_4$:Ce; Eu-activated aluminate such as (Ba,Sr,Ca)MgAl$_{10}$O$_{17}$:Eu and BaMgAl$_{10}$O$_{17}$:Eu,Tb,Sm; Eu,Mn-activated aluminate such as (Ba,Sr, Ca)MgAl$_{10}$O$_{17}$:Eu,Mn; Eu-activated halophosphate such as (Sr,Ca,Ba,Mg)$_{10}$(PO$_4$)$_6$Cl$_2$:Eu and (Ba,Sr,Ca)$_5$(PO$_4$)$_3$(Cl,F,Br,OH):Eu,Mn,Sb; Eu-activated silicate such as BaAl$_2$Si$_2$O$_8$:Eu, (Sr,Ba)$_3$MgSi$_2$O$_8$:Eu; Eu-activated phosphate such as Sr$_2$P$_2$O$_7$:Eu; sulfide such as ZnS:Ag,ZnS:Ag,Al; Ce-activated silicate such as Y$_2$SiO$_5$:Ce; tungstate such as CaWO$_4$; Eu,Mn-activated borophosphate such as (Ba,Sr, Ca)BPO$_5$:Eu,Mn, (Sr, Ca)$_{10}$(PO$_4$)$_6$*nB$_2$O$_3$:Eu and 2SrO.0.84P$_2$O$_5$.0.16B$_2$O$_3$:Eu; Eu-activated halosilicate such as Sr$_2$Si$_3$O$_8$.2SrCl$_2$:Eu.

Also applicable as the blue phosphor are: fluorescent dyes such as naphthalimide compound, benzoxazole compound, styryl compound, coumarine compound, pyrazoline compound and triazole compound; and organic phosphors such as thlium complex.

[4-1-1-4] Yellow Phosphor

An example of the wavelength range of fluorescence emitted by a phosphor which emits yellow fluorescence (hereinafter referred to as "yellow phosphor" as appropriate) is as follows. It is preferable that it is usually 530 nm or longer, preferably 540 nm or longer, more preferably 550 nm or longer, and usually 620 nm or shorter, preferably 600 nm or shorter, more preferably 580 nm or shorter. If the emission peak wavelength of the yellow phosphor is too short, yellow components may be not enough and the semiconductor light-emitting device may be inferior in color rendering. If it is too long, the brightness of the semiconductor light-emitting device may be lowered.

Examples of the yellow phosphor include various phosphors of such as oxide, nitride, oxynitride, sulfide and oxysulfide. Particularly preferable examples include: garnet phosphors represented by RE$_3$M$_5$O$_{12}$:Ce (here, RE indicates at least one element from Y, Tb, Gd, Lu and Sm, M indicates at least one element from Al, Ga and Sc), M$^2$$_3$M$^3$$_2$M$_3$O$_{12}$:Ce (here, M$^2$, M$^3$ and M$^4$ are divalent, trivalent and tetravalent metal element respectively) or the like, having garnet structures; orthosilicate phosphors represented by AE$_2$M$^5$O$_4$:Eu (here, AE indicates at least one element from Ba, Sr, Ca, Mg and Zn, M$^5$ indicates at least one element from Si and Ge) or the like; oxynitride phosphors in which a part of oxygen, which is a constituent element of the above types of phosphors, is substituted by nitrogen; and Ce-activated nitride phosphors having CaAlSiN$_3$ structures such as AEAlSiN$_3$:Ce (here, AE indicates at least one element from Ba, Sr, Ca, Mg and Zn).

Also applicable as the yellow phosphor are Eu-activated sulfide phosphors such as CaGa$_2$S$_4$:Eu, (Ca,Sr)Ga$_2$S$_4$:Eu and (Ca,Sr)(Ga,Al)$_2$S$_4$:Eu; and Eu-activated oxynitride phosphors having SiAlON structures such as Cax(Si,Al)$_{12}$(O,N)$_{16}$:Eu.

[4-1-1-5] Other Phosphors

The semiconductor device member of the present invention may contain phosphors other than those cited above. For example, the semiconductor device member of the present invention may be a fluorescent glass in which an ionic-state phosphor material or an organic/inorganic phosphor component is dissolved or dispersed uniformly and transparently.

[4-1-2] Particle Diameter of Phosphor

No particular limitation is imposed on the particle diameter of phosphors used in the present invention. However, the median particle diameter ($D_{50}$) thereof is usually 0.1 μm or larger, preferably 2 μm or larger, more preferably 5 μm or larger, and usually 100 μm or smaller, preferably 50 μm or smaller, more preferably 20 μm or smaller. When the median particle diameter ($D_{50}$) of the phosphors is within the above range, the light emitted from the semiconductor luminous element can be scattered sufficiently, in the semiconductor light-emitting device to be described later. In addition, in such a case, the light emitted from the semiconductor luminous element is absorbed in the phosphor particles sufficiently, and therefore, not only the wavelength conversion can be performed highly efficiently but also the light emitted from the phosphors can be radiated in all directions. With this structure, a white light can be obtained by mixing primary lights from the several kinds of phosphors, as well as a synthesized light emitted from the semiconductor light-emitting device can be obtained, having uniform whiteness and illumination intensity. When the median particle diameter ($D_{50}$) of the phosphors is larger than the above range, the phosphors can not fill the space of illuminant portion sufficiently, and therefore, the light emitted from the semiconductor element may not be absorbed in the phosphors sufficiently, in the semiconductor light-emitting device to be described later. When the median particle diameter ($D_{50}$) of the phosphors is smaller than the above range, emission efficiency of the phosphors will be reduced, and therefore, illumination intensity of the semiconductor light-emitting device may be reduced.

It is preferable that the particle size distribution (QD) of the phosphor particles is smaller for the purpose of equalizing the dispersion state of the particles in the semiconductor device member. However, the smaller the particle size distribution, the lower the classification efficiency will be and therefore the higher the cost will be. For that reason, it is usually 0.03 or larger, preferably 0.05 or larger, more preferably 0.07 or larger, and usually 0.4 or smaller, preferably 0.3 or smaller, more preferably 0.2 or smaller.

In the present invention, the median particle diameter ($D_{50}$) and particle size distribution (QD) can be obtained from a mass-standard particle size distribution curve. The mass-standard particle size distribution curve can be obtained from the measurement of particle size distribution by laser diffraction/scattering method, as described concretely in the following.

[Method of Measuring Mass-standard Particle Size Distribution Curve]

(1) Phosphor particles are dispersed in such a solvent as ethylene glycol under the condition of 25° C. temperature and 70% humidity.
(2) Particle size distribution is measured by laser diffraction particle size analyzer (LA-300, manufactured by HORIBA, Ltd) at particle diameter range of 0.1 μm to 600 μm.
(3) The particle diameter whose integrated value is 50% in this mass-standard particle size distribution curve is represented by "median particle diameter $D_{50}$". The particle diameters of 25% and 75% integrated values are represented by $D_{25}$ and $D_{75}$ respectively. QD is defined as ($D_{75}$−$D_{25}$)/($D_{75}$+$D_{25}$) Small value of QD means a narrow particle size distribution.

Also, the shape of the phosphor particles is not particularly limited as long as formation of the semiconductor device members is not affected. For example, it is not limited as long as the fluidity or the like of the phosphor part formation liquid (namely, liquid for forming the semiconductor device member containing phosphor, which has the same meaning as phosphor component) is not affected.

[4-1-3] Surface Treatment of Phosphor

A surface treatment may be performed to the phosphor used in the present invention, for the purpose of enhancing the water resistance or preventing unnecessary aggregation of the phosphor in the semiconductor device member. Examples of such a surface treatment include a surface treatment using organic, inorganic, glass and the like materials as defined in Japanese Patent Laid-Open Publication (Kokai) No. 2002-223008, a coating treatment with metal phosphate as defined in Japanese Patent Laid-Open Publication (Kokai) No. 2000-96045 or the like, a coating treatment with metal oxide, and known various surface treatments such as silica coating.

For example, when metal phosphate is coated on the surface of phosphors, the following steps (i) to (iii) of surface treatment is performed concretely.

(i) Predetermined amounts of water-soluble phosphate such as potassium phosphate and sodium phosphate and water-soluble metallic salt of at least one metal element selected from alkaline earth metals, Zn and Mn, such as calcium chloride, strontium sulfate, manganese chloride and zinc nitrate, are mixed in the phosphor suspension liquid and stirred.

(ii) Phosphate of at least one metal element, selected from alkaline earth metals, Zn and Mn, is formed in the suspension, and simultaneously the metal phosphate formed is deposited on the surface of the phosphors.

(iii) Water is removed.

Other preferable examples of surface treatment include, for example, as silica coating, a method in which $SiO_2$ is deposited by neutralizing a liquid glass, and a method of surface treatment with hydrolyzed alkoxysilane (for example, Japanese Patent Laid-Open Publication (Kokai) No. Hei 3-231987). Of these, the method of surface treatment with hydrolyzed alkoxysilane is preferable from the standpoint of enhancing the dispersibility.

[4-1-4] Mixing Method of Phosphor

In the present invention, the method of adding phosphor particles is not particularly limited. If phosphor particles are in a good dispersion state, it is sufficient only to post-mix phosphor particles into the above liquid for forming the semiconductor device member. That is, it is sufficient to prepare a phosphor part formation liquid, by mixing the liquid for forming the semiconductor device member and the phosphor, and to form the semiconductor device member by using this phosphor part formation liquid. If phosphor particles tend to aggregate, it is preferable to perform hydrolysis and polycondensation in the presence of phosphor particles, mixed in advance into the reaction solution (hereinafter referred to as a "solution before hydrolysis" when appropriate) containing material compounds not yet subjected to hydrolysis. With this procedure, silane coupling processing is conducted in a part of the particles' surfaces and the dispersion state of the phosphor particles is improved.

Some types of phosphor are hydrolyzable. However, in the semiconductor device member of the present invention, moisture content exists potentially as silanol products and almost no liberated moisture content exists in a liquid state (semiconductor-device-member formation liquid) before the coating process, and therefore such phosphors can also be used without being hydrolyzed. Also an advantage of easily using such phosphors together can be obtained, by using the semiconductor-device-member formation liquid, already hydrolyzed and polycondensated, after performing dehydration and dealcoholization processes.

Further, when phosphor particles or inorganic particles (to be described later) are dispersed in the semiconductor device member of the present invention, it is possible to modify the surface of the particles with organic ligands in order to improve dispersibility. Addition type silicone resin, which has previously been used as semiconductor device member, was liable to undergo curing impairment by these organic ligands and could not be mixed/cured with particles which had been surface-treated. This is because platinum series curing catalyst used in addition reaction type silicone resin interacts strongly with organic ligands and loses capability of hydrosilylation, resulting in poor curing. Examples of these damaging substances include organic compounds containing N, P and S, ionic compounds of heavy metals such as Sn, Pb, Hg, Bi and As, and organic compounds containing multiple bond such as acetylene group (flux, amines, vinyl chloride, sulfur vulcanized rubber etc.). On the other hand, the semiconductor device member of the present invention is related to condensing-type curing mechanism, which is less liable to undergo inhibition by these damaging substances. Therefore, the semiconductor device member of the present invention can be used more freely in combination with phosphor particles or inorganic particles, whose surfaces have been improved with organic ligands, or, further, with phosphor components such as complex phosphors. This means an excellent property as transparent material that is capable of introducing binders for phosphors or nano particles with high refractive indexes.

[4-1-5] Content of Phosphor

The content of the phosphor in the semiconductor device member of the present invention can be selected arbitrary insofar as the advantage of the present invention is not significantly impaired. Actually, it can be selected freely depending on its form of applications. As regards a semiconductor device emitting white light, which is used for white LED, white-light lighting system or the like, if the entire recess of the package including the semiconductor luminous element is filled by means of potting, with the phosphor dispersed uniformly, the total content of the phosphor is usually 0.1 weight % or more, preferably 1 weight % or more, more preferably 5 weight % or more, and usually 35 weight % or less, preferably 30 weight % or less, more preferably 28 weight % or less.

In the same application form, but when a material with phosphor dispersed in a high concentration is coated as a thin film, at the portion apart from the emission surface (for example, the opening surface of the package with which recess, containing the semiconductor element, is filled with transparent sealant, or the light-exiting surface of an external optical element such as glass lid for an air-tight sealing of LED, lens and optical guide plate) of the semiconductor element of the semiconductor light-emitting device, the total content is usually 5 weight % or more, preferably 7 weight % or more, more preferably 10 weight % or more, and usually 90 weight % or less, preferably 80 weight % or less, more preferably 70 weight % or less.

When a white light is intended to be obtained by mixing the luminescent colors of the semiconductor element and phosphor, generally a part of the light emitted from the semiconductor element passes through the phosphor part. Therefore, in such a case, the concentration of the phosphor tends to be as low as close to the lower limit of the above-mentioned range. On the other hand, when a white light is obtained by converting all of the light emitted from the semiconductor element into the light with luminescent color of the phosphor, it is preferable that the concentration of the phosphor is high. Therefore, in such a case, the concentration of the phosphor tends to be as high as close to the upper limit of the above-mentioned range. If the content of the phosphor is above this range, coating properties may be lowered, or low efficiency of phosphor utilization, due to an optical interference, may cause reduced brightness of the semiconductor light-emitting device. If the content of the phosphor is below this range, the wavelength conversion by the phosphor will be insufficient and therefore the intended luminescent color may not be obtained.

An example of the content of phosphor, which is used in the semiconductor light-emitting device emitting white light, is shown above. However, the concrete content of the phosphor is not limited to that and varies widely depending on the intended color, emission efficiency of the phosphor, color mixing method, specific gravity of the phosphor, film thickness of coating, shape of the device or the like.

The semiconductor-device-member formation liquid of the present invention has such advantages as low viscosity, high miscibility with phosphors or inorganic particles and good coating properties that can be maintained even when high concentration of phosphors or inorganic particles are dispersed therein, in comparison with the conventional liquid for forming the semiconductor light-emitting device member such as epoxy resin and silicone resin. Moreover, it can be of high viscosity as needed by such a method of adjusting the degree of polymerization and adding thixotropic agent like aerosil. Namely, it is very flexible in adjustment of viscosity according to the intended content of phosphors. Therefore, it can provide a coating liquid that can correspond very flexibly to not only the kinds or shapes of coating objects but also the various coating methods such as potting, spin coating and printing.

The content of the phosphor in the semiconductor device member can be determined by the following procedure, if the composition of the phosphor can be identified. A phosphor-containing sample is prebaked after being pulverized so as to remove carbon components, followed by removing silicon components as hydrofluorosilicic acid by hydrofluoric acid treatment. By dissolving the residue in diluted sulfuric acid, the metal elements, which are the main components, are made into water solution and the quantity thereof is determined by such known elemental analyses as ICP, flame analysis and fluorescent X-ray analysis. Then the content of the phosphor can be determined by a calculation. If the shapes and particle diameters of the phosphors are uniform and the specific gravity thereof is known, the content of phosphor can be determined, by a simplified method, from the number of the particles per unit area, obtained by image analysis of the cross section of the coating.

The phosphor content in the phosphor part formation liquid can be set so that the phosphor content in the semiconductor device member falls within the above range. Namely, when the weight of the phosphor part formation liquid is not changed in the drying process, the phosphor content in the phosphor part formation liquid will be equal to the phosphor content in the semiconductor device member. On the other hand, when the weight of the phosphor part formation liquid is changed in the drying process, for example because the phosphor part formation liquid contains a solvent or the like, the phosphor content in the phosphor part formation liquid other than the solvent or the like can be considered the same as the phosphor content in the semiconductor device member.

[4-2] Combined Use of Inorganic Particles (Fillers)

The semiconductor device member of the present invention may, for example when it is used for a semiconductor light-emitting device, further contain inorganic particles for the purpose of improving the optical characteristics and workability, or obtaining any of effects <1> to <5> shown below.

<1> By mixing inorganic particles as a light scattering substance into the semiconductor device member to cause light from the semiconductor light-emitting device to scatter, the amount of light from the semiconductor luminous element incident on the phosphor is increased. This improves the efficiency of wavelength conversion and also widens the angle of spreading light from the semiconductor light-emitting device to the outside.

<2> By blending the semiconductor device member with inorganic particles as a binder, crack generations are prevented.

<3> By blending the semiconductor-device-member formation liquid with inorganic particles as a viscosity modifier, viscosity of the liquid is improved.

<4> By blending the semiconductor device member with inorganic particles, the shrinkage thereof is reduced.

<5> By blending the semiconductor device member with inorganic particles, the refractive index thereof is adjusted so as to improve the efficiency of extracting light.

In this case, it is only necessary to mix an appropriate amount of inorganic particles into the semiconductor-device-member formation liquid, similarly to the phosphor particles, according to purposes. Effects that can be obtained in this case depend on the type and the amount of inorganic particles to be mixed.

When, for example, an ultrafine particle silica (manufactured by Nippon Aerosil Co., Ltd., commercial name: AEROSIL#200) with particle diameter of some 10 nm is used as the inorganic particle, the effect of the above <3> is noticeable because thixotropy of the semiconductor-device-member formation liquid increases.

When a fractured silica or spherical silica whose particle diameter is about several μm is used as the inorganic oxide particle, it functions mainly as the aggregate for the semiconductor device member and increase in thixotropy is just a little. Therefore, in such a case, the effects of the above <2> and <4> are noticeable.

Also, if inorganic particles of about 1 μm in diameter, whose refractive index is different from that of the semiconductor device member, are used, the effect of the above <1> is noticeable because the light scattering at the interface between the semiconductor light-emitting device member and the inorganic particles increases.

If inorganic particles, whose refractive index is larger than that of the semiconductor light-emitting device member and diameter is 3 to 5 nm, more specifically, is equal to or less than the luminous wavelength, are used, the refractive index of the semiconductor device member can be improved while maintaining transparency thereof. Therefore, in such a case, the effect of the above <5> is noticeable.

Therefore, the type of inorganic particles to be mixed may be selected according to the purposes. Only one type of the inorganic particles may be selected or a plurality of types of inorganic particles may be combined. Also, in order to improve the dispersibility thereof, a surface treatment may be applied on the particles with a surface treatment agent such as a silane coupling agent.

[4-2-1] Type of Inorganic Particles

Exemplified types of inorganic particles to be used include: inorganic oxide particles such as silica, barium titanate, titanium oxide, zirconium oxide, niobium oxide, aluminum oxide, cerium oxide and yttrium oxide; and diamond particles. However, other materials can be also selected depending on the purposes and thus the above examples are not limited.

Inorganic particles may be in any form, depending on the purposes, such as powder and slurry. However, if the transparency must be maintained, it is preferable to equalize the refractive indexes of the inorganic particles and the semiconductor device member of the present invention or to add the particles as transparent sol, which is aqueous or of solvent, to the semiconductor-device-member formation liquid.

[4-2-2] Median Particle Diameter of Inorganic Particles

There is no special limitation on the median particle diameter of these inorganic particles (primary particles).Usually, it is about $1/10$ or less that of phosphor particles. More concretely, the following median particle diameter is adopted depending on the use. For example when the inorganic particle is used as light scattering agent, the median particle diameter thereof falls within preferably 0.1 μm to 10 μm. For example when the inorganic particle is used as aggregate, the median particle diameter thereof falls within preferably 1 nm to 10 μm. For example when the inorganic particle is used as thickener (thixotropic agent), the median particle diameter thereof falls within preferably 10 nm to 100 nm. For example when the inorganic particle is used as refractive index adjusting agent, the median particle diameter thereof falls within preferably 1 nm to 10 nm.

[4-2-3] Mixing Method of Inorganic Particle

There is no special limitation on the method of mixing inorganic particles in the present invention. Usually, it is recommended that mixing is performed with a planetary mixer, similarly to phosphor, while defoaming is done. When small particles which are liable to aggregate like aerosil are mixed, aggregated particles are crushed after mixing, as needed, using a beads mill or three axis roll mill, and then large particles which are easy to mix, such as phosphor, can be mixed.

[4-2-4] Content of Inorganic Particle

The content of the inorganic particle in the semiconductor device member of the present invention can be selected arbitrary insofar as the advantage of the present invention is not significantly impaired. Actually, it can be selected freely depending on its form of applications. For example when the inorganic particle is used as light scattering agent, the content thereof falls within preferably 0.01 to 10 weight %. As another example, when the inorganic particle is used as aggregate, the content thereof falls within preferably 1 to 50 weight %. As still another example, when the inorganic particle is used as thickener (thixotropic agent), the content thereof falls within preferably 0.1 to 20 weight %. As still another example, when the inorganic particle is used as refractive index adjusting agent, the content thereof falls within preferably 10 to 80 weight %. When the amount of inorganic particle is too small, the desired advantageous effects may be unobtainable. When the amount is too large, various characteristics such as adhesion to the cured product, transparency and hardness may be affected adversely.

The semiconductor-device-member formation liquid of the present invention has such advantages as low viscosity, high misciblility with phosphors or inorganic particles and good coating properties that can be maintained even when high concentration of phosphors or inorganic particles are dispersed therein, in comparison with the conventional liquid for forming the semiconductor light-emitting device member such as epoxy resin and silicone resin. Moreover, it can be of high viscosity as needed by such a method of adjusting the degree of polymerization and adding thixotropic agent like aerosil. Namely, it is very flexible in adjustment of viscosity according to the intended content of inorganic particles. Therefore, it can provide a coating liquid that can correspond very flexibly to not only the kinds or shapes of coating objects but also the various coating methods such as potting, spin coating and printing.

The content of the inorganic particles in the semiconductor device member can be measured by the same method as that of the above-described content of phosphor.

The inorganic particle content in the semiconductor-device-member formation liquid member can be set so that the inorganic particle content in the semiconductor device member falls within the above range. Namely, when the weight of the semiconductor-device-member formation liquid is not changed in the drying process, the inorganic particle content in the semiconductor-device-member formation liquid will be equal to the inorganic particle content in the semiconductor device member. On the other hand, when the weight of the semiconductor-device-member formation liquid is changed in the drying process, for example because the semiconductor-device-member formation liquid contains a solvent or the like, the inorganic particle content in the semiconductor-device-member formation liquid other than the solvent or the like can be considered the same as the inorganic particle content in the semiconductor device member.

[4-3] Combined Use of Conductive Filler

Conductive filler may be also contained, for example when the semiconductor device member of the present invention is used for a semiconductor light-emitting device, for the purpose of adding conductivity and forming an electric circuit at a lower temperature than the soldering temperature by means of printing, potting or the like.

Examples of conductive filler to be used include precious metal powder such as silver powder, gold powder, platinum powder and palladium powder, base metal powder such as copper powder, nickel powder, aluminum powder, brass powder and stainless steel powder, precious or base metal powder plated and alloyed with precious metal such as silver, organic resin powder or silica powder coated with precious metal or base metal, and carbon series filler such as carbon black or graphite. However, other materials can also be selected depending on the purposes and thus the above examples are not limited. Conductive filler may be used either as a single kind of them or as a mixture of two or more kinds in any combination and in any ratio Conductive filler may be supplied in any form such as powder or slurry, depending on the purpose. When transparency needs to be maintained or print formation with fine wiring is necessary, it is preferably added to the semiconductor-device-member formation liquid as transparent sol which is aqueous or of solvent with no aggregation or as nano particle powder with its surface modified to allow easy redispersion.

Examples of the form of these metal powders includes flake (scale), sphere, grain, dendrite, and three-dimensional aggregation of primary particles of sphere. Of these, the use of silver powder as main component is preferable from the standpoint of conductivity, cost and reliability. In terms of conductivity, combined use of silver powder and a small amount of carbon black and/or graphite is more preferable. Further, from the standpoint of conductivity and reliability, the use of silver powder in the form of flake or sphere is preferable, and the combined use of flake and sphere silver powder is most preferable. Further, inorganic filler such as silica, talc, mica, barium sulfate or indium oxide can be added in a small amount, if considered appropriate.

Preferable proportion (weight ratio) of silver powder and carbon black and/or graphite micropowder is as follows. On the supposition that the total amount of silver powder and carbon black and/or graphite micropowder is 100 weight ratio, the upper limit of silver powder is preferably 99.5 weight ratio or less, more preferably 99 weight ratio or less, and the lower limit is 85 weight ratio or more, preferably 90 weight ratio or more.

There is no special limitation on the median particle diameter of the conductive filler. Usually, it is 0.1 μm or larger, preferably 0.5 μm or larger, more preferably 1 μm or larger, and usually 50 μm or smaller, preferably 20 μm or smaller, more preferably 10 μm or smaller. Particularly when transparency or micro manipulation is required, it is usually 3 nm or larger, preferably 10 nm or larger, and usually 150 nm or smaller, preferably 100 nm or smaller.

The content of conductive filler is usually 50 weight % or more, preferably 75 weight % or more, and more preferably 80 weight % or more, assuming that the combined amount of the conductive filler and the binder resin is 100 weight %. From the standpoint of adhesiveness and ink viscosity, it is usually 95 weight % or less, preferably 93 weight % or less, and more preferably 90 weight % or less. When the amount of conductive filler is too small, the desired advantageous effects may be unobtainable. When the amount is too large, various characteristics such as adhesion to the cured product, transparency and hardness may be affected adversely.

The semiconductor-device-member formation liquid of the present invention has such advantages as low viscosity, high miscibility with phosphors or inorganic particles and good coating properties that can be maintained even when high concentration of phosphors or inorganic particles are dispersed therein, in comparison with the conventional liquid for forming the semiconductor light-emitting device member such as epoxy resin and silicone resin. Moreover, it can be of high viscosity as needed by such a method of adjusting the degree of polymerization and adding thixotropic agent like aerosil. Namely, it is very flexible in adjustment of viscosity according to the intended content of inorganic particles. Therefore, it can provide a coating liquid that can correspond very flexibly to not only the kinds or shapes of coating objects but also the various coating methods such as potting, spin coating and printing.

The content of the inorganic particles in the semiconductor light-emitting device member can be measured by the same method as that of the above-described content of phosphor.

[4-4] Combined Use with Other Members

The semiconductor device member of the present invention may be used as a sealant singly. However, it may also be used together with another member for more complete cutoff of oxygen or moisture for example when it seals an organic phosphor, a phosphor that is liable to deteriorate by oxygen or moisture, a semiconductor light-emitting device or the like. In such a case, an air-tight sealing, using such a highly air-tight sealant as glass plate or epoxy resin, or vacuum sealing may be added from outside of the member of the present invention, which is provided for retention of the phosphor, sealing the semiconductor element or extracting light. In this case, the shape of the device is not specially limited. Namely, it is enough for the sealant, coating or coated layer, made of the semiconductor device member of the present invention, to be substantially protected and blocked from outside by an air-tight material such as metal, glass or highly air-tight resin, so as to allow no passage of oxygen and moisture.

In addition, the semiconductor device member of the present invention may be used as adhesive agent for a semiconductor device because it excels in adhesion as described above. More specifically, for example, the semiconductor device member of the present invention can be used for bonding a semiconductor element and a package, a semiconductor element and a sub mount, package constituents together, a semiconductor device and an external optical element, by means of application, printing or potting. Since the semiconductor device member of the present invention excels particularly in light resistance and heat resistance, it provides a semiconductor light-emitting device with high reliability enough to stand a long-time use, when it is used as adhesive agent for a high-power semiconductor light-emitting device that is exposed to high temperature or ultraviolet rays for a long time.

The semiconductor device member of the present invention can achieve sufficient adhesion just by itself. However, for more sufficient adhesion, various surface treatments for improving adhesion may be performed on the surface that will be directly in contact with the semiconductor device member. Examples of such surface treatment include: a formation of an adhesion-improving layer using a primer or a silane coupling agent, a chemical surface treatment using such an agent as acids or bases, a physical surface treatment using plasma irradiation, ion irradiation or electron beam irradiation, a surface-roughening procedure by sandblasting, etching or microparticles coating. Other examples of the surface treatment for improving adhesion include known surface treatment methods such as described in Japanese Patent Laid-Open Publication (Kokai) No. Hei 5-25300, "Hyomen Kagaku", Vol. 18 No. 9, pp 21-26, written by Norihiro Inagaki, and "Hyomen Kagaku", Vol. 19 No. 2, pp 44-51 (1998), written by Kazuo Kurosaki.

[5] Semiconductor Light-emitting Device

[5-1](A) Package

The package used in the semiconductor light-emitting device of the present invention is characterized in that the surface material thereof contains one or more of Si, Al and Ag. In this context, the "package" means a member in the semiconductor light-emitting device, on which the (B) semiconductor element, to be described later, is mounted. Shapes of the package include: a cup shape, a flat plate with a recess formed therein, a flat plate with a weir formed therearound, and a flat plate. A cup-shaped one is usually used.

[5-1-1] Surface Material

The surface material of the package used in the semiconductor light-emitting device of the present invention is characterized in that it contains one or more of Si, Al and Ag.

The package is a member on which the (B) semiconductor element is mounted, as described above. Various surface treatments are provided thereon for the purpose of improving brightness (reflectance), durability/heat resistance, light resistance, adhesion, heat dissipating property and the like. Particularly in a power device, it is often subjected to a surface treatment and the material thereof is often selected for the purpose of improving durability and heat resistance.

The concrete examples include: a surface treatment such as silver plating for improving the reflectance, and thus the brightness, or the like; a selection of a ceramic package based on $SiN_x$, $SiC$, $SiO_2$, Al, AlN, $Al_2O_3$ or the like for improving heat dissipating property, insulation property, heat resistance, durability, light resistance and the like; and a treatment of the ceramic surface such as surface smoothing or roughening by means of forming an inorganic coating layer for improving the reflectance or adding the light diffusivity.

Even when utilizing a package with such specific surface treatments, the semiconductor light-emitting device of the present invention exhibits excellent characteristics without such a problem of peeling of its sealant.

The content of Si and Al contained in the surface material of the package used in the semiconductor light-emitting device of the present invention is, in the surface material, usually 5 weight % or more, preferably 10 weight % or more, and more preferably 40 weight % or more, and usually 100 weight % or less, preferably 90 weight % or less, and more preferably 80 weight % or less. The above-mentioned content indicates the total content of Si and Al, in a surface where $SiO_2$ and $Al_2O_3$ are solid-solved and mixed, such as a surface of an $Al_2O_3$ ceramic sintered compact using $SiO_2$ as sintering agent. On the other hand, in a surface of a material comprising two layers, such as a reinforced plastic containing an inorganic filler like a glass fiber, it indicates the Si content in the reinforced plastic. Ag exists frequently at a high purity as a plated metal in the semiconductor light-emitting device. The Ag content in an Ag-containing surface is usually 60 weight % or more, preferably 70 weight % or more, more preferably 80 weight % or more, and usually 100 weight % or less, preferably 98 weight % or less, more preferably 95 weight % or less. When the above-mentioned content is too small, there is a possibility of failing in achieving various advantageous effects of the surface treatment or the like. When it is too large, it is possible that the manipulation is obstructed or the ceramic composition deviates from the intended one.

[5-1-2] Other Materials

The aforementioned surface material constitutes the whole of or a part of the material of the package used in the semiconductor light-emitting device of the present invention. The other material than the surface material contained partially in the package can be selected arbitrarily according the purpose. It can be usually selected to be used from organic materials, inorganic materials, glass materials and combinations of them, as appropriate.

The organic materials include: organic resins such as polycarbonate resin, polyphenylene sulfide resin, epoxy resin, acrylic resin, silicone resin, ABS (acrylonitrile-butadiene-styrene) resin, nylon resin, polyphthalamide resin and polyethylene resin; and reinforced plastics such as those in which such organic resins and a glass filler or an inorganic powder are mixed for improvement in heat resistance or mechanical strength and decrease in thermal expansion coefficient.

The inorganic materials include: ceramics materials such as $SiN_x$, SiC, $SiO_2$, AlN and $Al_2O_3$; metal materials such as iron, copper, brass, aluminium, nickel, gold, silver, platinum and palladium; and their alloys.

The glass materials include: low-melting glasses used for a hermetic seal part or an adhesion between members; and optical glasses used as a part of the package such as a window or a transparent lid of the package.

When the semiconductor light-emitting device of the present invention is used in a so-called power device, which is high in amount of heat generation and luminescence, materials having higher durabilities than semiconductor light-emitting devices of the conventional constitutions can be selected. In such a power device, inorganic materials, which are superior in durabilities such as heat resistance and light resistance, are more preferable than organic materials, which are prone to deterioration such as discoloration. In particular, materials superior in workability and heat dissipating property, such as copper, aluminium, $SiN_x$, AlN, $Al_2O_3$, are preferable. In addition, various surface treatments such as silver plating may be provided onto these package materials for the purpose of improving the reflectance, and thus the brightness, as described before.

[5-1-3] Shape

There is no special limitation on the shape of the package used for the semiconductor light-emitting device of the present invention. Packages for known semiconductor light-emitting devices or packages for semiconductor light-emitting devices, which are improved as appropriate according to various purposes, can be used. Concrete examples of the shape include: a ceramic package in which the reflector is integrated with the substrate; one in which a heat sink made of copper, aluminium or the like is provided immediately below the luminous element; and one of which reflector has a reflection plane coated with silver. Shapes of the package include: a cup shape, a flat plate with a recess formed therein, a flat plate with a weir formed therearound, and a flat plate. A cup-shaped one is usually used.

As package used for the semiconductor light-emitting device of the present invention, ones commercially available can be used. The concrete examples include: a model number of "3PINMETAL" (whose reflector material is a silver-plated copper and hermetic seal around the pin is made of a low-melting glass) manufactured by MCO Co., ltd.; and a model number of "M5050N" (whose reflector material and substrate material is $Al_2O_3$, electrode material is Ag—Pt, and adhesion portion between the reflector and the substrate is made of a low-melting glass) manufactured by Kyoritsu Elex Co., Ltd.

[5-2] (B) Semiconductor Element

[5-2-1] Semiconductor Element

As semiconductor element used in the semiconductor light-emitting device of the present invention, a light-emitting diode (LED), semiconductor laser diode (LD) or the like can be used concretely.

The concrete examples thereof include: GaN-based compound semiconductor, ZnSe-based compound semiconductor and ZnO-based compound semiconductor. Among them, a GaN-based LED or LD, which utilizes a GaN-based compound semiconductor, is preferable. This is because a GaN-based LED and GaN-based LD have light output and external quantum efficiency far greater than those of an SiC-based LED and the like that emit the same range of light, and therefore, they can give very bright luminescence with very low electric power when used in combination with the phosphor described above. For example, a GaN-based LED and GaN-based LD have usually 100 or more times higher emission intensity than SiC-based ones, with respect to the same current load. Among GaN-based LEDs and LDs, ones having $Al_xGa_yN$ luminous layers, GaN luminous layers or $In_xGa_yN$ luminous layers are preferable. Among GaN LEDs in particular, the one having $In_xGa_yN$ luminous layer is particularly preferable because emission intensity thereof is then very high. Among GaN LDs, the one having a multiple quantum well structure of $In_xGa_yN$ layer and GaN layer is particularly preferable because emission intensity thereof is then very high.

In the above description, the X+Y usually takes a value in the range of 0.8 to 1.2. A GaN-based LED having the above-mentioned kind of luminous layer that is doped with Zn or Si or without any dopant is preferable for the purpose of adjusting the luminescent characteristics.

A GaN-based LED contains, as its basic components, a such kind of luminous layer, a p layer, an n layer, an electrode and a substrate. Among them, a GaN-based LED having such a heterostructure as sandwiching the luminous layer with n type and p type of $Al_xGa_yN$ layers, GaN layers, $In_xGa_{yN}$ layers or the likes is preferable, from the standpoint of high emission efficiency. Moreover, the one whose heterostructure is replaced by a quantum well structure is more preferable because it can have higher emission efficiency.

Methods of crystal layer growth by which a GaN-based semiconductor element is formed include: HVPE method, MOVPE method and MBE method. HVPE method is preferable when preparing a thick film. MOVPE method or MBE method is preferable when preparing a thin film.

In the semiconductor light-emitting device of the present invention, it is particularly preferable to use a surface-emitting type luminous body, particularly surface-emitting type GaN-based laser diode, as the light emitting device, because the emission efficiency of the whole light emitting device can be enhanced then. A surface-emitting type luminous body means a luminous body having high luminescence in the direction of the film surface. In a surface-emitting type GaN-based laser diode, the luminescence not in the direction of the edge of the luminous layer but in the direction of the surface thereof can be intensified, by means of controlling the crystal growth of the luminous layer or the like and, at the same time, adjusting the reflective layer or the like sufficiently. Using a surface-emitting type makes it possible for the emission cross section per unit amount of light to be larger, in comparison with a type in which light emits from the edge of the luminous layer.

[5-2-2] Emission-peak Wavelength

The emission-peak wavelength of the semiconductor element used in the semiconductor light-emitting device of the present invention can have any wavelength in the range between visible to near-ultraviolet. The emission-peak wavelength of the semiconductor element is an important factor. It relates to the excitation efficiency of the phosphor and thus the conversion efficiency from the phosphor-exciting light to the phosphor, and also influences the durability of the sealant. In the semiconductor light-emitting device of the present invention, a luminous element having a luminous wavelength in usually near-ultraviolet region to blue region is used. More specifically, a luminous element of which peak luminous wavelength is usually 300 nm or longer, preferably 330 nm or longer, more preferably 350 nm or longer, and usually 900 nm or shorter, preferably 500 nm or shorter, more preferably 480 nm or shorter is used. When it is too short, the sealant absorbs the luminous wavelength, leading to the failure in realizing a device with high brightness, and a thermal degradation of the device arises due to the heat generation, which are unfavorable.

[5-2-3] Size of Emission Surface

The semiconductor light-emitting device of the present invention is especially excellent in the use of a high-power device, namely power device. Therefore, when it is used in a power device, the area of the emission surface of the (B) semiconductor element (chip) is usually 0.15 mm$^2$ or larger, preferably 0.2 mm$^2$ or larger, more preferably 0.3 mm$^2$ or larger, and usually 10 mm$^2$ or smaller, preferably 5 mm$^2$ or smaller, more preferably 3 mm$^2$ or smaller. When the area of the emission surface is too small, it is difficult to be used for a power device.

In this context, the emission surface means the p-n composition surface. When multiple small-sized chips are mounted on one package, the above-mentioned area means the total area of them.

Incidentally, the shape of the chip itself is usually rectangular or square, in view of loss reduction in the wafer cutting.

Accordingly, when the chip is rectangular and the emission surface comprises that of only one chip, the long side of the emission surface is usually 0.43 mm or longer, preferably 0.5 mm or longer, more preferably 0.6 mm or longer, and usually 4 mm or shorter, preferably 3 mm or shorter, more preferably 2 mm or shorter. And, the short side thereof is usually 0.35 mm or longer, preferably 0.4 mm or longer, more preferably 0.5 mm or longer, and usually 2.5 mm or shorter, preferably 2 mm or shorter, more preferably 1.5 mm or shorter.

When the chip is square, each side of the emission surface is usually 0.38 mm or longer, preferably 0.45 mm or longer, more preferably 0.55 mm or longer, and usually 3.1 mm or shorter, preferably 2.2 mm or shorter, more preferably 1.7 mm or shorter.

[5-2-4] Surface Temperature of Emission Surface

The semiconductor light-emitting device of the present invention is especially excellent in the use of a high-power device, namely power device. Therefore, when it is used in a power device, the surface temperature of the emission surface of the (B) semiconductor element (chip) during operation is usually 80° C. or higher, preferably 85° C. or higher, more preferably 90° C. or higher, and usually 200° C. or lower, preferably 180° C. or lower, more preferably 150° C. or lower. When the surface temperature of the emission surface is too low, it is difficult to be used for a power device. Exceedingly high surface temperature of the emission surface may make it difficult to dissipate the heat or pass the current uniformly. When the surface temperature of the emission surface gets too high, it is preferable that the deterioration of the semiconductor and its peripheral members is inhibited by providing a heat sink or a radiation fin in the vicinity of the device.

[5-2-5] Surface Material

The surface material of the semiconductor element used in the semiconductor light-emitting device of the present invention is characterized in that it contains one or more of Si, Al and Ag.

$SiN_x$ and $SiO_2$ are usually unnecessary as a protective layer for the semiconductor element (chip). Chips without these protective layers can be used. However, for GaN, which is a "hard" material in physicochemical terms and needs a large energy for its manipulation, it is preferable to provide a protective layer from the standpoint of proper manipulation. Namely, $SiN_x$ layer, SiC layer and $SiO_2$ layer are protective layers that prevent effects from plasma, chemical agents and oxidizing environments in the process of manipulation. They also serve as protections from static electricity, migration of impure metals and solder sticking, and as light extracting films. However, in any cases, the protective layer is provided in a process before the GaN is cut into individual chips, and therefore, it is inevitable for the product chip to have a lateral side without a protective layer. In other words, the protective layer usually exists in a form covering a part of the chip.

The expression of "chip" in the present invention contains the protective layer. The entire surface may be covered with the protective layer. However, a surface from which an electrode is taken out and lateral sides actually have no protective layers thereon. The thickness of the above-mentioned protective layer is usually sufficiently small in comparison with the thickness of the GaN layer of the chip body or substrate, for the purpose of securing the accuracy of the microfabrication. Namely, the thickness of the above-mentioned protective layer is usually 1000 nm or smaller, preferably 500 nm or smaller, and usually 1 nm or larger, preferably 10 nm or larger. When the film thickness is too small, there is a possibility of insufficient protection effect. When it is too large, there is a possibility of hindering the microfabrication.

Al and Ag are rarely used as a protective layer on an LED chip, because they are opaque. However, Al is used for an (insulating) substrate to be formed with GaN luminous layer of the chip, in the form of sapphire ($Al_2O_3$)

The content of Si, Al and Ag contained in the surface material of the semiconductor element used in the semiconductor light-emitting device of the present invention is usually 40 weight % or more, preferably 50 weight % or more, and more preferably 60 weight % or more, and usually 100 weight % or less, preferably 90 weight % or less, and more preferably 80 weight % or less. In this context, when a thin protective layer formed of SiNx, $SiO_2$ or the like and of which thickness is several hundreds of nanometers exists on the surface of the emission surface of the semiconductor element, the material of this protective layer is taken as the surface composition. When the above-mentioned content is too small, various advantageous effects of the surface treatment or the like will not be exhibited sufficiently. When it is too large, the opaque layer formed will affect the light output adversely or the ceramic composition will deviate from the intended one.

[5-2-6] Surface State and Shape of Chip

The surface state of the chip may be either smooth or rough. However, it is preferable that it does not cause unnecessary diffused reflection in order not to affect the efficiency of extracting light adversely. When it is smooth, it is preferable that the entire shape of the chip is fabricated so that the total reflexion of the light emitted from the emission surface can be prevented. When it is rough, the one formed with a microstructure suitable for extracting light with a pitch preferably equal to the luminous wavelength or shorter, and more preferably equal to a quarter of the luminous wavelength or shorter, is preferable because it can realize a high efficiency of extracting light. A roughened surface, though it is difficult to be fabricated so that a wide protective layer containing Si is provided (remained), has an advantageous effect of improved adhesivity due to the enlarged contact area when the wide protective layer is provided. In addition, in a semiconductor element having an SiC substrate or sapphire substrate, when a flip-chip mounting is formed on the substrate of which surface is roughened, it is preferable that the surface containing Si and Al is in contact with the sealant to be described later as widely as possible, because the adhesion between them is higher then. In both cases of the above-mentioned smooth surface and roughened surface, it is necessary for the semiconductor light-emitting device of the present invention to have a surface layer containing Si, so as to improve the adhesiveness to the sealant of the present invention. And, it is preferable that the ratio of the surface area of the layer containing Si, relative to the total surface area of the chip (exclusive of adherends by means of solder or silver paste), is 5% or larger and 90% or smaller. The shape of the chip itself is usually rectangular or square, in view of loss reduction in the wafer cutting.

[5-2-7] Chip Substrate

The material of the substrate can be selected as appropriate, from SiC, $SiO_2$, sapphire, GaN and AlN, for example, depending on the purpose. Among them, SiC, $SiO_2$ and sapphire, which contains Al, are preferable because they show high adhesion to the sealant used in the semiconductor light-emitting device of the present invention. When using a substrate without containing Si or Al, it is preferable that a coating layer containing Si ($SiN_x$, $SiO_2$) is provided on the side of the emission surface of the chip.

[5-3] (C) Sealant

The (C) sealant used in the semiconductor light-emitting device of the present invention (hereinafter referred to as "the sealant of the present invention" arbitrarily) is characterized in that it satisfies all of the following conditions (i) to (iii). Also, it possibly satisfies another requirement to be described later, if necessary.

(i) The sealant has a functional group capable of forming a hydrogen bond with oxygen in a metalloxane bond or a hydroxyl group, which is present on the surface of a ceramic or a metal.

(ii) The maintenance rate of transmittance with respect to light of 400-nm wavelength before and after kept at temperature of 200° C. for 500 hours is 80% or more and 110% or less.

(iii) The maintenance rate of transmittance with respect to the light of 400-nm wavelength before and after being irradiated with light having wavelength of 370 nm or longer and center wavelength of 380 nm and radiant intensity of 0.6 $kW/m^2$ for 72 hours is 80% or more and 110% or less.

In the following, the requirements (i) to (iii) and another requirement will be described in detail.

[5-3-1] (i) Functional Group

The sealant of the present invention comprises a functional group capable of forming a hydrogen bond with a predetermined functional group (for example, a hydroxyl group or oxygen in a metalloxane bond) that is present on the surface of a ceramic or a metal. As described above, the surface of a (A) package or a (B) semiconductor element is usually formed of or coated with ceramic or metal. Also, a hydroxyl group usually exists on the surface of a ceramic and a metal. On the other hand, the sealant of the present invention usually comprises a functional group capable of forming a hydrogen bond with that hydroxyl group. Therefore, the sealant of the present invention is superior in adhesion to the (A) package or (B) semiconductor element, due to the above-mentioned hydrogen bond.

Functional groups of the sealant of the present invention that can be bound to the hydroxyl group through hydrogen bond include, for example, silanol and alkoxy group. At this point, only one functional group or two or more types thereof may be used.

Whether the sealant of the present invention has any functional group that can be bound to the hydroxyl group through hydrogen bond, as described above, can be checked by a technique of spectroscopy such as solid Si-NMR, solid $^1$H-NMR, infrared absorption spectrum (IR) and Raman spectrum.

[5-3-2] (ii) Heat Resistance

The sealant of the present invention is superior in heat resistance. That is, it has a property that transmittance thereof with respect to the light having a predetermined wavelength hardly varies even when left under a high temperature condition. More specifically, the maintenance rate of transmittance of the sealant of the present invention with respect to the light having a wavelength of 400 nm before and after being kept for 500 hours at temperature of 200° C. is usually 80% or more, preferably 90% or more, and more preferably 95% or more, and usually 110% or less, preferably 105% or less, and more preferably 100% or less.

The above ratio of variation can be measured in the same way as the method of measuring the transmittance, described earlier in [1-4-3], by means of measuring transmittance using an ultraviolet/visible spectrophotometer.

[5-3-3] (iii) UV Resistance

The sealant of the present invention is superior in light resistance. That is, it has a property that transmittance thereof with respect to the light having a predetermined wavelength hardly varies even when irradiated with UV (ultraviolet light). More specifically, the maintenance rate of transmittance with respect to the light of 400-nm wavelength of the sealant of the present invention before and after being irradiated with light having wavelength of 370 nm or longer and center wavelength of 380 nm and radiant intensity of 0.6 $kW/m^2$ for 72 hours is usually 80% or more, preferably 90% or more, and more preferably 95% or more, and usually 110% or less, preferably 105% or less, and more preferably 100% or less.

The above ratio of variation can be measured in the same way as the method of measuring the transmittance, described earlier in [1-4-3], by means of measuring transmittance using an ultraviolet/visible spectrophotometer.

[5-3-4] Other Physicochemical Properties

The sealant of the present invention is mainly characterized by the above-mentioned characteristics. For such a sealant, inorganic materials and/or organic materials can be used.

Examples of the inorganic materials include metal alkoxide, ceramic precursor polymer, a solution obtained by hydrolytic polymerization of a solution containing metal alkoxide by sol-gel method, and inorganic materials obtained by solidifying combinations of such materials (for example, inorganic materials containing siloxane bond).

Examples of the organic materials include thermoplastic resin, thermosetting resin and light curing resin. More specifically, the examples include: methacrylic resin such as polymethacrylate methyl; styrene resin such as polystyrene, styrene-acrylonitrile copolymer; polycarbonate resin; polyester resin; phenoxy resin; butyral resin; polyvinyl alcohol; cellulose resin such as ethyl cellulose, cellulose acetate and cellulose acetate butyrate; epoxy resin; phenol resin; and silicone resin. Of these, a silicon-containing compound can be preferably used from the standpoint of high heat resistance, high light resistance and the like, particularly when a high-power light emitting device such as a lighting system is required, even though epoxy resin has been generally used as phosphor-dispersing material for a semiconductor light-emitting device conventionally.

Silicon-containing compound means a compound of which molecular contains a silicon atom. Examples thereof include organic materials (silicone materials) such as polyorganosiloxane, inorganic materials such as silicon oxide, silicon nitride and silicon oxynitride, and glass materials such as borosilicate, phosphosilicate and alkali silicate. Among them, silicone materials are preferable because the handling is easy or the cured product has stress relaxation characteristics. Silicone resins for semiconductor light-emitting devices were disclosed as follows, for example. In Japanese Patent Laid-Open Publication (Kokai) No. Hei 10-228249, Japanese Patent Publication No. 2927279, and Japanese Patent Laid-Open Publication (Kokai) No. 2001-36147, it is used as a sealant. In Japanese Patent Laid-Open Publication No. 2000-123981, it is used as a wavelength-adjustment coating.

[5-3-4A] Silicone Material

Silicone material usually indicates organic polymers having a siloxane bond as the main chain.

Examples thereof include compounds represented by the general composition formula and/or mixtures of them. $(R^1R^2R^3SiO_{1/2})_M(R^4R^5SiO_{2/2})_D(R^6SiO_{3/2})_T(SiO_{4/2})_Q$ In the above formula, $R^1$ to $R^6$ can be the same as or different from each other, and are selected from the group consisting of organic functional group, hydroxyl group and hydrogen atom. M, D, T and Q are a number of 0 or greater and smaller than 1 respectively, and they satisfies M+D+T+Q=1.

When a silicone material is used for sealing a semiconductor luminous element, a liquid silicone material can be used by being solidified with heat or light after it seals the element.

When categorizing silicone materials based on the curing mechanism, they usually fall into such categories as addition polymerization-curable type, polycondensation-curable type, ultraviolet ray-curable type and peroxide vulcanized type. Of these, preferable are addition polymerization-curable type (addition type silicone resin) and condensation-curable type (condensing type silicone resin) and ultraviolet ray-curable type. In the following, addition type silicone material and condensing type silicone material will be explained.

[5-3-4A-1] Addition Type Silicone Material

Addition type silicone material represents a material in which polyorganosiloxane chain is cross-linked by means of organic additional bond. Typical example includes a compound having an Si—C—C—Si bond as the crosslinking point, which can be obtained through a reaction between vinylsilane and hydrosilane in the presence of an addition type catalyst such as Pt catalyst. As such compounds, commercially available ones can be used. For example, as concrete commercial names of an addition polymerization-curable type can be cited "LPS-1400", "LPS-2410" and "LPS-3400", manufactured by Shin-Etsu Chemical Co., Ltd.

For example, the above-mentioned addition type silicone material can be obtained concretely by mixing an (A) alkenyl group-containing organopolysiloxane represented by the following average composition formula (1a) and a (B) hydrosilyl group-containing organopolysiloxane represented by the following average composition formula (2a) and reacting them in the presence of a (C) addition-reaction catalyst in a catalyst quantity. At that time, the quantitative ratio of the mixed (A) and (B) is such that the total amount of the hydrosilyl group of (B) is 0.5 to 2.0 times more than the total amount of the alkenyl group of (A).

The (A) alkenyl group-containing organopolysiloxane is an organopolysiloxane in which each one molecular thereof, represented by the following composition formula (1a), contains at least two alkenyl groups bound to respectively a silicon atom.

$$R_nSi_{[(4-n)/2]} \quad (1a)$$

(In the formula (1a), R represents an univalent hydrocarbon group, alkoxy group or hydroxyl group which has identical or different substituents or does not have substituents, n is a positive number satisfying $1 \leq n < 2$, where, at least one of R is an alkenyl group.)

The (B) hydrosilyl group-containing polyorganosiloxane is an organo hydrogen polysiloxane in which each one molecular thereof, represented by the following composition formula (2a), contains at least two hydrogen atoms bound to respectively a silicon atom.

$$R'_aH_bSiO_{[(4-a-b)/2]} \quad (2a)$$

(In the formula (2a), R' represents an univalent hydrocarbon group exclusive of alkenyl group, which has identical or different substituents or does not have substituents, a and b are positive numbers satisfying $0.7 \leq a \leq 2.1$, $0.001 \leq b \leq 1.0$ and $0.8 \leq a+b \leq 2.6$.)

In the following, more detailed explanation will be given on the addition type silicone resin.

Regarding the R, of the above-mentioned formula (1a), being an alkenyl group, it is preferably an alkenyl group of which carbon number is 2 to 8, such as vinyl group, allyl group, butenyl group and pentenyl group. Further, when the R is a hydrocarbon group, it is preferably selected from univalent hydrocarbon groups of which carbon numbers are 1 to 20, such as alkyl groups like methyl group and ethyl group, vinyl group, and phenyl group. More preferably, it is methyl group, ethyl group or phenyl group. The Rs may be different from each other. However, when UV resistance is required, it is preferable for 80% or more of the Rs to be methyl groups. The R may be alkoxy group or hydroxyl group of which carbon number is 1 to 8. However, the content of alkoxy group and hydroxyl group is preferably 3% or less in the weight of the (A) alkenyl group-containing organopolysiloxane.

In the above-mentioned composition formula (1a), n is a positive number satisfying $1 \leq n < 2$. When it is 2 or larger, sufficient mechanical strength for a sealant can not be achieved. When it is smaller than 1, it is difficult to synthesize this organopolysiloxane.

The (A) alkenyl group-containing organopolysiloxane may be used as a single kind thereof or two or more kinds in any combination and in any ratio.

Next, the (B) hydrosilyl group-containing polyorganosiloxane functions as a cross-linking agent for curing the composition through a hydrosilylation reaction with the (A) alkenyl group-containing organopolysiloxane.

In the composition formula (2a), R' represents an univalent hydrocarbon group exclusive of alkenyl group. As R', the same groups as those for R in the composition formula (1a) (exclusive of alkenyl group, however) can be cited. When UV resistance is required, it is preferable for at least 80% or more of the R's to be methyl groups.

In the composition formula (2a), a is a positive number of usually 0.7 or larger, preferably 0.8 or larger, and usually 2.1 or smaller, preferably 2 or smaller, and b is a positive number of usually 0.001 or larger, preferably 0.01 or larger, and usually 1.0 or smaller, preferably 1.0 or smaller, where a+b is 0.8 or larger, preferably 1 or larger, and 2.6 or smaller, preferably 2.4 or smaller.

In addition, each one molecular of the (B) hydrosilyl group-containing polyorganosiloxane contains at least two SiH bonds, and preferably three or more SiH bonds.

The molecular structure of the (B) hydrosilyl group-containing polyorganosiloxane may be either straight, cyclic, branched or of three-dimensional network. Its number of silicon atoms (or degree of polymerization) per one molecular should be of the order of 3 to 1000, particularly 3 to 300.

The (B) hydrosilyl group-containing polyorganosiloxane may be used as a single kind thereof or two or more kinds in any combination and in any ratio.

The proportion of the above-mentioned (B) hydrosilyl group-containing polyorganosiloxane depends on the total amount of the alkenyl groups of the (A) alkenyl group-containing organopolysiloxane. More specifically, the total molar amount of the SiH of the (B) hydrosilyl group-containing polyorganosiloxane can be usually 0.5 times or more, preferably 0.8 times or more, and usually 2.0 times or less, preferably 1.5 times or less than the total molar amount of the alkenyl groups of the (A) alkenyl group-containing organopolysiloxane.

The (C) addition-reaction catalyst is a catalyst to accelerate the hydrosilylation addition reaction of the SiH groups in the (B) hydrosilyl group-containing polyorganosiloxane and the alkenyl groups in the (A) alkenyl group-containing organopolysiloxane. This (C) addition-reaction catalyst includes, for example: platinum-containing catalysts such as platinum black, platinum bichloride, chloroplatinic acid, reactants of chloroplatinic acid and univalent alcohol, complexes of chloroplatinic acid and olefins, and platinum bisacetoacetate; and platinum-group metallic catalysts such as palladium catalyst and rhodium catalyst.

The (C) addition-reaction catalyst may be used either as a single kind thereof or as a mixture of two or more kinds in any combination and in any ratio.

The proportion of the addition-reaction catalyst used may be catalyst quantity. When it is a metal of platinum group, it is preferable for it to be added at usually 1 ppm or higher, particularly 2 ppm or higher, and 500 ppm or lower, particularly 100 ppm or lower, in the total weight of the (A) alkenyl group-containing organopolysiloxane and (B) hydrosilyl group-containing polyorganosiloxane.

To the composition for forming the addition type silicone material, an addition-reaction inhibitor for enhancing the hardenability and the pot life may be added as an optional component, in addition to the above-mentioned (A) alkenyl group-containing organopolysiloxane, (B) hydrosilyl group-containing polyorganosiloxane and (C) addition-reaction catalyst, insofar as the advantageous effect of the present invention is not impaired. Also, for adjusting the hardness and the viscosity, a straight-chain diorganopolysiloxane having an alkenyl group, a straight-chain unreactive organopolysiloxane, or a straight-chain or cyclic low-molecular-weight organopolysiloxane of which silicon atom number is around 2 to 10 may be added, for example, insofar as the advantageous effect of the present invention is not impaired.

No particular limitation is imposed on the curing condition of the above-mentioned composition. However, it is preferable to be at a temperature of 120° C. to 180° C. and for a period of 30 minutes to 180 minutes. When the obtained cured product is soft and gelatinous even after the curing, the linear expansion coefficient thereof is larger than that of a silicone resin in a rubber or rigid plastic state. The generation of internal stress can be inhibited then, by means of curing for 10 to 30 hours at a low temperature close to the room temperature.

As the addition type silicone material, any known ones can be used. Furthermore, it can be introduced with an additive or organic group for improving the adhesion to metals or ceramics. Silicone materials disclosed in Japanese Patent Publications No. 3909826 and No. 3910080 and Japanese Patent Laid-Open Publications (Kokai) No. 2003-128922, No. 2004-221308 and No. 2004-186168 are preferable, for example.

[5-3-4A-2] Condensing Type Silicone Material

Examples of a condensing type silicone material include a compound having an Si—O—Si bond as the crosslinking point, which can be obtained through hydrolysis and polycondensation of alkyl alkoxysilane.

Concrete examples include polycondensates obtained by performing hydrolysis and polycondensation of the compounds represented by the following general formulas (1b) and/or (2b), and/or oligomers thereof.

$$M^{m+}X_nY^1_{m-1} \qquad (1b)$$

(In the formula (1b), M represents at least one element selected from silicon, aluminum, zirconium and titanium, X represents a hydrolyzable group, $Y^1$ represents a univalent organic group, m represents an integer of 1 or larger representing the valence of M, and n represents an integer of 1 or larger representing the number of X groups, where m≧n.)

$$(M^{s+}X_tY^1_{s-t-1})_uY^2 \qquad (2b)$$

(In the formula (2b), M represents at least one element selected from silicon, aluminum, zirconium and titanium, X represents a hydrolyzable group, $Y^1$ represents a univalent organic group, $Y^2$ represents a u-valent organic group, s represents an integer of 1 or larger representing the valence of M, t represents an integer of 1 or larger and s−1 or smaller, and u represents an integer of 2 or larger.)

As the curing catalyst, a metal chelate compound or the like can be used preferably, for example. The metal chelate compound preferably contains at least one of Ti, Ta, Zr, Hf, Zn and Sn. It more preferably contains Zr.

As the condensing type silicone material, any known ones can be used. For example, semiconductor light-emitting device members disclosed in Japanese Patent Laid-Open Publications (Kokai) No. 2006-77234, No. 2006-291018, No. 2006-316264, No. 2006-336010, No. 2006-348284, and the pamphlet of International Publication No. 2006/090804 are preferably used.

Among them, it is preferable that the semiconductor device member of the present invention is used as the sealant for the semiconductor light-emitting device of the present invention. This is because the semiconductor device member of the present invention described above usually has, in addition to the characteristics that the (C) sealant should have, excellent characteristics described earlier.

In the following, explanation will be given with reference to embodiments of the semiconductor light-emitting device. In each embodiment below, semiconductor light-emitting device is abbreviated as "light-emitting device" when appropriate. The sealant used in the semiconductor light-emitting device will be referred to as the "semiconductor light-emitting device member", and it is assumed that, as the sealant, the semiconductor device member of the present invention is used. In addition, in which part of the semiconductor light-emitting device to use the semiconductor light-emitting device member of the present invention will be summarized after all the embodiments have been described. However, these embodiments are used only for convenience of description, and therefore, the examples of the light-emitting devices (semiconductor light-emitting devices) of the present invention are not limited to these embodiments.

[5-4] Basic Concept

Application examples A) and B) of the semiconductor light-emitting devices using the semiconductor light-emitting device member of the present invention are shown below. In both application examples, the semiconductor light-emitting device member of the present invention shows superiority in light resistance and heat resistance, less frequent crack generations and peelings, as well as less degradation in brightness, compared to conventional semiconductor light-emitting device members. Therefore, a member exhibiting high reliability over a long period of time can be provided, by the semiconductor light-emitting device member of the present invention.

A) Semiconductor light-emitting devices utilizing the luminescent color of the luminous element just as it is B) Semiconductor light-emitting devices that emit light of desired wavelengths utilizing fluorescence, by means of disposing a phosphor part near the luminous element so as to make the phosphor or phosphor components in the phosphor part be excited by the light from the luminous element The semiconductor light-emitting device member of the present invention of application example A) can be used even singly as a highly durable sealant, light extracting film, and various functional-components retaining agents, by utilizing its high durability, transparency, and sealing properties. Particularly when the semiconductor light-emitting device member of the present invention is used as functional-component retaining agent for retaining the above-mentioned inorganic particles or the like so as to, for example, enhance the refractive index of the semiconductor light-emitting device member of the present invention while maintaining transparency, the reflection on the light exiting surface of the luminous element can be reduced, which then leads to the enhancement in efficiency of extracting light, by using the semiconductor light-emitting device member of the present invention that is in close contact with the light exiting surface of the luminous element and making the member have a refractive index approximately equal to that of the luminous element.

Also, the semiconductor light-emitting device member of the present invention of application example B) can demonstrate superior capabilities similar to those in the above-mentioned application example A). In addition, it makes possible to form a phosphor part that is highly durable and can extract light with high efficiency, by retaining a phosphor or phosphor components. Further, when the semiconductor light-emitting device member of the present invention retains a component for enhancing refractive index while maintaining transparency in addition to the phosphor or phosphor components, the interface reflection can be reduced, which then leads to the enhancement in efficiency of extracting light, by adjusting the refractive index of the semiconductor light-emitting device member of the present invention to be approximately equal to that of the luminous element or the phosphor.

Figure 50A:
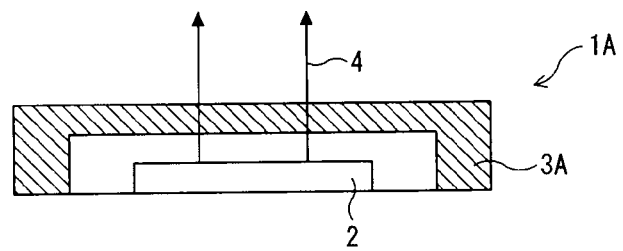
FIG. 50(*a*) and FIG. 50(*b*) are respectively explanatory drawings of basic concepts of each Embodiment.
Figure 50B:
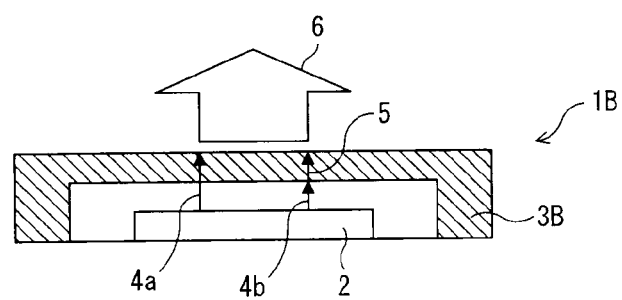
Figure 51:
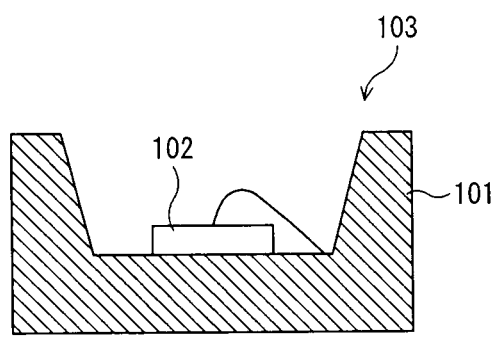
FIG. 51 is a sectional view showing schematically a semiconductor light-emitting device for explaining continuous lighting tests, carried out in Examples and Comparative Examples of the present invention.

A basic concept of each embodiment to which the semiconductor light-emitting device member of the present invention is applied will be described below with reference to FIG. 50(a) and FIG. 50(b). FIG. 50(a) and FIG. 50(b) are explanatory drawings of the basic concept of each embodiment. FIG. 50(a) corresponds to the above application example A) and FIG. 50(b) corresponds to the above application example B).

As shown in FIG. 50(a) and FIG. 50(b), the light emitting device (semiconductor light-emitting device) 1A, 1B of each embodiment comprises a luminous element 2 comprised of an LED chip and a semiconductor light-emitting device member 3A, 3B of the present invention, disposed close to the luminous element 2.

However, in embodiments (Embodiments A-1 and A-2) corresponding to the above application example A), as shown in FIG. 50(a), light emitting device 1A does not contain any phosphor or phosphor component in semiconductor light-emitting device member 3A. In this case, semiconductor light-emitting device member 3A performs various functions such as sealing of luminous element 2, extracting light and retaining functional components. In the description below, semiconductor light-emitting device member 3A containing no phosphor or phosphor component will be called a "transparent member" when appropriate.

On the other hand, in embodiments (Embodiments B-1 to B-41) corresponding to the above application example B), as shown in FIG. 50(b), the light emitting device 1B contain a phosphor or phosphor component in semiconductor light-emitting device member 3B. In this case, semiconductor light-emitting device member 3B can perform a function of wavelength conversion, in addition to the functions that can be performed by semiconductor light-emitting device member 3A in FIG. 50(a). In the description below, semiconductor light-emitting device member 3B containing a phosphor or phosphor component will be called a "phosphor part" when appropriate. The phosphor part may be shown by numerals 33 and 34 according to its shape or functions when appropriate.

Luminous element 2 is comprised of an LED chip emitting blue light or ultraviolet light, but it may be an LED chip of other luminescent color.

Transparent member 3A performs various functions of such as a highly durable sealant for luminous element 2, light extracting film and various-functions adding film. Transparent member 3A may be used alone. Or otherwise, it can contain any additives, excluding the phosphor and phosphor components, as long as the advantage of the present invention is not significantly impaired.

Phosphor part 3B, on the other hand, can perform not only functions of such as a highly durable sealant for luminous element 2, light extracting film and various-functions adding film, but also a function of wavelength conversion, that is, a function to emit light of the desired wavelength after the excitation by the light from luminous element 2. Phosphor part 3B has to contain at least a phosphor material that emits light of the desired wavelength after being excited by the light from luminous element 2. Examples of such a phosphor material include various phosphors exemplified above. Luminescent colors of the light that can be emitted by phosphor part 3B include white of a fluorescent lamp and yellow of a light bulb, as well as three primary colors red (R), green (G) and blue (B). In summary, phosphor part 3B has a wavelength conversion function for emitting light of the desired wavelength that is different from that of the excitation light.

In the above light emitting device 1A shown in FIG. 50(a), light 4 emitted from luminous element 2 passes through transparent member 3A before being emitted out of light emitting device 1A. Therefore, in light emitting device 1A, light 4 emitted from luminous element 2 will be used unchanged in luminescent color of the light emitted from luminous element 2.

In light emitting device 1B shown in FIG. 50(b), on the other hand, light 4a, a portion of the light emitted from luminous element 2, passes through phosphor part 3B unchanged before being emitted out of light emitting device 1B. Also in light emitting device 1B, light 4b, another portion of the light emitted from luminous element 2, is absorbed by phosphor part 3B, resulting in that phosphor part 3B is excited and light 5 having wavelengths specific to phosphor components contained in phosphor part 3B, such as phosphor particles, fluorescent ions and fluorescent dyes, is emitted out of light emitting device 1B.

Therefore, a synthesized light 6 synthesized from light 4a, which has passed through phosphor part 3B after being emitted from luminous element 2, and light 5, which is emitted from phosphor part 3B, will be radiated from light emitting device 1B as a light with converted wavelength. The luminescent color of the whole light emitted from light emitting device 1B will be determined by the luminescent color of luminous element 2 and that of phosphor part 3B. In this context, light 4a, which passes through phosphor part 3B after being emitted from luminous element 2, is not always necessary.

[A. Embodiments that Do Not Use Fluorescence]
[5-5] Embodiments
[Embodiment A-1]

In light emitting device 1A of the present embodiment, as shown in FIG. 1, luminous element 2 is surface-mounted on an insulating substrate 16 on which printed wiring 17 is carried out. In luminous element 2, a p-type semiconductor layer (not shown) and an n-type semiconductor layer (not shown) in a luminous layer part 21 are connected electrically to printed wirings 17 and 17 via conductive wires 15 and 15 respectively. Conductive wires 15 and 15 have a small cross section so that the light emitted from luminous element 2 may not be blocked.

As luminous element 2, one that emits light of any wavelengths, from ultraviolet to infrared regions, may be used. In this embodiment, a gallium nitride LED chip is assumed to be used. In luminous element 2, an n-type semiconductor layer (not shown) is formed on the lower side in FIG. 1 and a p-type semiconductor layer (not shown) is formed on the upper side in the same. The upper side of FIG. 1 is assumed to be the front side in the following description because light output is extracted from the side of the p-type semiconductor layer.

A frame-shaped frame 18 encircling luminous element 2 is fixed onto insulating substrate 16. A sealing part 19 for sealing and protecting luminous element 2 is provided inside frame 18. This sealing part 19 is formed of transparent member 3A, which is the semiconductor light-emitting device member of the present invention, and the formation thereof can be performed by potting with the above liquid for forming the semiconductor light-emitting device member.

Thus, because light emitting device 1A of the present embodiment is provided with luminous element 2 and transparent member 3A, the light resistance and heat resistance of light emitting device 1A can be improved. Moreover, since crack generations and peelings are less likely to occur in sealing part 3A, the transparency in sealing part 3A can be increased.

Further, the light color unevenness and light color fluctuations can be reduced and also the efficiency of extracting light to the outside can be enhanced, in comparison with conventional light emitting devices. This is because sealing part 3A can be made to be transparent without clouding and turbidity. For that reason, light emitting device 1A is superior in homogeneity of light color with almost no light color fluctuations among light emitting devices 1A, and also can enhance the efficiency of extracting light from luminous element 2 to the outside when compared with conventional light emitting devices. Also, the weather resistance of the luminescent material can be enhanced and thus the lifetime of light emitting device 1A can be prolonged in comparison with conventional devices.

[Embodiment A-2]

Figure 2:
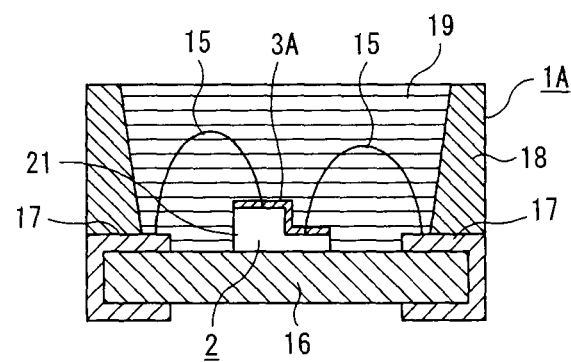
FIG. 2 is a schematic sectional view showing Embodiment A-2.

Light emitting device 1A of the present embodiment is structured, as shown in FIG. 2, in the same manner as the above embodiment A-1, except that the front side of luminous element 2 is covered with transparent member 3A and sealing part 19, formed on member 3A. Sealing part 19 is formed of a material different from that of transparent member 3A. Transparent member 3A on the surface of luminous element 2 is a transparent thin film, functioning as a light extracting film and sealing film. Transparent member 3A can be formed, for example, by coating the above liquid for forming the semiconductor light-emitting device member, by a method of spin coating or the like, during the formation process of a chip of luminous element 2. Meanwhile, the same components as in embodiment A-1 are designated by the same reference numerals to omit redundant explanations.

Thus, because light emitting device 1A of the present embodiment is also provided with luminous element 2 and transparent member 3A, like embodiment A-1, the light resistance and heat resistance of light emitting device 1A can be improved. Moreover, since crack generations and peelings are also less likely to occur in sealing part 3A, the transparency in sealing part 3A can be increased.

Further, other advantages, like those of embodiment A-1, can be also obtained.

[B. Embodiments Using Fluorescence]
[Embodiment B-1]

Figure 3A:
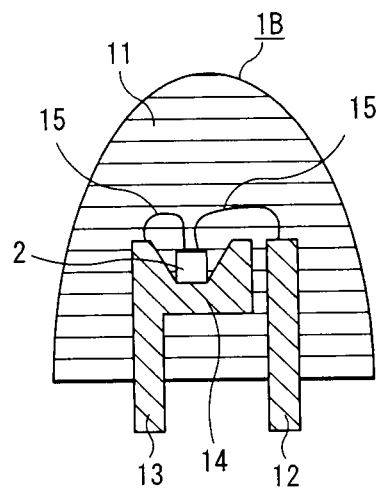
FIG. 3(a) is a schematic sectional view and FIG. 3(b) is an enlarged view of a substantial part of FIG. 3(a)

Light emitting device 1B of the present embodiment is provided, as shown in FIG. 3(a), with luminous element 2 comprised of an LED chip and a mold part 11 obtained by forming a light-transmissible and transparent material into a shell type shape. Mold part 11 covers luminous element 2. Luminous element 2 is electrically connected to lead terminals 12 and 13, formed of a conductive material. Lead terminals 12 and 13 are formed of a lead frame.

Figure 3B:
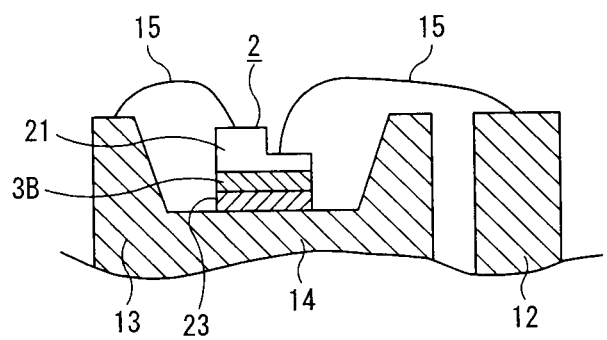

Luminous element 2 is comprised of a gallium nitride LED chip. In luminous element 2, an n-type semiconductor layer (not shown) is formed on the lower side in FIG. 3(a) and a p-type semiconductor layer (not shown) is formed on the upper side in the same. The upper sides of FIG. 3(a) and FIG. 3(b) are assumed to be the front sides in the following description because light output is extracted from the side of the p-type semiconductor layer. The rear surface of luminous element 2 is joined to a mirror (cup part) 14, which is attached to the front end portion of lead terminal 13 by die bonding. Luminous element 2, in which the above p-type semiconductor layer and n-type semiconductor layer are connected to conductive wires (for example, gold wires) 15 and 15 by bonding respectively, is electrically connected to lead terminals 12 and 13 via conductive wires 15 and 15. Conductive wires 15 and 15 have a small cross section so that the light emitted from luminous element 2 may not be blocked.

Mirror 14 has a function to reflect light emitted from both lateral sides and the rear surface of luminous element 2 forward. The light emitted from the LED chip and that reflected by mirror 14 in the front direction are emitted forward via the front end portion of mold part 11, which functions as a lens. Mold part 11 covers luminous element 2 along with mirror 14, conductive wires 15 and 15, and a part of lead terminals 12 and 13, so that the degradation of various characteristics of luminous element 2, due to a reaction with moisture in the air or the like, is prevented. The rear ends of lead terminals 12 and 13 project from the rear surface of mold part 11.

In luminous element 2, as shown in FIG. 3(b), luminous layer part 21, composed of a gallium nitride semiconductor, is formed on phosphor part 3B by means of a semiconductor process. A reflecting layer 23 is formed on the rear surface of phosphor part 3B. Light emitted from luminous layer part 21 is radiated in all directions, but a part of that light, which is absorbed by phosphor part 3B, excites phosphor part 3B and induces a radiation of light having wavelength specific to the above-mentioned phosphor components. This light, emitted from phosphor part 3B, is reflected by reflecting layer 23 before being emitted forward. Therefore, a synthesized light, synthesized from the light emitted from luminous layer part 21 and that emitted from phosphor part 3B, is obtained by light emitting device 1B.

Thus, light emitting device 1B of the present embodiment is provided with luminous element 2 and phosphor part 3B, which emits light of the desired wavelength after being excited by the light from luminous element 2. Here, if phosphor part 3B is superior in light-transmission, a portion of the light emitted from luminous element 2 is emitted unchanged to the outside, and the phosphor components, which play the role of luminescent center, are excited by another portion of the light emitted from luminous element 2 and emits light, which is specific to the phosphor components, to the outside. Thus, it becomes possible to obtain a light, synthesized from the light emitted from luminous element 2 and that emitted from phosphor components of phosphor part 3B, and also to reduce the light color unevenness and light color fluctuations, as well as to enhance the efficiency of extracting light to the outside in comparison with conventional devices. That is, if phosphor part 3B is highly transparent without clouding and turbidity, light emitting device 1B is superior in homogeneity of light color with almost no light color fluctuations among light emitting devices 1B, and also can enhance the efficiency of extracting light from luminous element 2 to the outside when compared with conventional light emitting devices. Also, the weather resistance of the luminescent material can be enhanced and thus the lifetime of light emitting device 1B can be prolonged in comparison with conventional devices.

Also in light emitting device 1B of the present embodiment, phosphor part 3B serves also as a substrate for forming luminous element 2, and therefore the phosphor components in the phosphor part, which play the role of luminescent center, can efficiently be excited by a part of the light from luminous element 2, leading to the enhancement in brightness of the emitted light specific to the phosphor components.

[Embodiment B-2]

Figure 4:
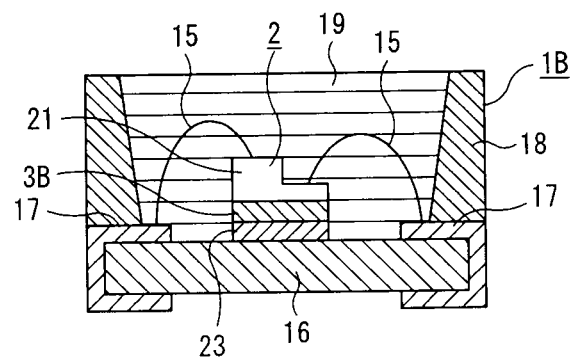
FIG. 4 is a schematic sectional view showing Embodiment B-2.

In light emitting device 1B of the present embodiment, as shown in FIG. 4, luminous element 2 is surface-mounted on an insulating substrate 16 on which printed wiring 17 is carried out. Here, luminous element 2 is structured in the same manner as in embodiment B-1, in which luminous layer part 21, composed of a gallium nitride semiconductor, is formed on phosphor part 3B and reflecting layer 23 is formed on the rear surface of phosphor part 3B. In luminous element 2, a p-type semiconductor layer (not shown) and an n-type semiconductor layer (not shown) in a luminous layer part 21 are connected electrically to printed wirings 17 and 17 via conductive wires 15 and 15 respectively.

A frame-shaped frame 18 encircling luminous element 2 is fixed onto insulating substrate 16. A sealing part 19 for sealing and protecting luminous element 2 is provided inside frame 18.

Thus, since light emitting device 1B in the present embodiment is also provided with luminous element 2 and phosphor part 3B, which emits light of the desired wavelength after being excited by the light from luminous element 2, similarly to Embodiment B-1, a light, synthesized from the light from luminous element 2 and the light from the phosphor, can be obtained. Also, like Embodiment B-1, it becomes possible to reduce the light color unevenness and light color fluctuations, enhance the efficiency of extracting light to the outside, and as well as prolong the lifetime, in comparison with conventional devices.

[Embodiment B-3]

Figure 5:
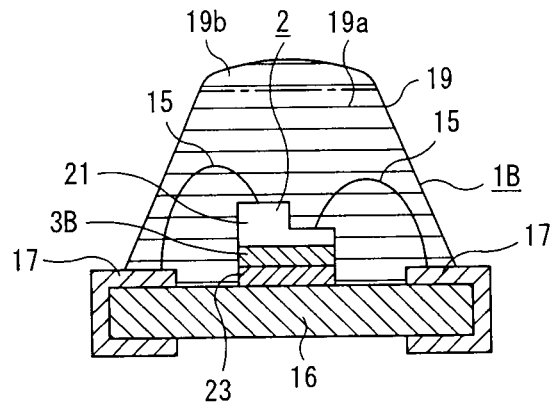
FIG. 5 is a schematic sectional view showing Embodiment B-3.

Light emitting device 1B of the present embodiment has a basic structure that is approximately the same as that in Embodiment B-2. However, frame 18 (see FIG. 4) described in Embodiment B-2 is not used and, as shown in FIG. 5, the shape of sealing part 19 is different. Meanwhile, the same components as in embodiment B-2 are designated by the same reference numerals to omit redundant explanations.

Sealing part 19 of the present embodiment comprises a sealing function part 19a in a truncated cone shape for sealing luminous element 2 and a lens function part 19b in a lens shape to function as a lens at the front end portion of sealing part 19.

Thus, light emitting device 1B of the present embodiment can reduce the number of components, compared with Embodiment B-2, allowing the miniaturization and weight reduction. Moreover, by providing lens function part 19b functioning as a lens at one portion of sealing part 19, distribution of light that is superior in directivity can be obtained.

[Embodiment B-4]

Figure 6:
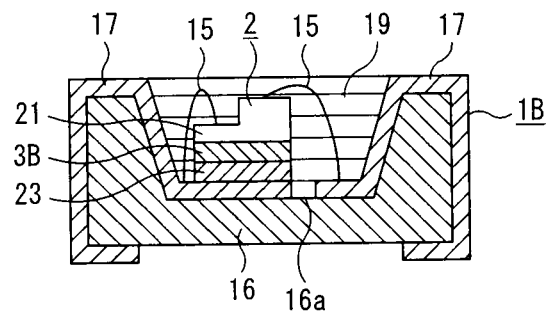
FIG. 6 is a schematic sectional view showing Embodiment B-4.

Light emitting device 1B of the present embodiment has a basic structure that is approximately the same as that in Embodiment B-2. As shown in FIG. 6, it is characterized in that a hollow 16a for accommodating luminous element 2 is provided on one surface (upper surface in FIG. 6) of insulating substrate 16, luminous element 2 is mounted at the bottom of hollow 16a, and sealing part 19 is provided inside hollow 16a. Here, printed wirings 17 and 17, formed on insulating substrate 16, are extended to the bottom of hollow 16a, and connected electrically to luminous layer part 21, composed of a gallium nitride semiconductor, in luminous element 2 via conductive wires 15 and 15. Meanwhile, the same components as in embodiment B-2 are designated by the same reference numerals to omit redundant explanations.

Thus, sealing part 19 of light emitting device 1B of the present embodiment is formed by filling hollow 16a, formed on the upper surface of insulating substrate 16, and therefore sealing part 19 can be formed without using frame 18 (see FIG. 5) described in Embodiment B-2 or the molding die described in Embodiment B-3. This advantageously simplifies the sealing process of luminous element 2, compared with Embodiments B-2 and B-3.

[Embodiment B-5]

Figure 7:
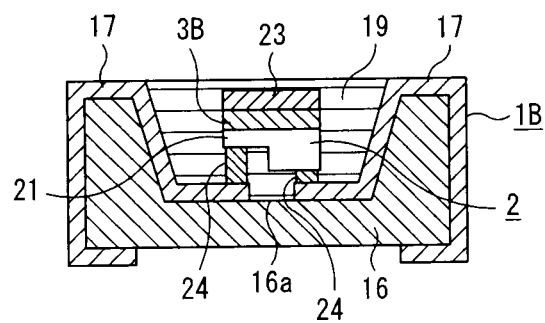
FIG. 7 is a schematic sectional view showing Embodiment B-5.

Light emitting device 1B of the present embodiment has a basic structure that is approximately the same as that in Embodiment B-4. As shown in FIG. 7, it is characterized in that luminous element 2 is so-called flip-chip-mounted on insulating substrate 16. That is, luminous element 2 is provided with bumps 24 and 24, made of conductive material, on the respective surface side of the p-type semiconductor layer (not shown) and n-type semiconductor layer (not shown) in luminous layer part 21, and luminous layer part 21 is electrically connected to printed wiring 17 and 17 of insulating substrate 16, with its face down, via bumps 24 and 24. Accordingly, in luminous element 2 of the present embodiment, luminous layer part 21 is disposed on the side nearest to insulating substrate 16, reflecting layer 23 is disposed on the side farthest from insulating substrate 16, and phosphor part 3B is sandwiched by luminous layer part 21 and reflecting layer 23. Meanwhile, the same components as in embodiment B-4 are designated by the same reference numerals to omit redundant explanations.

In light emitting device 1B of the present embodiment, the light reflected by reflecting layer 23 in the downward (back) direction in FIG. 7 is then reflected by the inner circumferential surface of hollow 16a before being radiated in the upward (front) direction in FIG. 7. In this context, it is desirable to provide separately a reflecting layer that is made of material whose reflectance is high, in the inner circumferential surface of hollow 16a, except at printed wirings 17 and 17.

Thus, light emitting device 1B of the present embodiment does not require conductive wires 15 and 15 like those in Embodiment B-4 for connecting printed wirings 17 and 17 provided on insulating substrate 16 and luminous element 2. This enables improvement in mechanical strength and reliability, compared with Embodiment B-4.

[Embodiment B-6]

Figure 8:
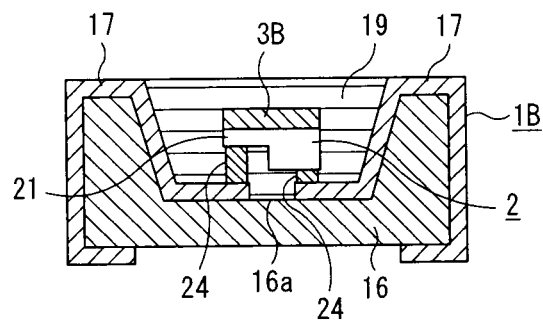
FIG. 8 is a schematic sectional view showing Embodiment B-6.

Light emitting device 1B of the present embodiment has a basic structure that is approximately the same as that in Embodiment B-5. However, as shown in FIG. 8, it is different in that reflecting layer 23, described in Embodiment B-5, is not provided. In other words, in light emitting device 1B of the present embodiment, the light emitted from luminous layer part 21 and that emitted from phosphor part 3B are radiated in the front direction directly after passing through sealing part 19. Meanwhile, the same components as in embodiment B-5 are designated by the same reference numerals to omit redundant explanations.

Thus, light emitting device 1B of the present embodiment can reduce the number of components, compared with Embodiment B-5, which results in facilitating the manufacture thereof.

[Embodiment B-7]

Figure 9:
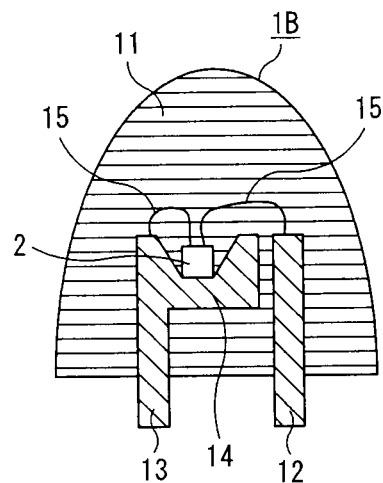
FIG. 9 is a schematic sectional view showing Embodiment B-7.

Light emitting device 1B of the present embodiment has a basic structure that is approximately the same as that in Embodiment B-1. As shown in FIG. 9, it is characterized in that mold part 11, covering luminous element 2, is provided and mold part 11 is formed integrally with the phosphor part. Meanwhile, the same components as in Embodiment B-1 are designated by the same reference numerals to omit redundant explanations.

While producing light emitting device 1B of the present embodiment, mold part 11 is formed by a method, for example, in which a product in progress without mold part 11 is immersed in a molding die storing a phosphor part formation liquid and the phosphor part formation liquid (polycondensation product) is cured.

Since mold part 11 and the phosphor part are integrally formed in the present embodiment, it becomes possible to enhance sealing properties, transparency, light resistance and heat resistance of mold part 11 and to inhibit crack generations and peelings accompanying a long-term use, by means of using the semiconductor light-emitting device member of the present invention as phosphor part, as described later.

[Embodiment B-8]

Figure 10:
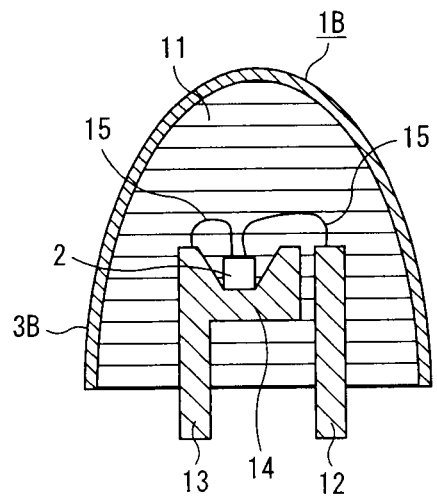
FIG. 10 is a schematic sectional view showing Embodiment B-8.

Light emitting device 1B of the present embodiment has a basic structure that is approximately the same as that in Embodiment B-1. As shown in FIG. 10, it is characterized in that a cup-shaped phosphor part 3B whose rear surface is open is mounted on the outer surface of mold part 11. That is, in the present embodiment, instead of providing phosphor part 3B in luminous element 2 like Embodiment B-1, phosphor part 3B in a shape along an outer circumference of mold part 11 is provided. Meanwhile, the same components as in Embodiment B-1 are designated by the same reference numerals to omit redundant explanations.

Phosphor part 3B in the present embodiment may be formed as a thin film by the method of curing the phosphor part formation liquid (polycondensation product) as described in Embodiment B-7. Or otherwise, it may be formed by mounting a member, which is a solid phosphor part molded in a cup-shape in advance, on mold part 11.

Thus, in light emitting device 1B of the present embodiment, the amount of the material used for the phosphor part can be reduced, compared with the case of light emitting device 1B of Embodiment B-7, in which the whole mold part 11 is formed integrally with the phosphor part. And this enables the cost reduction.

[Embodiment B-9]

Figure 11:
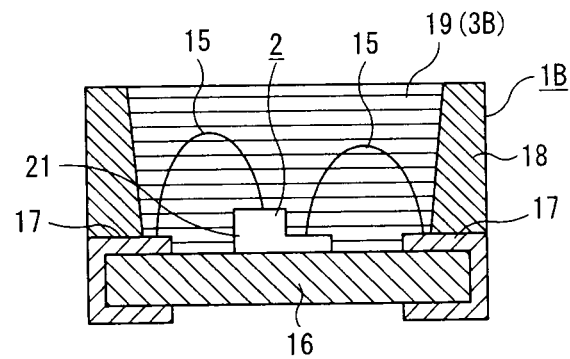
FIG. 11 is a schematic sectional view showing Embodiment B-9.

Light emitting device 1B of the present embodiment has a basic structure that is approximately the same as that in Embodiment B-2. As shown in FIG. 11, it is characterized in that a frame-shaped frame 18, encircling luminous element 2 on one surface (upper surface in FIG. 11) of insulating substrate 16, is provided and sealing part 19 inside frame 18 is formed of a phosphor part the same as that of phosphor part 3B described in Embodiment B-2. Meanwhile, the same components as in embodiment B-2 are designated by the same reference numerals to omit redundant explanations.

Since sealing part 19 is formed of the phosphor part in the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part, as described later.

[Embodiment B-10]

Figure 12:
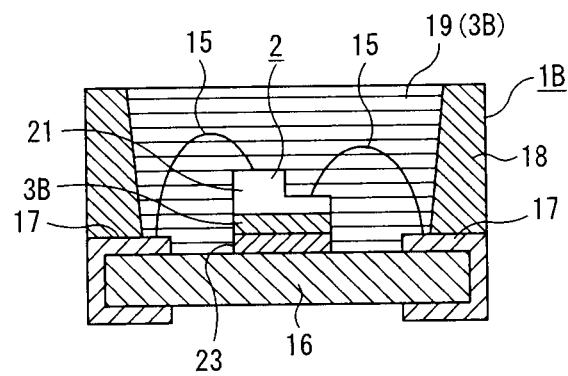
FIG. 12 is a schematic sectional view showing Embodiment B-10.

Light emitting device 1B of the present embodiment has a basic structure that is approximately the same as that in Embodiment B-2. As shown in FIG. 12, it is characterized in that a frame-shaped frame 18, encircling luminous element 2 on one surface (upper surface in FIG. 12) of insulating substrate 16, is provided and sealing part 19 inside frame 18 is formed of a phosphor part the same as that of phosphor part 3B described in Embodiment B-2. Meanwhile, the same components as in embodiment B-2 are designated by the same reference numerals to omit redundant explanations.

Since sealing part 19 is formed of the phosphor part in the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part, as described later.

Furthermore, in the present embodiment, phosphor part 3B is formed on the rear surface of luminous layer part 21 contained in luminous element 2, and sealing part 19 covering luminous element 2 is formed of a phosphor part. This results in that the phosphor parts are present in all directions from luminous layer part 21 of luminous element 2. This structure leads to the advantageous effect that excitation and light emission of the phosphor parts can be performed more efficiently than Embodiment B-9.

[Embodiment B-11]

Figure 13:
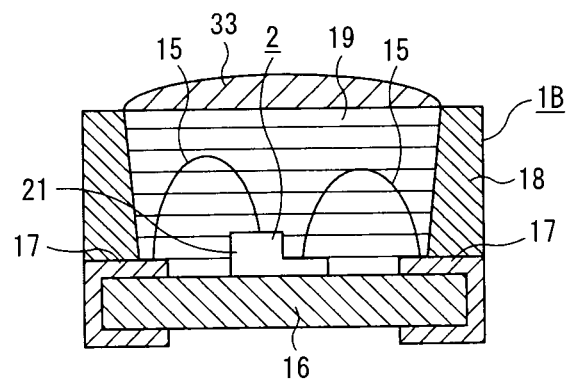
FIG. 13 is a schematic sectional view showing Embodiment B-11.

Light emitting device 1B of the present embodiment has a basic structure that is approximately the same as that in Embodiment B-2. As shown in FIG. 13, it is characterized in that phosphor part 33 formed in advance in a lens shape is disposed on the upper surface of sealing part 19, which is made of light-transmissible material. Here, phosphor part 33 is made of the same material as that of phosphor part 3B described in Embodiment B-2 and is used to emit light of the desired wavelength after being excited by the light from luminous element 2. Meanwhile, the same components as in embodiment B-2 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission.

[Embodiment B-12]

Figure 14:
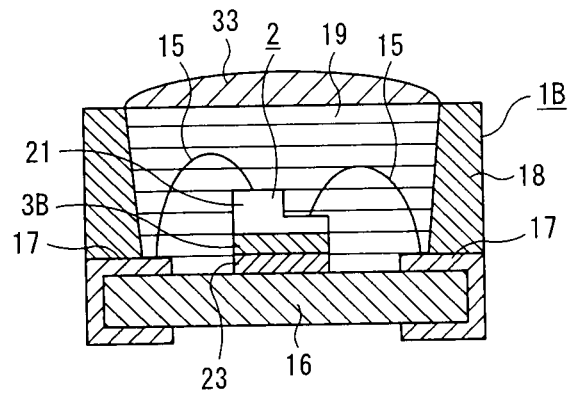
FIG. 14 is a schematic sectional view showing Embodiment B-12.

Light emitting device 1B of the present embodiment has a basic structure that is approximately the same as that in Embodiment B-2. As shown in FIG. 14, it is characterized in that phosphor part 33 formed in advance in a lens shape is disposed on the upper surface of sealing part 19, which is made of light-transmissible material. Here, phosphor part 33 is made of the same material as that of phosphor part 3B described in Embodiment B-2 and is used to emit light of the desired wavelength after being excited by the light from luminous element 2. Meanwhile, the same components as in embodiment B-2 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission. Furthermore, in the present embodiment, phosphor part 3B is formed on the rear surface of luminous layer part 21 contained in luminous element 2. This structure leads to the advantageous effect that excitation and light emission of the phosphor parts can be performed more efficiently than Embodiment B-11.

[Embodiment B-13]

Figure 15:
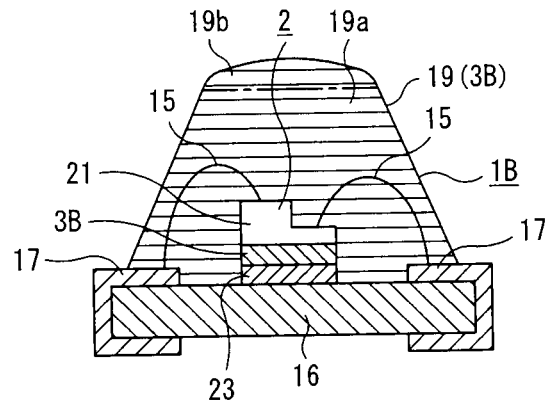
FIG. 15 is a schematic sectional view showing Embodiment B-13.

Light emitting device 1B of the present embodiment has a basic structure that is approximately the same as that in Embodiment B-3. However, as shown in FIG. 15, it is characterized in that sealing part 19, covering the luminous element 2 and provided on the upper surface side of insulating substrate 16, is formed of the phosphor part. Here, sealing part 19 of the present embodiment comprises, like Embodiment B-3, a sealing function part 19a in a truncated cone shape for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, sealing part 19 has functions of, not only sealing/protecting luminous element 2, but also converting the wavelength of the light from luminous element 2 and being a lens to control the directivity of light emission. Also, the weather resistance of sealing part 19 can be enhanced and thus the lifetime of light emitting device 1B can be prolonged. Furthermore, in the present embodiment, phosphor part 3B is formed on the rear surface of luminous layer part 21 contained in luminous element 2, and sealing part 19, covering luminous element 2, is formed of a phosphor part. This results in that the phosphor parts are present in all directions from luminous layer part 21 of luminous element 2. This structure leads to the advantageous effect that excitation and light emission of the phosphor parts can be performed more efficiently than Embodiment B-12.

[Embodiment B-14]

Figure 16:
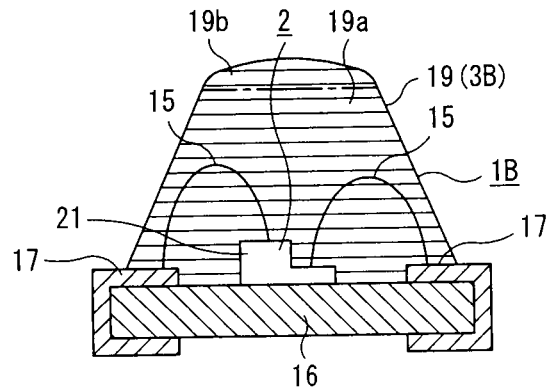
FIG. 16 is a schematic sectional view showing Embodiment B-14.

Light emitting device 1B of the present embodiment has a basic structure that is approximately the same as that in Embodiment B-3. However, as shown in FIG. 16, it is characterized in that sealing part 19, covering the luminous element 2 and provided on one surface (the upper surface in FIG. 16) side of insulating substrate 16, is formed of phosphor part 3B. Here, sealing part 19 of the present embodiment comprises, like Embodiment B-3, a sealing function part 19a in a truncated cone shape for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, sealing part 19 has functions of, not only sealing/protecting luminous element 2, but also converting the wavelength of the light from luminous element 2 and being a lens to control the directivity of light emission. Also, the weather resistance of sealing part 19 can be enhanced and thus the lifetime of light emitting device 1B can be prolonged.

[Embodiment B-15]

Figure 17:
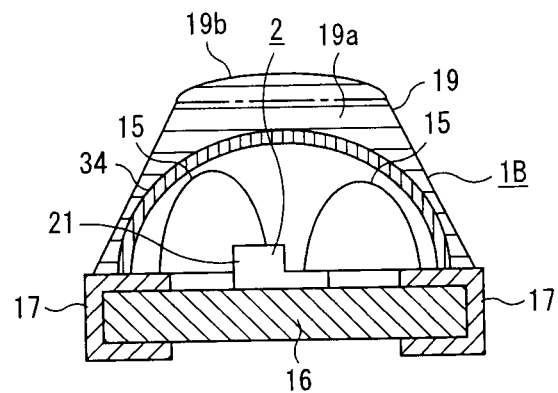
FIG. 17 is a schematic sectional view showing Embodiment B-15.

Light emitting device 1B of the present embodiment has a basic structure that is approximately the same as that in Embodiment B-3. As shown in FIG. 17, it is characterized in that dome-shaped phosphor part 34 covering luminous element 2 is disposed on the upper surface side of insulating substrate 16 and sealing part 19, made of light-transmissible resin, is formed on the outer surface side of phosphor part 34. Here, sealing part 19 of the present embodiment comprises, like Embodiment B-3, a sealing function part 19a for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, the amount of the material used for phosphor part 34 can be reduced, compared with Embodiments B-13 and B-14. In addition, since dome-shaped phosphor part 34 covering luminous element 2 is disposed in the present embodiment, the degradation of luminous element 2, due to moisture from outside or the like, can be prevented more reliably, by means of using the semiconductor light-emitting device member of the present invention as phosphor part, as described later. This enables the lifetime of light emitting device 1B to be prolonged.

[Embodiment B-16]

Figure 18:
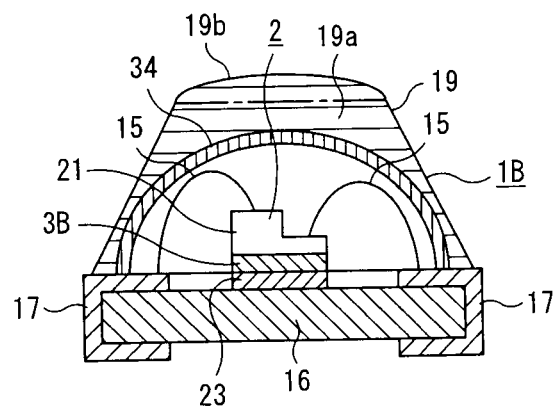
FIG. 18 is a schematic sectional view showing Embodiment B-16.

Light emitting device 1B of the present embodiment has a basic structure that is approximately the same as that in Embodiment B-3. As shown in FIG. 18, it is characterized in that dome-shaped phosphor part 34 covering luminous element 2 is disposed on the upper surface side of insulating substrate 16 and sealing part 19 is formed on the outer surface side of phosphor part 34. Here, sealing part 19 of the present embodiment comprises, like Embodiment B-3, a sealing function part 19a for sealing luminous element 2 and a lens function part 19b in a lens shape to function as a lens at the front end portion of sealing part 19. Meanwhile, the same components as in Embodiment B-3 are designated by the same reference numerals to omit redundant explanations.

Thus, in light emitting device 1B of the present embodiment, the amount of the material used for phosphor part 34 can be reduced, compared with Embodiments B-13 and B-14. In addition, since dome-shaped phosphor part 34 covering luminous element 2 is disposed in the present embodiment, the degradation of luminous element 2, due to moisture from outside or the like, can be prevented more reliably, by means of using the semiconductor light-emitting device member of the present invention as phosphor part, as described later. This enables the lifetime of light emitting device 1B to be prolonged. Furthermore, in the present embodiment, phosphor part 3B is formed on the rear surface of luminous layer part 21 contained in luminous element 2, and sealing part 19, covering luminous element 2, is formed of a phosphor part. This results in that the phosphor parts are present in all directions from luminous layer part 21 of luminous element 2. This structure leads to the advantageous effect that excitation and light emission of the phosphor parts can be performed more efficiently than Embodiment B-15.

[Embodiment B-17]

Figure 19:
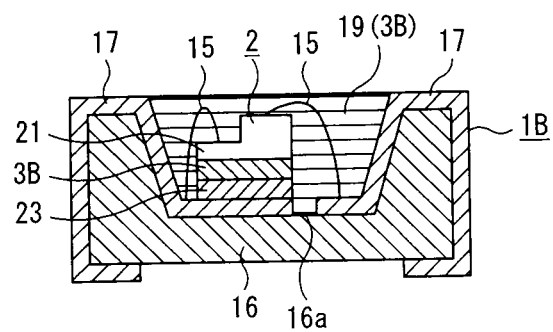
FIG. 19 is a schematic sectional view showing Embodiment B-17.

Light emitting device 1B of the present embodiment has a basic structure that is approximately the same as that in Embodiment B-4. As shown in FIG. 19, it is characterized in that sealing part 19 for sealing luminous element 2, disposed at the bottom of hollow 16a formed on one surface (upper surface in FIG. 19) of insulating substrate 16, is provided and that sealing part 19 is formed of the phosphor part. Here, the phosphor part is used to emit light of the desired wavelength after being excited by the light from luminous element 2, just like phosphor part 3B described in Embodiment B-1. Meanwhile, the same components as in embodiment B-4 are designated by the same reference numerals to omit redundant explanations.

Since sealing part 19 is formed of the phosphor part in light emitting device 1B of the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part, as described later. Furthermore, in the present embodiment, phosphor part 3B is formed on the rear surface of luminous layer part 21 contained in luminous element 2, and sealing part 19, covering luminous element 2, is formed of a phosphor part 3B. This results in that the phosphor parts are present in all directions from luminous layer part 21 of luminous element 2. This structure leads to the advantageous effect that excitation and light emission of the phosphor parts can be performed more efficiently than Embodiment B-15.

[Embodiment B-18]

Figure 20:
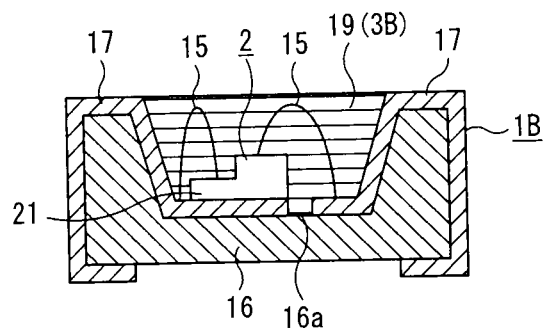
FIG. 20 is a schematic sectional view showing Embodiment B-18.

Light emitting device 1B of the present embodiment has a basic structure that is approximately the same as that in Embodiment B-4. As shown in FIG. 20, it is characterized in that sealing part 19 for sealing luminous element 2, disposed at the bottom of hollow 16a formed on one surface (upper surface in FIG. 20) of insulating substrate 16, is provided and that sealing part 19 is formed of the phosphor part 3B. Here, that phosphor part 3B is used to emit light of the desired wavelength after being excited by the light from luminous element 2, just like phosphor part 3B described in Embodiment B-1. Meanwhile, the same components as in embodiment B-4 are designated by the same reference numerals to omit redundant explanations.

Since sealing part 19 is formed of the phosphor part in light emitting device 1B of the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part 3B, as described later.

[Embodiment B-19]

Figure 21:
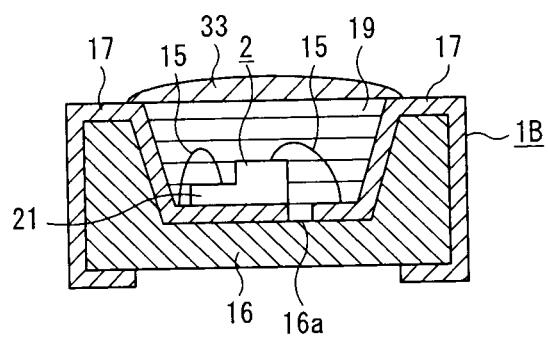
FIG. 21 is a schematic sectional view showing Embodiment B-19.

Light emitting device 1B of the present embodiment has a basic structure that is approximately the same as that in Embodiment B-4. As shown in FIG. 21, it is characterized in that phosphor part 33 formed in a lens shape in advance is disposed on the upper surface (which is, the light extraction surface) of sealing part 19. Here, that phosphor part 33 is used to emit light of the desired wavelength after being excited by the light from luminous element 2, just like phosphor part 3B described in Embodiment B-1. Meanwhile, the same components as in embodiment B-4 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission.

[Embodiment B-20]

Figure 22:
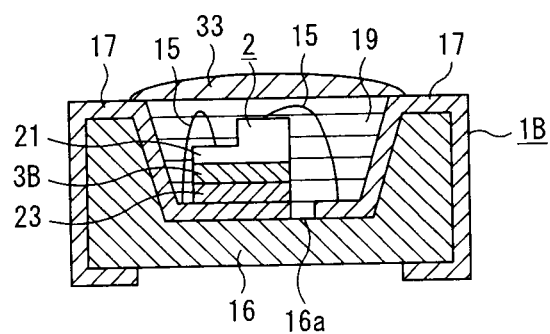
FIG. 22 is a schematic sectional view showing Embodiment B-20.

Light emitting device 1B of the present embodiment has a basic structure that is approximately the same as that in Embodiment B-4. As shown in FIG. 22, it is characterized in that phosphor part 33 formed in a lens shape in advance is disposed on the upper surface (which is, the light extraction surface) of sealing part 19. Here, that phosphor part 33 is used to emit light of the desired wavelength after being excited by the light from luminous element 2, just like phosphor part 3B described in Embodiment B-1. Meanwhile, the same components as in embodiment B-4 are designated by the same reference numerals to omit redundant explanations.

Thus, in light emitting device 1B of the present embodiment, phosphor part 33 performs not only function of wavelength conversion, but also of a lens. This lens effect enables the directivity control of the light emission. Furthermore, in the present embodiment, since phosphor part 3B is formed also on the rear surface of luminous layer part 21 contained in luminous element 2, the excitation and light emission of the phosphor part is performed more efficiently than Embodiment B-19.

[Embodiment B-21]

Figure 23:
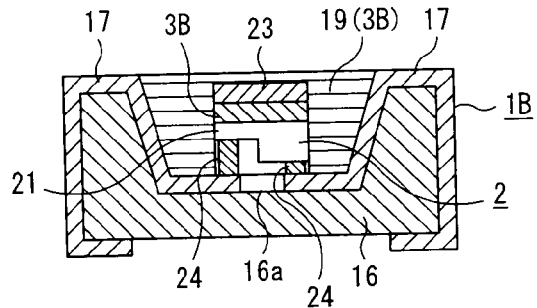
FIG. 23 is a schematic sectional view showing Embodiment B-21.
Figure 24:
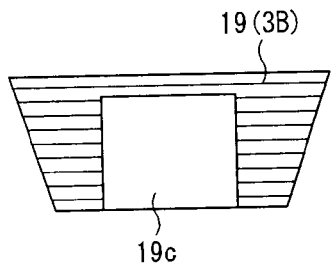
FIG. 24 is a sectional view of a substantial part, showing Embodiment B-21.

Light emitting device 1B of the present embodiment has a basic structure that is approximately the same as that in Embodiment B-5. As shown in FIG. 23, it is characterized in that sealing part 19 for sealing luminous element 2 disposed at the bottom of hollow 16a formed on one surface (upper surface in FIG. 23) of insulating substrate 16 is provided and that sealing part 19 is formed of phosphor part 3B. Sealing part 19 is, as shown in FIG. 24, inserted into hollow 16a of insulating substrate 16 on which luminous element 2 is mounted, after it is processed in advance to have the outer circumferential, the shape of which corresponds to hollow 16a, and a recess 19c, at a position corresponding to luminous element 2, for accommodating luminous element 2. This structure enables the sealing process to be simplified. Here, phosphor part 3B, constituting sealing part 19, is used to emit light of the desired wavelength after being excited by the light from luminous element 2, just like phosphor part 3B described in Embodiment B-1. Meanwhile, the same components as in embodiment B-5 are designated by the same reference numerals to omit redundant explanations.

Since sealing part 19 is formed of the phosphor part in light emitting device 1B of the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part 3B, as described later. In addition, in the present embodiment, light emitted in the front direction from luminous layer part 21 of luminous element 2 is once reflected by reflecting layer 23 toward the inner bottom surface of hollow 16a. Therefore, if reflecting layers are provided on the inner bottom surface and inner circumferential surface of hollow 16a, the reflected light will be reflected further by that inner bottom surface and inner circumferential surface, before being radiated in the front direction. With this structure, length of the optical path can be extended, and therefore, the advantageous effect of more efficient excitation and light emission by phosphor part 3B can be realized.

[Embodiment B-22]

Figure 25:
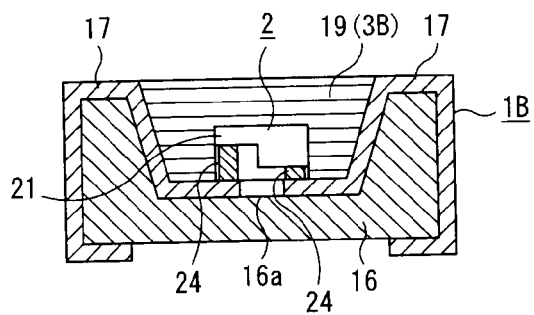
FIG. 25 is a schematic sectional view showing Embodiment B-22.
Figure 26:
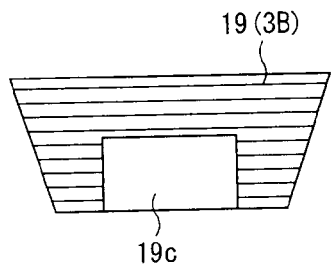
FIG. 26 is a sectional view of a substantial part, showing Embodiment B-22.

Light emitting device 1B of the present embodiment has a basic structure that is approximately the same as that in Embodiment B-5. As shown in FIG. 25, it is characterized in that sealing part 19 for sealing luminous element 2 disposed at the bottom of hollow 16a formed on one surface (upper surface in FIG. 25) of insulating substrate 16 is provided and that sealing part 19 is formed of phosphor part 3B. Sealing part 19 is, as shown in FIG. 26, inserted into hollow 16a of insulating substrate 16 on which luminous element 2 is mounted, after it is processed in advance to have the outer circumferential, the shape of which corresponds to hollow 16a, and a recess 19c, at a position corresponding to luminous element 2, for accommodating luminous element 2. This structure enables the sealing process to be simplified. Here, phosphor part 3B, constituting sealing part 19, is used to emit light of the desired wavelength after being excited by the light from luminous element 2, just like phosphor part 3B described in Embodiment B-1. Meanwhile, the same components as in embodiment B-5 are designated by the same reference numerals to omit redundant explanations.

Since sealing part 19 is formed of phosphor part 3B in light emitting device 1B of the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part 3B, as described later.

[Embodiment B-23]

Figure 27:
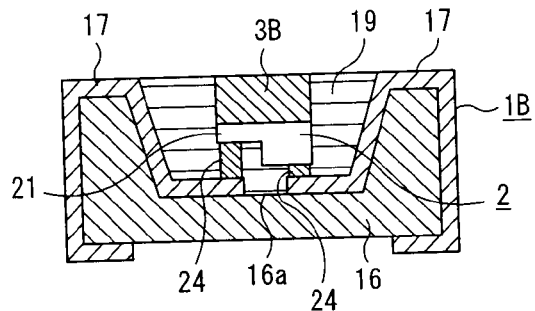
FIG. 27 is a schematic sectional view showing Embodiment B-23.

Light emitting device 1B of the present embodiment has a basic structure that is approximately the same as that in Embodiment B-6. As shown in FIG. 27, it is characterized in that phosphor part 3B that is processed like a rod in advance is disposed on the upper surface of luminous element 2. Around luminous element 2 and phosphor part 3B, sealing part 19, made of light-transmissible material, is formed. As regards phosphor part 3B, one end surface (lower end surface in FIG. 27) thereof is in close contact with luminous layer part 21 of luminous element 2, and another end surface (upper end surface in FIG. 27) thereof is exposed. Meanwhile, the same components as in Embodiment B-6 are designated by the same reference numerals to omit redundant explanations.

Figure 28:
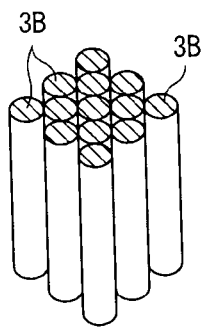
FIG. 28 is a perspective view of a substantial part, showing Embodiment B-23.

Thus, in light emitting device 1B of the present embodiment, since phosphor part 3B, whose one end surface is in close contact with luminous layer part 21 of luminous element 2, is formed like a rod, the light emitted from luminous layer part 21 can be absorbed efficiently into phosphor part 3B through the one end surface of phosphor part 3B. Then phosphor part 3B emits light, when excited by the absorbed light, to the outside efficiently through another end surface described above, of phosphor part 3B. In the present embodiment, only one phosphor part 3B, formed to be like a rod having a relatively large diameter, is used. Or otherwise, a plurality of phosphor parts 3B, formed to be like a bundle of fibers having relatively small diameters respectively, can be disposed, as shown in FIG. 28. In addition, the sectional shape of phosphor part 3B is not limited to a round shape, but may be, for example, a quadrangular shape, or other.

[Embodiment B-24]

Figure 29:
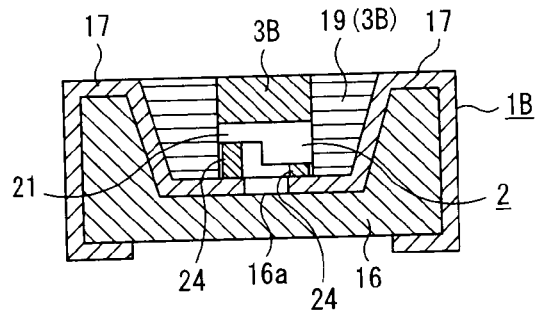
FIG. 29 is a schematic sectional view showing Embodiment B-24.
Figure 30:
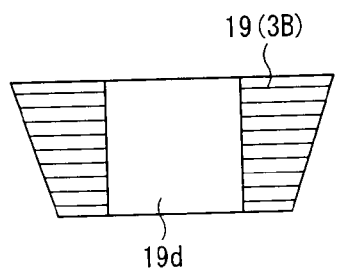
FIG. 30 is a sectional view of a substantial part, showing Embodiment B-24.

Light emitting device 1B of the present embodiment has a basic structure that is approximately the same as that in Embodiment B-23. As shown in FIG. 29, it is characterized in that the sealing part 19, provided inside hollow 16a of insulating substrate 16, is provided and that sealing part 19 is formed of phosphor part 3B. Sealing part 19 is, as shown in FIG. 30, inserted into hollow 16a of insulating substrate 16 on which luminous element 2 is mounted, after it is processed in advance to have outer circumferential, the shape of which corresponds to hollow 16a, and a through-hole 19d, at a position corresponding to luminous element 2, for accommodating luminous element 2. This structure enables the sealing process to be simplified. Here, phosphor part 3B, constituting sealing part 19, is used to emit light of the desired wavelength after being excited by the light from luminous element 2, just like phosphor part 3B described in Embodiment B-1. Meanwhile, the same components as in Embodiment B-23 are designated by the same reference numerals to omit redundant explanations.

Figure 31:
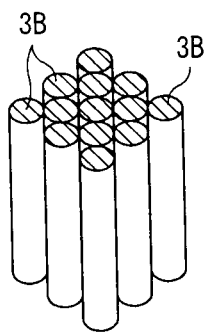
FIG. 31 is a perspective view of a substantial part, showing Embodiment B-24.

Thus, in light emitting device 1B of the present embodiment, since sealing part 19 is also formed of phosphor part 3B, it becomes possible to prolong the lifetime of light emitting device 1B and enhance in efficiency of the light emission. Though, in the present embodiment, only one phosphor part 3B, formed to be like a rod having a relatively large diameter, is used, a plurality of phosphor parts 3B, formed to be like a bundle of fibers having relatively small diameters, can be disposed, as shown in FIG. 31. In addition, the sectional shape of phosphor part 3B is not limited to a round shape, but may be, for example, a quadrangular shape, or other.

[Embodiment B-25]

Figure 32:
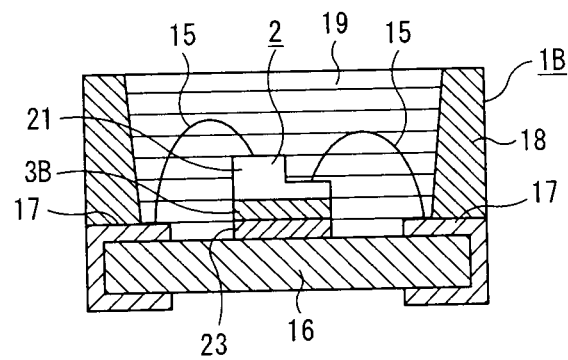
FIG. 32 is a schematic sectional view showing Embodiment B-25.

Light emitting device 1B of the present embodiment has a basic structure that is approximately the same as that in Embodiment B-2. As shown in FIG. 32, it is characterized in that frame 18 is disposed on one surface (the upper surface in FIG. 32) of insulating substrate 16, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19 disposed inside frame 18. In the present embodiment, fluorophosphate glass (for example, $P_2O_5AlF_3.MgF.CaF_2.SrF_2.BaCl_2:Eu^{2+}$ emitting blue light after being excited by near ultraviolet light) is used as phosphor part 3B. Meanwhile, the same components as in embodiment B-2 are designated by the same reference numerals to omit redundant explanations.

Thus, in light emitting device 1B of the present embodiment, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained.

Consequently, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In the present embodiment, a blue light is emitted from phosphor part 3B and a yellow light is emitted from the phosphor powder, so as to obtain a white light, which is different from both luminescent colors.

Light-emitting materials for existing phosphor particles in the phosphor part or for existing phosphor powders are limited, and therefore sometimes the desired light color may not be obtainable by using either the phosphor powder or phosphor part. The present embodiment is very effective in such a case. That is, even if the desired characteristics of light color cannot be obtained from phosphor part 3B alone, light emitting device 1B of the desired characteristics of light color can be realized just by using a phosphor powder having suitable, complementary light-color characteristics, which lacks in phosphor part 3B. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B. In this context, when the luminescent colors of phosphor part 3B and the phosphor powder are set to be approximately identical, by using $P_2O_5.SrF_2.BaF_2:Eu^{3+}$ and $Y_2O_2S:Eu^{3+}$, both emitting red light, as phosphor particles of phosphor part 3B and the phosphor powder respectively, an efficient red emission light can be obtained. This combination of phosphor part 3B and the phosphor powder is only an example, and any other combination may naturally be adopted.

[Embodiment B-26]

Figure 33:
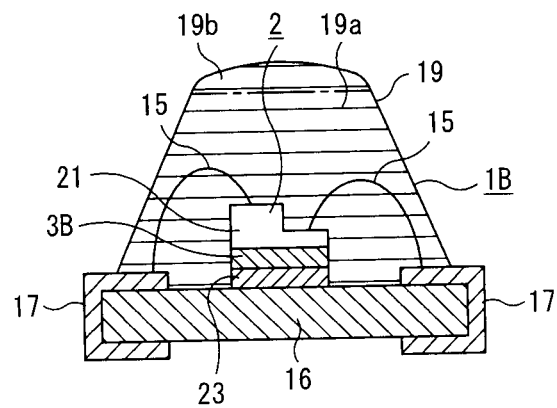
FIG. 33 is a schematic sectional view showing Embodiment B-26.

Light emitting device 1B of the present embodiment has a basic structure that is approximately the same as that in Embodiment B-3. As shown in FIG. 33, it is characterized in that sealing part 19 for sealing luminous element 2 from one side (the upper side in FIG. 33) of insulating substrate 16 is provided, luminous layer part 21 in luminous element 2 is based on AlGaN and emits near ultraviolet light, and phosphor powder (for example, powder of a $YAG:Ce^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in Embodiment B-3 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-27]

Figure 34:
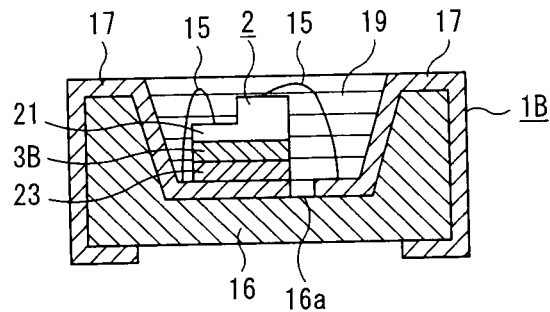
FIG. 34 is a schematic sectional view showing Embodiment B-27.

Light emitting device 1B of the present embodiment has a basic structure that is approximately the same as that in Embodiment B-4. As shown in FIG. 34, it is characterized in that sealing part 19 for sealing luminous element 2 by filling up hollow 16a formed on the upper surface of insulating substrate 16 is provided, luminous layer part 21 in luminous element 2 is based on AlGaN and emits near ultraviolet light, and phosphor powder (for example, powder of a $YAG:Ce^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in embodiment B-4 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-28]

Figure 35:
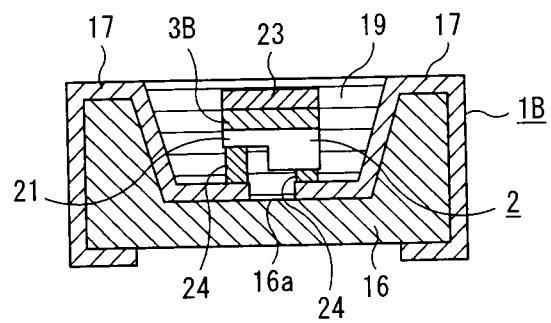
FIG. 35 is a schematic sectional view showing Embodiment B-28.

Light emitting device 1B of the present embodiment has a basic structure that is approximately the same as that in Embodiment B-5. As shown in FIG. 35, it is characterized in that sealing part 19 for sealing luminous element 2 by filling up hollow 16a formed on one surface (the upper surface in FIG. 35) of insulating substrate 16 is provided, luminous layer part 21 in luminous element 2 is based on AlGaN and emits near ultraviolet light, and phosphor powder (for example, powder of a $YAG:Ce^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2:Eu^{2+}$ emitting blue light after being excited by near ultraviolet light) is used as phosphor particles in phosphor part 3B. Meanwhile, the same components as in embodiment B-5 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-29]

Figure 36:
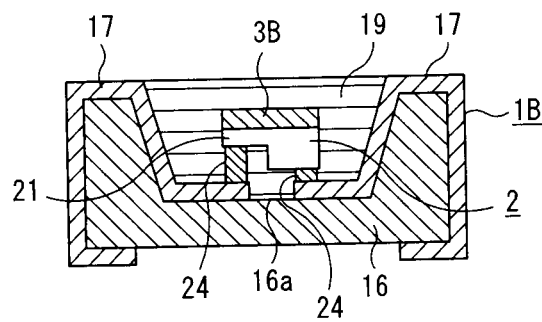
FIG. 36 is a schematic sectional view showing Embodiment B-29.

Light emitting device 1B of the present embodiment has a basic structure that is approximately the same as that in Embodiment B-6. As shown in FIG. 36, it is characterized in that sealing part 19 for sealing luminous element 2 by filling up hollow 16a formed on one surface (the upper surface in FIG. 36) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in Embodiment B-6 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-30]

Figure 37A:
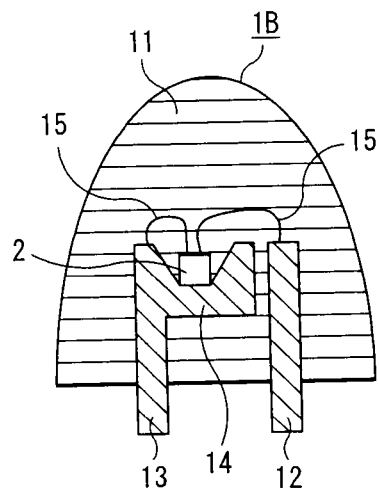
FIG. 37 shows Embodiment B-30, and FIG. 37(*a*) is a schematic sectional view and FIG. 37(*b*) is an enlarged view of a substantial part of FIG. 37(*a*)
Figure 37B:
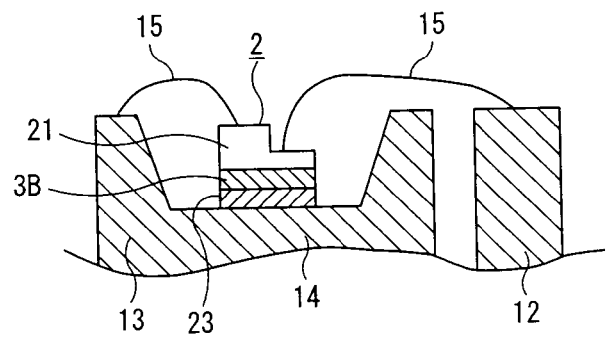

Light emitting device 1B of the present embodiment has a basic structure that is approximately the same as that in Embodiment B-1. As shown in FIG. 37(*a*) and FIG. 37(*b*), it is characterized in that the shell type shape mold part 11 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as mold part 11, and mold part 11 functions as a phosphor part. In the present embodiment, fluorophosphate glass (for example, $P_2O_5.AlF_3.MgF.CaF_2.SrF_2.BaCl_2$:Eu emitting blue light after being excited by near ultraviolet light) is used as phosphor particles in phosphor part 3B. Meanwhile, the same components as in Embodiment B-1 are designated by the same reference numerals to omit redundant explanations.

Thus, in light emitting device 1B of the present embodiment, just as in Embodiment B-25, since a phosphor powder that emits light after being excited by the light from luminous element 2 is dispersed in mold part 11, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in mold part 11 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-31]

Figure 38:
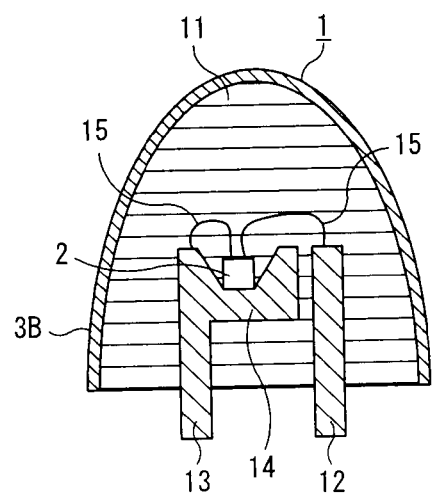
FIG. 38 is a schematic sectional view showing Embodiment B-31.

Light emitting device 1B of the present embodiment has a basic structure that is approximately the same as that in Embodiment B-8. As shown in FIG. 38, it is characterized in that the shell type shape mold part 11 is provided, luminous layer part 21 (not shown in FIG. 38) in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as mold part 11, and mold part 11 functions as a phosphor part. In the present embodiment, fluorophosphate glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in Embodiment B-8 are designated by the same reference numerals to omit redundant explanations.

Thus, in light emitting device 1B of the present embodiment, just as in Embodiment B-25, since a phosphor powder that emits light after being excited by the light from luminous element 2 is dispersed in mold part 11, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in mold part 11 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-32]

Figure 39:
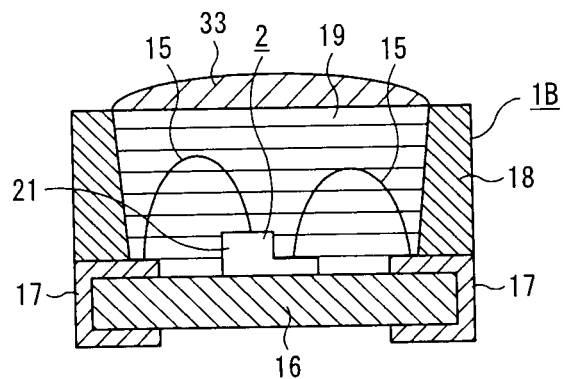
FIG. 39 is a schematic sectional view showing Embodiment B-32.

Light emitting device 1B of the present embodiment has a basic structure that is approximately the same as that in Embodiment B-11. As shown in FIG. 39, it is characterized in that sealing part 19 for sealing luminous element 2 from one side (the upper side in FIG. 39) of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2BaCl_2$:Eu emitting blue light after being excited by near ultraviolet light) is used as phosphor particles in phosphor part 33. Meanwhile, the same components as in Embodiment B-11 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 33 and the light emitted from the phosphor powder is obtained. Consequently, just as in Embodiment B-25, by selecting material that emits near ultraviolet light as material of luminous layer part 21 in luminous element 2, both phosphor part 33 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 33, differently from the case in the present embodiment. With that configuration, it becomes possible to increase the light output and enhance the emission efficiency because the light emitted from the phosphor powder is superimposed on the light emitted from phosphor part 33.

[Embodiment B-33]

Figure 40:
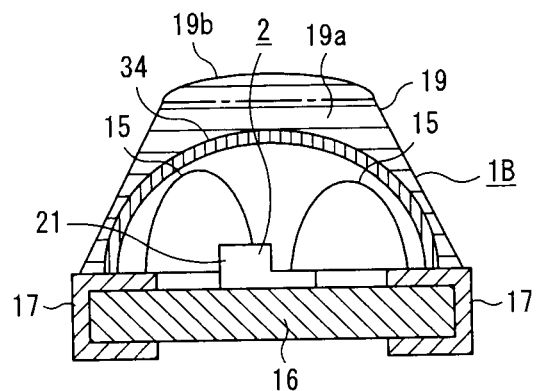
FIG. 40 is a schematic sectional view showing Embodiment B-33.

Light emitting device 1B of the present embodiment has a basic structure that is approximately the same as that in Embodiment B-15. As shown in FIG. 40, it is characterized in that sealing part 19 for sealing luminous element 2 from one side (the upper side in FIG. 40) of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2$:Eu$^{2+}$ emitting blue light after being excited by near ultraviolet light) is used as phosphor particles in phosphor part 34. Meanwhile, the same components as in embodiment B-15 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 34 and the light emitted from the phosphor powder is obtained. Consequently, just as in Embodiment B-25, by selecting material that emits near ultraviolet light as material of luminous layer part 21 in luminous element 2, both phosphor part 34 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 34, differently from the case in the present embodiment. With that configuration, it becomes possible to increase the light output and enhance the emission efficiency because the light emitted from the phosphor powder is superimposed on the light emitted from phosphor part 34.

[Embodiment B-34]

Figure 41:
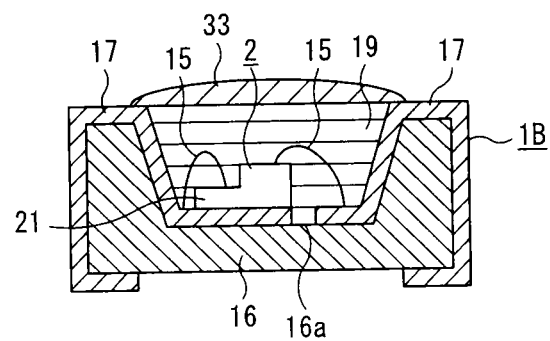
FIG. 41 is a schematic sectional view showing Embodiment B-34.

Light emitting device 1B of the present embodiment has a basic structure that is approximately the same as that in Embodiment B-19. As shown in FIG. 41, it is characterized in that sealing part 19 for sealing luminous element 2 by filling up hollow 16a formed on one surface (the upper surface in FIG. 41) of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2$:Eu$^{2+}$ emitting blue light after being excited by near ultraviolet light) is used as phosphor particles in phosphor part 33. Meanwhile, the same components as in embodiment B-19 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 33 and the light emitted from the phosphor powder is obtained. Consequently, just as in Embodiment B-25, by selecting material that emits near ultraviolet light as material of luminous layer part 21 in luminous element 2, both phosphor part 33 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 33, differently from the case in the present embodiment. With that configuration, it becomes possible to increase the light output and enhance the emission efficiency because the light emitted from the phosphor powder is superimposed on the light emitted from phosphor part 33.

[Embodiment B-35]

Figure 42:
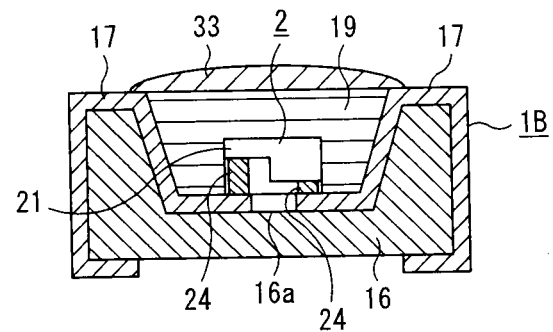
FIG. 42 is a schematic sectional view showing Embodiment B-35.

Light emitting device 1B of the present embodiment has a basic structure that is approximately the same as that in Embodiments B-12 and B-22. As shown in FIG. 42, it is characterized in that sealing part 19 for sealing luminous element 2 by filling up hollow 16a formed on one surface (the upper surface in FIG. 42) of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2$:Eu$^{2+}$ emitting blue light after being excited by near ultraviolet light) is used as phosphor particles in phosphor part 33. Meanwhile, the same components as in Embodiments B-12 and B-22 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 33 and the light emitted from the phosphor powder is obtained. Consequently, just as in Embodiment B-25, by selecting material that emits near ultraviolet light as material of luminous layer part 21 in luminous element 2, both phosphor part 33 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 33, differently from the case in the present embodiment. With that configuration, it becomes possible to increase the light output and enhance the emission efficiency because the light emitted from the phosphor powder is superimposed on the light emitted from phosphor part 33.

[Embodiment B-36]

Figure 43:
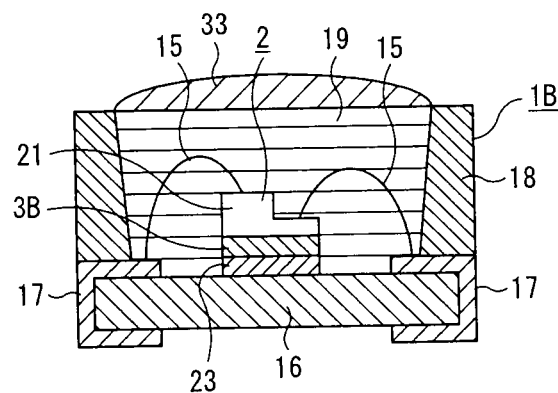
FIG. 43 is a schematic sectional view showing Embodiment B-36.

Light emitting device 1B of the present embodiment has a basic structure that is approximately the same as that in Embodiment B-12. As shown in FIG. 43, it is characterized in that sealing part 19 for sealing luminous element 2 from one side (the upper side in FIG. 43) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in embodiment B-12 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-37]

Figure 44:
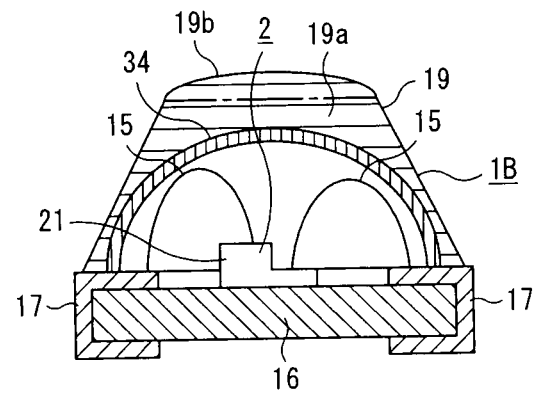
FIG. 44 is a schematic sectional view showing Embodiment B-37.

Light emitting device 1B of the present embodiment has a basic structure that is approximately the same as that in Embodiment B-16. As shown in FIG. 44, it is characterized in that sealing part 19 for sealing luminous element 2 from one side (the upper side in FIG. 44) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 34. Meanwhile, the same components as in Embodiment B-16 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 34 and the light emitted from the phosphor powder is obtained. Consequently, just as in Embodiment B-25, by selecting material that emits near ultraviolet light as material of luminous layer part 21 in luminous element 2, both phosphor part 34 and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 34, differently from the case in the present embodiment. With that configuration, it becomes possible to increase the light output and enhance the emission efficiency because the light emitted from the phosphor powder is superimposed on the light emitted from phosphor part 34.

[Embodiment B-38]

Figure 45:
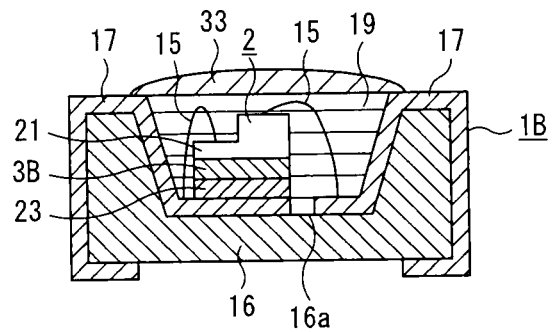
FIG. 45 is a schematic sectional view showing Embodiment B-38.

Light emitting device 1B of the present embodiment has a basic structure that is approximately the same as that in Embodiment B-20. As shown in FIG. 45, it is characterized in that sealing part 19 for sealing luminous element 2 by filling up hollow 16a formed on one surface (the upper surface in FIG. 45) of insulating substrate 16 is provided, luminous layer part 21 in luminous element 2 is based on AlGaN and emits near ultraviolet light, and phosphor powder (for example, powder of a YAG:$Ce^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3.MgF.CaF_2.SrF_2.BaCl_2$:$Eu^{2+}$ emitting blue light after being excited by near ultraviolet light) is used as phosphor particles in phosphor part 3B. Meanwhile, the same components as in Embodiment B-20 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-39]

Figure 46:
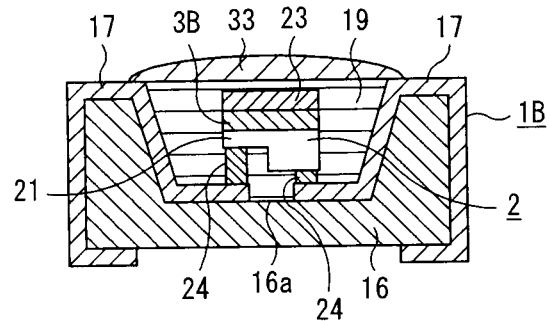
FIG. 46 is a schematic sectional view showing Embodiment B-39.

Light emitting device 1B of the present embodiment has a basic structure that is approximately the same as that in Embodiments B-5 and B-12. As shown in FIG. 46, it is characterized in that sealing part 19 for sealing luminous element 2 by filling up hollow 16a formed on one surface (the upper surface in FIG. 46) of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5.AlF_3MgF.CaF_2.SrF_2.BaCl_2$:Eu emitting blue light after being excited by near ultraviolet light) is used as phosphor particles in phosphor part 3B. Meanwhile, the same components as in Embodiments B-5 and B-12 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-40]

Figure 47:
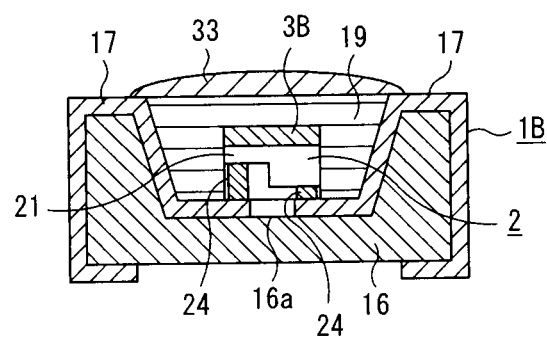
FIG. 47 is a schematic sectional view showing Embodiment B-40.

Light emitting device 1B of the present embodiment has a basic structure that is approximately the same as that in Embodiments B-20 and B-21. As shown in FIG. 47, it is characterized in that sealing part 19 for sealing luminous element 2 by filling up hollow 16a formed on one surface (the upper surface in FIG. 47) of insulating substrate 16 is provided, luminous layer part 21 in luminous element 2 is based on AlGaN and emits near ultraviolet light, and phosphor powder (for example, powder of a YAG:Ce$^{3+}$ phosphor emitting yellow light after being excited by near ultraviolet light) is dispersed in a light-transmissible material which is used as sealing part 19, and sealing part 19 functions as a phosphor part. In the present embodiment, fluorophosphate glass (for example, $P_2O_5AlF_3.MgF.CaF_2.SrF_2.BaCl_2$:Eu$^{2+}$ emitting blue light after being excited by near ultraviolet light) is used as phosphor particles in phosphor part 3B. Meanwhile, the same components as in Embodiments B-20 and B-21 are designated by the same reference numerals to omit redundant explanations.

Thus, in light emitting device 1B of the present embodiment, just as in Embodiment B-25, since a phosphor powder that emits light after being excited by the light from luminous element 2 is dispersed in sealing part 19, light output of a light synthesized from the light emitted from luminous element 2, the light emitted from phosphor part 3B and the light emitted from the phosphor powder is obtained. Consequently, just as in Embodiment B-25, by selecting material that emits near ultraviolet light as material of luminous layer part 21 in luminous element 2, both phosphor part 3B and the phosphor powder in sealing part 19 will be excited by the light emitted from luminous element 2 and emit lights intrinsic to each of them. And a synthesized light can be obtained from those lights. In addition, the luminescent color of the phosphor powder can be set identical to that of phosphor part 3B, differently from the case in the present embodiment. With that configuration, it becomes possible to increase the light output and enhance the emission efficiency because the light emitted from the phosphor powder is superimposed on the light emitted from phosphor part 3B.

[Embodiment B-41]

Figure 48:
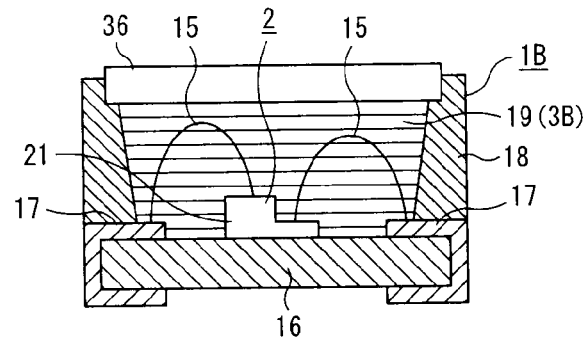
FIG. 48 is a schematic sectional view showing Embodiment A-41.

Light emitting device 1B of the present embodiment has a basic structure that is approximately the same as that in Embodiment B-2. As shown in FIG. 48, it is characterized in that a frame-shaped frame 18, encircling luminous element 2 on one surface (upper surface in FIG. 48) of insulating substrate 16, is provided and sealing part 19 inside frame 18 is formed of a phosphor part that is the same as that of phosphor part 3B described in Embodiment B-2. The upper surface side of luminous element 2 and sealing part 19 is cut off from oxygen or moisture content of outside by a transparent lid 36 formed of glass, highly-hermetic resin or the like. Meanwhile, the same components as in embodiment B-2 are designated by the same reference numerals to omit redundant explanations. Lid 36 and sealing part 19 may be in direct contact with each other or have a gap in between. However, when there is no gap, a semiconductor light-emitting device that is high in efficiency of extracting light and brightness can be achieved. When they have a gap in between, it is preferable for the gap to be sealed with vacuum or inert gas.

Since sealing part 19 is formed of the phosphor part in the present embodiment, it becomes possible to enhance sealing properties, transparency, light resistance and heat resistance of sealing part 19 and to inhibit crack generations and peelings accompanying a long-term use, by means of using the semiconductor light-emitting device member of the present invention as phosphor part, as described later.

In addition, in the present embodiment, lid 36 can inhibit an intrusion of external-factor such as moisture or oxygen, which accelerates deterioration of the phosphor and sealing resin, and volatilization of gas generated by thermal or photolytic degradation of the sealing resin. This leads to another advantageous effect of reducing brightness decrease and peelings induced by shrinkage of the sealing part.

Figure 49:
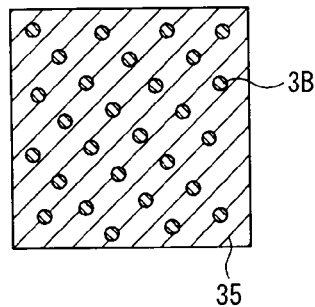
FIG. 49 is an explanatory drawing of another configuration example of a substantial part of each Embodiment.

Meanwhile, the phosphor part 3B may be formed spherical with a diameter a little larger than the visible wavelength and a large number of such phosphor parts 3B may be dispersed in a solid medium 35 that is made of light-transmissible material, as shown in FIG. 49, unlike each of the above embodiments, in which the phosphor part 3B is processed into a respective desired form or formed by means of sol-gel method. With that configuration, the amount of the material used for the phosphor part can be reduced while maintaining transparency of the phosphor part with respect to the visible wavelength range, which can lead to cost reduction.

Of course, a plurality of luminous elements 2 may constitute one unit of module and a phosphor part may be disposed close to, at least a part of, the module as luminous material, unlike the above embodiments, in which each light-emitting device 1B has only one luminous element 2. In such a case, for example for a light-emitting device provided with a mold part 11 in a shell-type shape, such as the one described in Embodiment B-1, a plurality of light-emitting devices may be mounted on the same printed board so as to constitute one unit of module. As another example, for a surface-mount type light-emitting device, such as the one described in Embodiment B-2, a plurality of luminous elements 2 may be mounted on the same insulating substrate 16 so as to constitute one unit of module.

[Application of Semiconductor Light-emitting Device Member]

The portion to which the semiconductor light-emitting device member of the present invention is applied in the light-emitting device (semiconductor light-emitting device) 1A, 1B, of each Embodiment of A-1, A-2, and B-1 to B-41 described above, is not particularly limited. In the above embodiments, the semiconductor light-emitting device member of the present invention is applied, as an example, as transparent member 3A, or as phosphor parts 3B, 33, 34. However, as other examples, the semiconductor light-emitting device member of the present invention can also be suitably used as members that are constituting the above-mentioned mold part 11, frame 18, sealing part 19 and the like. By using the semiconductor light-emitting device member of the present invention as these members, it becomes possible to obtain the above-mentioned various advantageous effects such as superior sealing properties, transparency, light resistance, heat resistance, film-formation capability and inhibition of crack generations and peelings accompanying a long-term use.

When applying the semiconductor light-emitting device member of the present invention, it is preferable to make a modification thereto as appropriate, which is suitable for the portion to which the present invention is applied. For example, when the present invention is applied to the phosphor part 3B, 33 or 34, the above-mentioned phosphor components such as phosphor particles, phosphor ions and fluorescent dyes may be mixed into the semiconductor light-emitting device member of the present invention. Such a modification brings about an advantageous effect of enhancing retention capacity of the phosphor, in addition to the above-mentioned various advantageous effects.

Since the semiconductor light-emitting device member of the present invention is highly durable, it can seal a luminous element (such as an LED chip) as a sealing material (which is used as inorganic adhesive) superior in light resistance (UV resistance) and heat resistance, even when it is used alone without including a phosphor.

If the above-mentioned inorganic particles are mixed into the semiconductor light-emitting device member of the present invention, it becomes possible to obtain the advantageous effects mentioned above in the explanation for the combined use of inorganic particles, in addition to the above-mentioned various advantageous effects. Particularly, a semiconductor light-emitting device member of the present invention that is adjusted to have a refractive index close to that of the luminous element by the combined use of inorganic particles can act as a suitable light extracting film.

[Uses or the Like of Semiconductor Light-emitting Device]

The semiconductor light-emitting device can be used, for example, for a light-emitting device. In order to use the semiconductor light-emitting device for a light-emitting device, it is possible to place a phosphor-containing layer containing a mixture of red phosphor, blue phosphor and green phosphor, over a light source. In this case, it is not always necessarily for the red, blue and green phosphors to be mixed in the same layer, but, for example, a layer containing the red phosphor may be stacked on the top of a layer containing the blue and green phosphors.

In a light-emitting device, a phosphor-containing layer can be provided over the light source. The phosphor-containing layer can be provided as a contact layer located between the light source and the resinous sealing part, as a coating layer located outside the resinous sealing part, or as a coating layer located inside an outside cap. Or otherwise, the resinous sealing may contain a phosphor.

As the resinous sealing part to be used, the semiconductor light-emitting device member of the present invention can be used. Or otherwise, other kinds of resins can also be used. Such kinds of resins usually include thermoplastic resin, thermosetting resin, light curing resin and the like.

More specific examples include: methacrylic resins such as polymethacrylate methyl; styrene resins such as polystyrene and styrene-acrylonitrile copolymer; polycarbonate resin; polyester resin; phenoxy resin; butyral resin; polyvinyl alcohol; cellulose resins such as ethyl cellulose, cellulose acetate and cellulose acetate butyrate; epoxy resin; phenol resin; and silicone resin. Also, inorganic materials of, for example, metal alkoxide and ceramic precursor polymer, a solution obtained by hydrolysis/polymerization of a solution containing metal alkoxide by the sol gel method, or inorganic materials obtained by curing a combination of such inorganic materials, such as inorganic materials containing siloxane bond, may be used. The resinous sealings may be used either as a single kind of them or as a mixture of two or more kinds in any combination and in any ratio.

The amount of phosphor to be used, relative to that of the resinous sealing, is not particularly limited. However, it is usually 0.01 weight parts or more, preferably 0.1 weight parts or more, more preferably 1 weight parts or more, and usually 100 weight parts or less, preferably 80 weight parts or less, more preferably 60 weight parts or less, with respect to 100 weight parts of the resinous sealing.

The resinous sealing may contain substances other than phosphors or inorganic particles. The examples of such substances include a dye used for correcting color tone, antioxidant, phosphorus compound stabilizer for processing, oxidation and heat, light-resistant stabilizer such as UV absorbing agent and silane coupling agent. These substances can be used either as a single kind or as a mixture of two or more kinds in any combination and in any ratio.

No particular limitation is imposed on the light source, but the one having peak wavelength in the range of 350 nm to 500 nm can be preferably used. Concrete examples of the light source include a light-emitting diode (LED) and a laser diode (LD). Of these, a GaN LED and a GaN LD, which utilize semiconductors based on GaN compound, are preferable. This is because a GaN-based LED and a GaN-based LD have light output and external quantum efficiency far greater than those of an SiC-based LED and the like that emit the same range of light and therefore they can give very bright luminescence with very low electric power when used in combination with the above-mentioned phosphor. For example, when applying current load of 20 mA, a GaN-based LED and GaN-based LD usually have emission intensity 100 times or higher than that of an SiC-based ones. Among GaN LEDs and GaN LDs, the one having an $Al_XGa_YN$ luminous layer, GaN luminous layer or $In_XGa_YN$ luminous layer is preferable. Among GaN LEDs in particular, the one having $In_XGa_YN$ luminous layer is particularly preferable because emission intensity thereof is then very high. Among GaN LDs, the one having a multiple quantum well structure of $In_XGa_YN$ layer and GaN layer is particularly preferable because emission intensity thereof is then very high.

In the above description, the X+Y usually takes a value in the range of 0.8 to 1.2. A GaN-based LED having the above-mentioned kind of luminous layer that is doped with Zn or Si or without any dopant is preferable for the purpose of adjusting the luminescent characteristics.

GaN LED contains a such kind of luminous layer, p layer, n layer, electrode and substrate, as its basic components. Of these, the one having a heterostructure in which a luminous layer is sandwiched by n-type and p-type layers of $Al_xGa_yN$ layer, GaN layer or $In_xGa_yN$ layer is preferable because it can have high emission efficiency. Moreover, the one whose heterostructure is replaced by a quantum well structure is more preferable because it can have higher emission efficiency.

The light-emitting device emits white light. The emission efficiency of the light emitting device is 20 lm/W or more, preferably 22 lm/W or more, more preferably 25 lm/W or more, and particularly preferably 28 lm/W or more. The general color rendering index Ra thereof is 80 or more, preferably 85 or more, and more preferably 88 or more.

The light-emitting device can be used, for example, as a lamp for a lighting system, a back-lighting for a liquid crystal panel and the like, various kinds of lighting systems such as ultra-thin-type lighting system, as well as an image display, by using it alone or a plurality of them in combination.

Furthermore, the semiconductor device member of the present invention can be suitably used for sealing an LED element, particularly blue or ultraviolet LED element. Also, it can be preferably used for retaining a phosphor for a light source of a high-power lighting system, such as a white LED or a warm-white LED, in which the light from an excitation light source of blue or ultraviolet luminous element is converted in its wavelength by the phosphor. It can also be used as various display materials shown below, for its excellent characteristics such as heat resistance, UV resistance and transparency.

The examples of the display materials include: peripheral materials of a liquid crystal display such as substrate material, optical guide plate, prism sheet, polarizing plate, phase difference plate, viewing angle-correction film, adhesive and polarizer-protective film of a liquid crystal display; sealant, antireflection film, optical correction film, protective film for housing material or front glass, substitution material for front glass and adhesive of a color plasma display panel (PDP), which is one of next-generation flat-panel displays; substrate material, optical guide plate, prism sheet, polarizing plate, phase difference plate, viewing angle-correction film, adhesive and polarizer-protective film of a plasma address liquid crystal (PALC) display; protective film for front glass, substitution material for front glass and adhesive of an organic EL (electroluminescence) display; and various film substrates, protective film for front glass, substitution material for front glass and adhesive of a field emission display (FED).

The semiconductor device member of the present invention is superior in adhesion and it can be laminated by means of recoating, which has been difficult for conventionally-known addition condensation type silicone resins. Making the most of this characteristic, a laminar structure having different refractive indexes can be formed by such a method that, for example, a low-refractive-index layer of the semi-conductor device member of the present invention that consists mainly of methyl group is laminated with a high-refractive-index layer that is introduced with zirconia nano particles or high-refractive-index organic groups such as phenyl group. This can form a light guiding layer that is highly durable and excellent in adhesion and flexibility easily.

EXAMPLE

The present invention will be described more specifically below by using some examples, but these examples are for explaining the present invention and do not intend to limit the present invention to these aspects.

I First Example Group

[I-1] Analysis Method

Analyses were performed according to the following procedures for the semiconductor device member of each Example and Comparative Example described later.

[I-1-1] Measurement of Weight Loss at the Time of Heating (TG-DTA)

The weight loss at the time of heating was measured by a thermogravimetric/differential thermal analysis (hereinafter abbreviated as "TG-DTA" as appropriate) apparatus (TG/DTA6200, manufactured by Seiko Instrument Inc.) for a 10-mg fragment of the semiconductor device member of each Example and Comparative Example so that it was heated from 35° C. to 500° C. at a temperature rising rate of 10° C./min under 200-ml/min flow of air. A fragment of which precise weighing was difficult was treated in such a manner that, for example, a fragment within the range of 10±1 mg was taken as a fragment of 10 mg, in consideration of the significant figure range.

[I-1-2] Adhesion Evaluation Method (1) A hydrolyzed/polycondensated liquid (semiconductor-device-member formation liquid) of pre-curing semiconductor device member of each Example and Comparative Example was dropped into a silver-plated copper cup with a diameter of 9 mm and a depth at the recess of 1 mm and then cured under a predetermined curing conditions, thereby preparing a sample for measurement (semiconductor device member).

(2) The obtained samples for measurement were placed on an aluminum plate, which was coated with a thin layer of silicone grease for dissipating heat, with 1 mm in thickness, 25 mm in length and 70 mm in width, and let absorb moisture in an atmosphere of 85-° C. temperature and 85-% humidity (hereinafter referred to as "moisture absorption environment" as appropriate) for 20 hours.

(3) The samples for measurement, which absorbed moisture, were taken out from the moisture absorption environment of the above-mentioned (2) and then cooled to room temperature (20° C. to 25° C.). The samples for measurement, which absorbed moisture and were cooled to room temperature, were put on a hot plate, whose temperature was set at 260° C., together with the aluminum plate and kept for 1 minute. Under this condition, the temperature of the samples for measurement itself reached 260° C. in 50 seconds, and then they were kept at 260° C. for 10 seconds.

(4) The post-heated samples were then put on a cooling plate, which was made of stainless steel and set at room temperature, together with the aluminum plate so as to cool them to room temperature. Then the existence or the nonexistence of a peeling of the samples for measurement from the above-mentioned copper cup was observed both by visual inspection and with a microscope. Even a sample which was observed to have just a small peeling was labeled as "peeling generated".

(5) The ratio of peeling of the above-mentioned samples for measurement was determined by conducting the above operations (2), (3) and (4) for each of 10 samples for measurement.

[I-1-3] Hardness Measurement

Hardness (Shore A) of the semiconductor device member of each Example and Comparative Example was measured based on JIS K6253 using an A-type (durometer type A) rubber hardness scale manufactured by Kori Seiki MFG. Co., Ltd.

[I-1-4] Heat Resistance Test

A sample of 5 cm in diameter and 1.0 mm in film thickness of the semiconductor device member of each Example and Comparative Example, which was formed with a Teflon (registered trademark) petri dish, was kept in a forced-air drier at temperature of 200° C. for 500 hours. The change in transmittance of this sample with respect to light of 400-nm wavelength before and after the test was analyzed.

[I-1-5] Measurement of Silicon Content

A singly cured product of the semiconductor device member of each Example and Comparative Example was ground to pieces of about 100 μm and kept in a platinum crucible to be fired in the air at 450° C. for 1 hour, then at 750° C. for 1 hour and then at 950° C. for 1.5 hours. After removal of carbon components, the small amount of residue obtained is added with a 10-fold amount or more of sodium carbonate and then heated by a burner to melt it. Then the melted product was cooled and added with desalted water, being diluted to several ppm in silicon while adjusting pH value to around neutrality using hydrochloric acid. Then the ICP spectrometry was performed using "SPS1700HVR" manufactured by Seiko Instruments Inc.

[I-1-6] Continuous Lighting Test

A semiconductor light-emitting device was prepared using the sealant liquid obtained in each Example and Comparative Example. A driving current of 20 mA was passed through each semiconductor light-emitting device to continuously light at temperature of 85° C. and relative humidity of 85%. The brightness after elapse of 500 hours was compared with that before the lighting test.

In the above test, each semiconductor light-emitting device was prepared by the following procedure. Namely, a surface-mount type LED element 103 comprised of a cup 101 and an LED chip 102 was first prepared as LED light source, as shown in FIG. 50. The cup 101 was formed of polyphthalamide, and an electrode (not shown in the drawings) was provided on the bottom thereof. As LED chip 102, one having a face-up type GaN semiconductor of 405-nm emission-peak wavelength as its luminous layer was used. The LED chip 102 was attached by die bonding on the surface of the electrode that was provided inside the cup 101, using a die bonding device ("Manual Die Bonder" manufactured by Westbond) and epoxy resin as die bonding agent. Another electrode (not shown in the drawings) was provided on the top of LED chip 102. This electrode was electrically connected to the electrode of the cup 101 by wire bonding using a wire bonder "MB-2200" manufactured by Nippon Avionics Co., Ltd. with gold wire. The sealant liquid, prepared in each Example and Comparative Example, was dropped using a micro pipet in the cup 101 until the height thereof reached the upper edge of the cup. Then the sealant liquid was cured under a predetermined temperature condition, thereby obtaining a semiconductor light-emitting device comprising a transparent sealing layer (semiconductor device member).

[I-1-7] Heat Cycle Test

The sealant liquid of each Example and Comparative Example was potted into a surface-mount cup (an empty cup without a chip) made of polyphthalamide, and it was cured under predetermined curing conditions. This applied product in the empty PKG was placed in a small-size environment tester, "SH-241", manufactured by ESPEC CORP., and a heat cycle test of 200 cycles was carried out without a humidity regulation. The one cycle includes letting the product stand at −40° C. for 30 minutes, rising the temperature from −40° C. to 100° C. over 1 hour, letting the product stand at 100° C. for 30 minutes, and falling the temperature from 100° C. to −40° C. over 1 hour. This one cycle took 3 hours in total. The sample was taken out after the 200 cycles, and the existence or nonexistence of a peeling at the contact portion between the cup and the sealant liquid was observed using a stereoscopic microscope.

[I-2] Experimental Operations

Example I-1

140 g of double-ended silanol dimethyl silicone oil (XC96-723, manufactured by GE Toshiba Silicones Co., Ltd.), 14 g of phenyltrimethoxysilane, and 0.308 g of zirconium tetraacetylacetonate powder as a catalyst, were weighed into a three-necked flask fitted with a stir wing and a condenser, and the mixture was stirred for 15 minutes at room temperature until the catalyst dissolved sufficiently. Thereafter, the reaction solution was heated until the temperature reached 120° C. and kept at this temperature under total reflux for 30 minutes while being stirred, for initial hydrolysis.

Then, nitrogen gas was blown in by means of SV20, and methanol formed, water and low-boiling silicon components produced as by-product were distilled off, while stirring was continued at 120° C., to conduct polymerization reaction further for 6 hours. In this context, "SV" is an abbreviation of "Space Velocity" and indicates a blowing-in volume per unit time. Therefore, "SV 20" means that $N_2$ with volume of 20 times larger than that of the reaction solution was bubbled in per 1 hour.

Nitrogen gas blowing-in was stopped and the reaction solution was transferred to a round-bottomed flask after cooled to room temperature. Then the methanol, water and low-boiling silicon components, each remaining in just a little amount, were distilled off in an oil bath using a rotary evaporator at 120° C. at 1 kPa for 20 minutes. Thereby, a sealant liquid (semiconductor-device-member formation liquid) without containing a solvent was prepared.

2 g of the above-mentioned sealant liquid was placed in a Teflon (registered trademark) petri dish with a diameter of 5 cm, and the petri dish was held in an explosion-proof furnace under a mild stream of air at 110° C. for 1 hour and then 150° C. for 3 hours. Thereby, an independent, circular, and elastomer-like film with thickness of about 1 mm was obtained. Using this as a sample, the above-mentioned [I-1-1] measurement of weight loss at the time of heating (TG-DTA), [I-1-3] hardness measurement, [I-1-4] heat resistance test, and [I-1-5] measurement of silicon content were performed. The results are shown in Table 2. In Table 2, numerical values in the row of TG-DTA are negative numbers, which means that the weights were reduced.

In addition, using the sealant liquid, tests of the above-mentioned [I-1-2] adhesion evaluation method, [I-1-6] continuous lighting test, and [I-1-7] heat cycle test were performed. In these tests, the sealant liquid was cured being kept at 90° C. for 2 hours, at 110° C. for 1 hour, and then at 150° C. for 3 hours. This corresponds to the above-mentioned "predetermined curing conditions" in each explanation for the tests. The results are shown in Table 2.

Example I-2

100 g of double-ended silanol dimethyl silicone oil (XC96-723, manufactured by GE Toshiba Silicones Co., Ltd.), 10 g of phenyltrimethoxysilane, and 22 g of zirconium tetra n-propoxide solution (in which 5 weight parts of 75-weight % n-propanol solution of zirconium tetra n-propoxide was diluted with 95 weight parts of toluene) as catalyst were weighed into a three-necked flask fitted with a stir wing and a condenser. The mixture was stirred at room temperature under atmospheric pressure for 15 minutes to perform initial hydrolysis, and then heated under stirring at about 50° C. for 8 hours. Then the reaction solution was allowed to cool to room temperature, and transferred to a round-bottomed flask so as to distill off the solvent, and alcohol, water and low-boiling silicon components that were produced during the reaction, using a rotary evaporator at 50° C. and 1 kPa for 30 minutes. Thereby, a sealant liquid without solvent was obtained.

2 g of the above-mentioned sealant liquid was placed in a Teflon (registered trademark) petri dish with a diameter of 5 cm, in the same way as Example I-1. Then the petri dish was held in an explosion-proof furnace under a mild stream of air at 110° C. for 1 hour, and then 150° C. for 3 hours. Thereby, an independent, circular, and elastomer-like film with thickness of about 1 mm was obtained. Using this as a sample, the above-mentioned [I-1-1] measurement of weight loss at the time of heating (TG-DTA), [I-1-3] hardness measurement, [I-1-4] heat resistance test, and [I-1-5] measurement of silicon content were performed. The results are shown in Table 2.

In addition, using the sealant liquid, tests of the above-mentioned [I-1-2] adhesion evaluation method, [I-1-6] continuous lighting test, and [I-1-7] heat cycle test were performed. In these tests, the sealant liquid was cured under the same conditions as Example I-1. This corresponds to the above-mentioned "predetermined curing conditions" in each explanation for the tests. The results are shown in Table 2.

Eample I-3

27 g of methylhydrogen polysiloxane (KF-99, manufactured by Shin-Etsu Chemical Co., Ltd.), 32.41 g of vinyltrimethoxysilane manufactured by Tokyo Chemical Industry Co., Ltd., and an addition condensation catalyst, 5 ppm in terms of platinum element, were weighed into a 100-cc flask fitted with a stir wing and a Dimroth condenser, and they were mixed homogenously while being stirred. The liquid was heated at 100° C. for 20 hours under nitrogen atmosphere, thereby preparing a methoxy group-containing polydimethylsiloxane with a viscosity of 300 mPa·s. The measurement of the amount of residual vinyl group in the liquid by means of $^1$H-NMR found that it disappeared completely. To 1 g of the liquid, 10 g of double-ended silanol polydimethylsiloxane (XC96-723, manufactured by Momentive Performance Materials Inc.) and 0.011 g of zirconium tetraacetylacetonate powder as condensation catalyst were added, in a 100-ml round-bottomed flask. After a tight closure, the mixture was stirred at room temperature until the catalyst completely dissolved. Subsequently, the reaction solution was heated up to 110° C. under nitrogen atmosphere with a Dimroth condenser fitted, and then it was refluxed for 30 minutes. After cooling the reaction solution down to room temperature, the round-bottomed flask was connected to a rotary evaporator, and then the methanol, water and low-boiling silicon components, each remaining in just a little amount, were distilled off in an oil bath at 120° C. and 1 kPa for 30 minutes. Thereby, a sealant liquid (semiconductor-device-member formation liquid) without containing a solvent was prepared.

2 g of the above-mentioned sealant liquid was placed in a Teflon (registered trademark) petri dish with a diameter of 5 cm, and the petri dish was held in an explosion-proof furnace under a mild stream of air at 110° C. for 1 hour and then 150° C. for 3 hours. Thereby, an independent, circular, and elas- tomer-like film with thickness of about 1 mm was obtained. Using this as a sample, the above-mentioned [I-1-1] measurement of weight loss at the time of heating (TG-DTA), [I-1-3] hardness measurement, [I-1-4] heat resistance test, and [I-1-5] measurement of silicon content were performed. The results are shown in Table 2.

In addition, using the sealant liquid, tests of the above-mentioned [I-1-2] adhesion evaluation method, [I-1-6] continuous lighting test, and [I-1-7] heat cycle test were performed. In these tests, the sealant liquid was cured being kept at 90° C. for 2 hours, at 110° C. for 1 hour, and then at 150° C. for 3 hours. This corresponds to the above-mentioned "predetermined curing conditions" in each explanation for the tests. The results are shown in Table 2.

Comparative Example I-1

100 g of double-ended silanol dimethyl silicone oil (XC96-723, manufactured by GE Toshiba Silicones Co., Ltd.), 10 g of phenyltrimethoxysilane, and 22 g of aluminum triacetylacetonate methanol solution of 5 weight % as a catalyst were weighed into a three-necked flask fitted with a stir wing and a condenser, and the mixture was stirred at room temperature under atmospheric pressure for 15 minutes. After initial hydrolysis was performed, the mixture was caused to reflux while being stirred at about 75° C. for 4 hours. Subsequently, methanol and low-boiling silicon components were distilled off at a normal pressure until the internal temperature reached 100° C., and then the mixture was further caused to reflux while being stirred at 100° C. for 4 hours. The reaction mixture was cooled down to the room temperature to prepare a sealant liquid without containing a solvent.

2.5 g of the above-mentioned sealant liquid was placed in a Teflon (registered trademark) petri dish with a diameter of 5 cm, and the petri dish was held in an explosion-proof furnace under a mild stream of air at 50° C. for 30 minutes, then 110° C. for 1 hour, and then 150° C. for 3 hours. Thereby, an independent, circular, and elastomer-like film with thickness of about 1 mm was obtained. Using this as a sample, the above-mentioned [I-1-1] measurement of weight loss at the time of heating (TG-DTA), [I-1-3] hardness measurement, [I-1-4] heat resistance test, and [I-1-5] measurement of silicon content were performed. The results are shown in Table 2.

In addition, using the sealant liquid, tests of the above-mentioned [I-1-2] adhesion evaluation method, [I-1-6] continuous lighting test, and [I-1-7] heat cycle test were performed. In these tests, the sealant liquid was cured being kept at 50° C. for 30 minutes, then at 120° C. for 1 hour, and then at 150° C. for 3 hours. This corresponds to the above-mentioned "predetermined curing conditions" in each explanation for the tests. The results are shown in Table 2.

Comparative Example I-2

A commercially available silicone resin (JCR6101UP, manufactured by Dow Corning Toray Company, Limited) which is used as a molding agent for a semiconductor light-emitting device was on hand as the sealant liquid.

30 g of the sealant liquid was applied onto a Teflon (registered trademark) plate using an applicator, and, after vacuum deaeration at 25° C. for 1 hour, was dried by heating at 150° C. for 2 hours. An elastomer-like film with the thickness of about 1 mm was obtained by peeling off the applied product from the plate. Using this as a sample, the above-mentioned [I-1-1] measurement of weight loss at the time of heating (TG-DTA), [I-1-3] hardness measurement, [I-1-4] heat resistance test, and [I-1-5] measurement of silicon content were performed. The results are shown in Table 2.

In addition, using the sealant liquid, tests of the above-mentioned [I-1-2] adhesion evaluation method, [I-1-6] continuous lighting test, and [I-1-7] heat cycle test were performed. In these tests, the sealant liquid was cured being kept at 150° C. for 2 hours. This corresponds to the above-mentioned "predetermined curing conditions" in each explanation for the tests. The results are shown in Table 2. Incidentally, the sealing member obtained under the above-mentioned predetermined curing conditions was a sealing member in an elastomer state.

Comparative Example I-3

A commercially available two-component silicone resin (XJL0012, manufactured by PELNOX, LTD.) which is used as a molding agent for a semiconductor light-emitting device was prepared as the sealant liquid.

2 g of the above-mentioned sealant liquid was placed in a Teflon (registered trademark) petri dish with a diameter of 5 cm, and the petri dish was held in an explosion-proof furnace under a mild stream of air at 150° C. for 3 hours. Thereby, an independent, circular, transparent, and hard film with thickness of about 1 mm was obtained. Using this as a sample, the above-mentioned [I-1-1] measurement of weight loss at the time of heating (TG-DTA), [I-1-3] hardness measurement, [I-1-4] heat resistance test, and [I-1-5] measurement of silicon content were performed. The results are shown in Table 2.

In addition, using the sealant liquid, tests of the above-mentioned [I-1-2] adhesion evaluation method, [I-1-6] continuous lighting test, and [I-1-7] heat cycle test were performed. In these tests, the sealant liquid was cured being kept at 150° C. for 3 hours. This corresponds to the above-mentioned "predetermined curing conditions" in each explanation for the tests. The results are shown in Table 2. Incidentally, the sealing member obtained under the above-mentioned predetermined curing conditions was a transparent and hard sealing member.

Comparative Example I-4

30.80 g of methyl silicate (MKC silicate MS51, manufactured by Mitsubishi Chemical Corporation), 56.53 g of methanol, 6.51 g of water, and 6.16 g of a catalyst of 5-% methanol solution of acetylacetone aluminum salt were transferred to a vessel that can be closed tightly and then mixed. After tight closure, the mixture was heated in a hot water bath at 50° C. for 8 hours under stirring with a stirrer and then returned to room temperature. A hydrolyzed/polycondensated liquid was thus prepared.

10 ml of the above-mentioned hydrolyzed/polycondensated liquid was placed in a Teflon (registered trademark) petri dish with a diameter of 5 cm, and dried under the same conditions as in Example I-1. Thereby, a glass film of about 0.3 mm in thickness was obtained. However, in the course of drying, a large amount of cracks were generated and the glass film broke into pieces. Therefore, a circular, transparent glass film could not be isolated. However, by using this, [I-1-5] measurement of silicon content was performed.

On the other hand, the hydrolyzed/polycondensated liquid was dropped onto a GaN-based semiconductor light-emitting device having a luminous wavelength of 405 nm using a micro pipet. The device was kept at 35° C. for 30 minutes, and subsequently at 50° C. for 1 hour, to perform the first drying, and then kept at 150° C. for 3 hours to perform the second drying. However, a large amount of cracks appeared and therefore the film could not be used as a sealing member (semiconductor device member).

[Table 2]

TABLE 2

| | Example I-1 | Example I-2 | Example I-3 | Comparative Example I-1 | Comparative Example I-2 | Comparative Example I-3 | Comparative Example I-4 |
|---|---|---|---|---|---|---|---|
| TG-DTA [weight %] | −32 | −28 | −46 | −81 | −53 | −16 | −2 |
| Adhesion [%] | 0 | 0 | 0 | 0 | 40 | 100 | (*) |
| Hardness (Shore A) | 33 | 15 | 20 | 27 | 37 | 90< | (*) |
| Heat resistance [%] | 100 | 97 | 97 | 103 | 104 | 7 | (*) |
| Silicon content [weight %] | 38 | 38 | 38 | 38 | 35 | 21 | 43 |
| Continuous lighting test | no unlit, no peelings, no decrease in brightness | no unlit, no peelings, no decrease in brightness | no unlit, no peelings, no decrease in brightness | no unlit, no peelings, no decrease in brightness | no decrease in brightness, unlit ratio: 67% | decrease in brightness during the test, unlit ratio: 100% | (*) |
| Heat cycle test (ratio of peeling) [%] | 0 | 0 | 10 | 75 | 10 | 50 | (*) |

(*) Not measurable because cracks were generated

[I-3] Summary

It is evident from the above-mentioned Examples that the semiconductor device member of the present invention excels in heat resistance, adhesion to semiconductor device surfaces including silver surfaces, which are used often for electrodes and reflectors, and light resistance (especially, UV resistance). This leads to the exhibition of its ability to maintain its performances stably in the continuous lighting test under an accelerated environment of high temperature and high humidity, without causing a peeling, unlit device or brightness decrease due to adhesion decrease or degradation. Furthermore, the semiconductor device member of the present invention is highly resistant to thermal shock and shows no peelings in the heat cycle test, since it is high in adhesion to semiconductor devices and excels in its plasticity. Therefore, a semiconductor device having a superior reliability can be provided.

In contrast, the semiconductor device member of Comparative Example I-1 shows no coloring in the heat resistance test, in the same way as the member of each Example, but is insufficient in adhesion, leading to the occurrence of peeling in the heat cycle test. The semiconductor device member of Comparative Example I-2 shows no coloring in the heat resistance test, but is insufficient in adhesion to the silver surface in comparison with Examples I-1 and I-2 and Comparative Example I-1, leading to the occurrence of peeling and unlit device even in the continuous lighting test, as well as in the heat cycle test. The semiconductor light-emitting device member of Comparative Example I-3 is small in weight loss at the time of heating, since it is rigid and high in its degree of crosslinking due to a large amount of trifunctional silicons contained therein. However, since it is low in adhesion and poor in plasticity, all the devices were unlit in the continuous lighting test and the ratio of peeling was high in the heat cycle test. In addition, it shows considerable coloring, which originates from additives such as adhesion improvement agent, in the heat resistance test and also degradation in brightness in the continuous lighting test. The member obtained in Comparative Example I-4 is normally expected to be the highest in heat resistance and light resistance, since it consists of $SiO_2$. However, it could not be formed into a thick film of transparent sealing body, because the internal stress thereof during the curing originating from the shrinkage caused by desolvation or dehydration condensation is large and thus cracks are liable to appear during the curing.

The following forced peeling test showed that use of the semiconductor device member of the present invention together with a surface that is surface-treated for adhesion improvement can achieve an advantageous effect of further improvement in adhesion.

[Forced Peeling Test]

Example I-4: In a glass beaker, γ-methacryloxy propyltrimethoxysilane was added to 1-% acetic acid aqueous solution so that the concentration was 1 weight %, thereby preparing 100 g of a processing liquid. The liquid was stirred using a magnetic stirrer at room temperature for 1 hour, thereby preparing a transparent hydrolyzing liquid. A borosilicate glass plate was immersed in the hydrolyzing liquid and subjected to a surface treatment using a hot water bath at 50° C. for 1 hour. The post-treated glass plate was taken out from the processing liquid and washed lightly with water, avoiding contact of hands with the treated surfaces, followed by draining. Subsequently, it was baked with a forced-air drier of 100° C. for 1 hour. Then, 0.5 ml of the semiconductor-device-member formation liquid of Example I-1 was dropped on the surface of an untreated glass plate and the surface-treated glass plate, respectively. Then they were heated at 150° C. for 1.5 hours to be cured, thereby forming films with thicknesses of 50 μm. The films were then tried to be peeled by holding one edge thereof and drawing it slowly using tweezers. The film applied on the glass plate that had no surface treatment was peeled, with a certain amount of residues remained on the interface between the film and the glass. On the other hand, the film applied on the surface-treated glass plate was not able to be peeled, but it was broken.

As a result, the semiconductor device member of the present invention is superior in balance among heat resistance, light resistance, adhesion and film-formation capability, and it exhibits higher reliability than conventional semiconductor device members even under severe service conditions. In particular, since it is superior in transparency and UV resistance, it can be used preferably as a semiconductor light-emitting device member.

II Second Example Group

[II-1] Analysis Method

Analyses were performed according to the following procedures for the semiconductor device member of each Example and Comparative Example described later.

[II-1-1] Heat Resistance Test

A sample of 5 cm in diameter and 1.0 mm in film thickness of the sealant (semiconductor device member) of each Example and Comparative Example, which was formed with a Teflon (registered trademark) petri dish, was kept in a forced-air drier at temperature of 200° C. for 500 hours. The change in transmittance of this sample with respect to light of 400-nm wavelength before and after the test was analyzed.

[II-1-2] UV Resistance Test

A sample of 5 cm in diameter and 0.5 mm in film thickness of the sealant (semiconductor device member) of each Example and Comparative Example, which was formed with a Teflon (registered trademark) petri dish, was irradiated with an ultraviolet light. The maintenance rate of transmittance of the film with respect to light of 400-nm wavelength before and after the irradiation was measured.

Irradiation equipment: Accelerated light resistance test apparatus, Metering Weather Meter MV30, manufactured by Suga Test Instruments Co., Ltd.

Irradiation wavelength: Wavelength of 370 nm or longer, and center wavelength of 380 nm. This was created by filtering an irradiation light having wavelength of 255 nm or longer and main wavelengths of 300 nm to 450 nm (with emission lines from 480 nm to 580 nm) using a UV protection film.

Irradiation time: 72 hours

Radiant intensity: 0.6 kW/m$^2$

[II-1-3] Continuous Lighting Test

A semiconductor light-emitting device was prepared using the sealant liquid obtained in each Example and Comparative Example to be described later. For each of the semiconductor light-emitting devices, the following continuous lighting test was performed.

[II-1-3-1] Preparation of Semiconductor Light-emitting Device

After a square chip measuring 900 μm per side (C460-XB900, manufactured by Cree Inc.) was fixed to a sub mount with Au—Sn eutectic solder, the sub mount was fixed to a metal package, manufactured by MCO Co., ltd., with Au—Sn eutectic solder. The electrode on the chip and the pin on the metal package were connected by means of wire bonding using a gold wire.

[II-1-3-2] Continuous Lighting Test

The chip (semiconductor element) was illuminated at 85-° C. temperature and 85-% relative humidity for 500 hours in a continuous manner with 350 mA of driving current while maintaining the temperature of the emission surface at 100±10° C. The percentage of brightness after 500 hours illumination relative to that of just after switched on (brightness retention rate) was measured.

The brightness measurement was carried out in a thermostat bath of 25° C. using a spectroscope, "USB2000", manufactured by Ocean Optics, Inc. (wavelength range: 380 nm to 800 nm, light-reception method: integrating sphere of 100 mmφ). Heat was dissipated with an aluminum plate with thickness of 3 mm via a heat-conductive insulation heat, in order to prevent temperature rising.

[II-1-4] Adhesion Evaluation Method (1) A hydrolyzed/polycondensated liquid (semiconductor-device-member formation liquid) of pre-curing sealant of each Example and Comparative Example was dropped into a silver-plated copper cup with a diameter of 9 mm and a depth at the recess of 1 mm and then cured under a predetermined curing conditions, thereby preparing a sample for measurement.

(2) The obtained samples for measurement were placed on an aluminum plate, which was coated with a thin layer of silicone grease for dissipating heat, with 1 mm in thickness, 25 mm in length and 70 mm in width, and let absorb moisture in an atmosphere of 85-° C. temperature and 85-% humidity (hereinafter referred to as "moisture absorption environment" as appropriate) for 1 hour.

(3) The samples for measurement, which absorbed moisture, were taken out from the moisture absorption environment of the above-mentioned (2) and then cooled to room temperature (20° C. to 25° C.). The samples for measurement, which absorbed moisture and were cooled to room temperature, were put on a hot plate, whose temperature was set at 260° C., together with the aluminum plate and kept for 1 minute. Under this condition, the temperature of the samples for measurement itself reached 260° C. in 50 seconds, and then they were kept at 260° C. for 10 seconds.

(4) The post-heated samples were then put on a cooling plate, which was made of stainless steel and set at room temperature, together with the aluminum plate so as to cool them to room temperature. Then the existence or the nonexistence of a peeling of the samples for measurement from the above-mentioned copper cup was observed both by visual inspection and with a microscope. Even a sample which was observed to have just a small peeling was labeled as "peeling generated".

(5) The ratio of peeling of the above-mentioned samples for measurement was determined by conducting the above operations (2), (3) and (4) for each of 10 samples for measurement.

[II-2] Experimental Operations

Example II-1

140 g of double-ended silanol dimethyl silicone oil (XC96-723, manufactured by GE Toshiba Silicones Co., Ltd.), 14 g of phenyltrimethoxysilane, and 0.308 g of zirconium tetraacetylacetonate powder as a catalyst, were weighed into a three-necked flask fitted with a stir wing and a condenser, and the mixture was stirred for 15 minutes at room temperature until the catalyst dissolved sufficiently. Thereafter, the reaction solution was heated until the temperature reached 120° C. and kept at this temperature under total reflux for 30 minutes while being stirred, for initial hydrolysis.

Then, nitrogen gas was blown in by means of SV20, and methanol formed, water and low-boiling silicon components produced as by-product were distilled off, while stirring was continued at 120° C., to conduct polymerization reaction further for 6 hours. In this context, "SV" is an abbreviation of "Space Velocity" and indicates a blowing-in volume per unit time. Therefore, "SV 20" means that $N_2$ with volume of 20 times larger than that of the reaction solution was blowed in per 1 hour.

Nitrogen gas blowing-in was stopped and the reaction solution was transferred to a round-bottomed flask after cooled to room temperature. Then the methanol, water and low-boiling silicon components, each remaining in just a little amount, were distilled off in an oil bath using a rotary evaporator at 120° C. at 1 kPa for 20 minutes. Thereby, a sealant liquid (semiconductor-device-member formation liquid) without containing a solvent was prepared.

2 g of the above-mentioned sealant liquid was placed in a Teflon (registered trademark) petri dish with a diameter of 5 cm, and the petri dish was held in an explosion-proof furnace under a mild stream of air at 110° C. for 1 hour and then 150° C. for 3 hours. Thereby, an independent, circular, and elastomer-like film with thickness of about 1 mm was obtained.

Using this as a sample, each evaluation of the above-mentioned [II-1] was performed. The results are shown in Table 3.

Example II-2

100 g of double-ended silanol dimethyl silicone oil (XC96-723, manufactured by GE Toshiba Silicones Co., Ltd.), 10 g of phenyltrimethoxysilane, and 22 g of zirconium tetra n-propoxide solution (in which 5 weight parts of 75-weight % n-propanol solution of zirconium tetra n-propoxide was diluted with 95 weight parts of toluene) as catalyst were weighed into a three-necked flask fitted with a stir wing and a condenser. The mixture was stirred at room temperature under atmospheric pressure for 15 minutes to perform initial hydrolysis, and then heated under stirring at about 50° C. for 8 hours. Then the reaction solution was allowed to cool to room temperature, and transferred to a round-bottomed flask so as to distill off the solvent, and alcohol, water and low-boiling silicon components that were produced during the reaction, using a rotary evaporator at 50° C. and 1 kPa for 30 minutes. Thereby, a sealant liquid without solvent was obtained.

2 g of the above-mentioned sealant liquid was placed in a Teflon (registered trademark) petri dish with a diameter of 5 cm, in the same way as Example II-1. Then the petri dish was held in an explosion-proof furnace under a mild stream of air at 110° C. for 1 hour, and then 150° C. for 3 hours. Thereby, an independent, circular, and elastomer-like film with thickness of about 1 mm was obtained. Using this as a sample, each evaluation of the above-mentioned [II-1] was performed. The results are shown in Table 3.

Example II-3

27 g of methylhydrogen polysiloxane (KF-99, manufactured by Shin-Etsu Chemical Co., Ltd.), 32.41 g of vinyltrimethoxysilane manufactured by Tokyo Chemical Industry Co., Ltd., and an addition condensation catalyst, 5 ppm in terms of platinum element, were weighed into a 100-cc flask fitted with a stir wing and a Dimroth condenser, and they were mixed homogenously while being stirred. The liquid was heated at 100° C. for 20 hours under nitrogen atmosphere, thereby preparing a methoxy group-containing polydimethylsiloxane with a viscosity of 300 mPa·s. The measurement of the amount of residual vinyl group in the liquid by means of $^1$H-NMR found that it disappeared completely. To 1 g of the liquid, 10 g of double-ended silanol polydimethylsiloxane (XC96-723, manufactured by Momentive Performance Materials Inc.) and 0.011 g of zirconium tetraacetylacetonate powder as condensation catalyst were added, in a 100-ml round-bottomed flask. After a tight closure, the mixture was stirred at room temperature until the catalyst completely dissolved. Subsequently, the reaction solution was heated up to 110° C. under nitrogen atmosphere with a Dimroth condenser fitted, and then it was refluxed for 30 minutes. After cooling the reaction solution down to room temperature, the round-bottomed flask was connected to a rotary evaporator, and then the methanol, water and low-boiling silicon components, each remaining in just a little amount, were distilled off in an oil bath at 120° C. and 1 kPa for 30 minutes. Thereby, a sealant liquid (semiconductor-device-member formation liquid) without containing a solvent was prepared.

Using the sealant liquid, tests of the above-mentioned [II-1-1] heat resistance test, [II-1-2] UV resistance test, [II-1-3] continuous lighting test, and [II-1-4] adhesion evaluation method were performed. In these tests, the sealant liquid was cured being kept at 90° C. for 2 hours, then at 110° C. for 1 hour, and then at 150° C. for 3 hours. This corresponds to the above-mentioned "predetermined curing conditions" in each explanation for the tests. The results are shown in Table 3.

Comparative Example II-1 to Comparative Example II-4

By using commercially available sealants shown in Table 3, each evaluation of the above-mentioned [II-1] was performed. The results are shown in Table 3.
[Table 3]

TABLE 3

|  |  | Example II-1 | Example II-2 | Example II-3 | Comparative Example II-1 | Comparative Example II-2 | Comparative Example II-3 | Comparative Example II-4 |
|---|---|---|---|---|---|---|---|---|
| Company name of the product |  |  |  |  | Dow Corning Toray | Dow Corning Toray | GE Toshiba | GE Toshiba |
| Product name |  |  |  |  | EG6301 | JCR6175 | IVS4012 | IVS5332 |
| Functional group capable of forming a hydrogen bond |  | Methoxy group, Silanol group | Methoxy group, Silanol group | Methoxy group, Silanol group | Unknown | Methoxy group, Epoxy group | Ethoxy group | Ethoxy group |
| Transmittance retention rate (%) in [II-1-1] Heat resistance test |  | 100 | 98 | 97 | 95 | 88 | Unmeasureable because unable to prepare disc due to gel state | 60 |
| Transmittance retention rate (%) in [II-1-2] UV resistance test |  | 80≦ | 80≦ | 80≦ | 80≦ | 80≦ | 80≦ | 80≦ |
| Brightness retention rate (%) in [II-1-3] Continuous lighting test |  | 98 | 100 | 95 | 89 | 43 | (—) | 52.1 |
| ratio of peeling in [II-1-4] Adhesion evaluation (%) | alumina ceramic package | 0 | 0 | 0 | 0 | 90 | 100 | 0 |
|  | Silver-plated metal package | 0 | 0 | 0 | 70 | 80 | 100 | 50 |
|  | Observation | No change | No change | No change | Yellow coloration of alumina package just by moisture absorption | Yellow coloration of alumina package just by moisture absorption, Fuming during reflow | Numerous foamings generated | Numerous foamings generated |

Industrial Applicability

The semiconductor device member of the present invention is not particularly limited in its use and can be used for various purposes typified by a member for sealing (namely, a sealant for) a semiconductor element or the like. Among them, it can be particularly preferably used as a sealant or a light extracting film for a blue LED or a near-ultraviolet LED, or as a phosphor-retaining agent for a high-power white LED, in which a luminous element such as a blue LED, a near-ultraviolet LED or the like is used as its light source.

Furthermore, the semiconductor device member of the present invention can be suitably used for sealing an LED element, particularly blue or ultraviolet LED element. Also, it can be preferably used for retaining a phosphor for a light source of a high-power lighting system, such as a white LED or a warm-white LED, in which the light from an excitation light source of blue or ultraviolet luminous element is converted in its wavelength by the phosphor. It can also be used as various image display materials shown below, for its excellent characteristics such as heat resistance, UV resistance and transparency.

The examples of the image display materials include: peripheral materials of a liquid crystal display such as substrate material, optical guide plate, prism sheet, deflection plate, phase difference plate, viewing angle-correction film, adhesive and polarizer-protective film of a liquid crystal display; sealant, antireflection film, optical correction film, protective film for housing material or front glass, substitution material for front glass, and adhesive of a color plasma display panel (PDP), which is one of next-generation flat-panel displays; substrate material, optical guide plate, prism sheet, deflection plate, phase difference plate, viewing angle-correction film, adhesive and polarizer-protective film of a plasma address liquid crystal (PALC) display; protective film for front glass, substitution material for front glass and adhesive of an organic EL (electroluminescence) display; and various film substrates, protective film for front glass, substitution material for front glass and adhesive of a field emission display (FED).

The semiconductor-device-member formation liquid of the present invention is superior in adhesion and it can be laminated by means of recoating, which has been difficult for conventionally-known addition condensation type silicone resins. Making the most of this characteristic, a laminar structure having different refractive indexes can be formed by such a method that, for example, a low-refractive-index layer of the semiconductor-device-member formation liquid of the present invention that consists mainly of methyl group is laminated with a high-refractive-index layer that is introduced with zirconia nano particles or high-refractive-index organic groups such as phenyl group. This can form a light guiding layer that is highly durable and excellent in adhesion and flexibility easily.

The present invention has been explained in detail above with reference to specific embodiments. However, it is evident to those skilled in the art that various modifications can be added thereto without departing from the intention and the scope of the present invention.

The present application is based on Japanese Patent Application (No. 2006-225410) filed on Aug. 22, 2006, Japanese Patent Application (No. 2006-226856) filed on Aug. 23, 2006, Japanese Patent Application (No. 2007-216451) filed on Aug. 22, 2007, and Japanese Patent Application (No. 2007-216452) filed on Aug. 22, 2007, and their entireties are incorporated herewith by reference.

The invention claimed is:

1. A semiconductor device member having a siloxane skeletal structure serving as a basic skeleton, a silicon content of 25 weight % or more, and a ratio of (total area of peaks of the chemical shift of −40 ppm or more and 0 ppm or less)/(total area of peaks of the chemical shift of less than −40 ppm) in a solid Si-nuclear magnetic resonance spectrum of 3 or more and 200 or less,
wherein the semiconductor device member has a weight loss at the time of heating of 50 weight % or lower, and a ratio of peeling of 30% or lower, wherein the weight loss is measured by
obtaining a 10-mg fragment of said semiconductor device member, heating said fragment from 35° C. to 500° C. at a temperature rising rate of 10° C./min under 200-ml/min flow of air, and measuring the weightloss with a thermogravimetric/differential thermal analyzer, and wherein the ratio of pealing is measured by
dropping a semiconductor-device-member formation liquid into a silver-plated copper cup having a diameter of 9 mm and a depth at the recess of 1 mm curing the formation liquid to obtain the semiconductor device member,
letting the obtained semiconductor device member absorb moisture in an atmosphere of 85-° C. temperature and 85-% humidity for 20 hours,
heating the semiconductor device member that absorbed moisture from room temperature to 260° C. in 50 seconds, and then keeping the semiconductor device member at 260° C. for 10 seconds,
cooling said heated semiconductor device member to room temperature, and observing the existence or the nonexistence of a peeling of said semiconductor device member from the above-mentioned copper cup both by visual inspection and with a microscope, and
determining the ratio of peeling of said semiconductor device member by repeating the above operations on 10 different samples of said semiconductor device member.

2. A semiconductor device member having a siloxane skeletal structure serving as a basic skeleton, a silicon content of 25 weight % or more, and a ratio of (total area of peaks of the chemical shift of less than −40 ppm or more and 0 ppm or less)/(total area of peaks of the chemical shift of less than −40 ppm) in a solid Si-nuclear magnetic resonance spectrum of 3 or more and 200 or less, the semiconductor device member having a weight loss at the time of heating of 50 weight % or lower, and a measurement value of hardness (Shore A) by durometer type A of 5 or larger and 90 or smaller; wherein the weight-loss is measured by
obtaining a 10-mg fragment of said semiconductor device member, heating said fragment from 35° C. to 500° C. at a temperature rising rate of 10° C./min under 200-ml/min flow of air, and measuring the weightloss with a thermogravimetric/differential thermal analyzer.

3. A semiconductor device member according to claim 1 or claim 2, wherein the semiconductor device member comprises an inorganic particle.

4. A semiconductor device member according to claim 1 or claim 2, wherein the semiconductor device member comprises a phosphor.

5. A production method of the semiconductor device member of claim 1, comprising drying a polycondensate obtained by a process comprising performing hydrolysis and polycondensation of a compound represented by the following formula (1) and/or an oligomer thereof, wherein
the hydrolysis and polycondensation are performed in the presence of an organometallic compound catalyst comprising at least one element selected from the group consisting of zirconium, hafnium, tin, zinc and titanium, wherein formula (1) is represented by $$M^{m+}X_nY^1{}_{m-n} \quad (1)$$

wherein
M represents at least one element selected from the group consisting of silicon, aluminum, zirconium and titanium,
X represents a hydrolyzable group,
$Y^1$ represents a univalent organic group,
m represents an integer of 1 or larger representing the valence of M, and
n represents an integer of 1 or larger representing the number of X groups, where m≧n.

6. A production method of the semiconductor device member of claim 1, comprising drying a polycondensate obtained by a process comprising performing hydrolysis and polycondensation of a compound represented by the following formula (2) and/or an oligomer thereof, wherein
the hydrolysis and polycondensation are performed in the presence of an organometallic compound catalyst comprising at least one element selected from the group consisting of zirconium, hafnium, tin, zinc and titanium.

$$(M^{s+}X_tY^1{}_{s-t-1})_uY^2 \quad (2)$$

wherein
M represents at least one element selected from silicon, aluminum, zirconium and titanium,
X represents a hydrolyzable group,
$Y^1$ represents a univalent organic group,
$Y^2$ represents a u-valent organic group,
s represents an integer of 2 or larger representing the valence of M,
t represents an integer of 1 or larger and s−1 or smaller, and
u represents an integer of 2 or larger.

7. A semiconductor light-emitting device comprising an (A) package, (B) semiconductor element and (C) sealant, wherein the (C) sealant is the semiconductor device member according to claim 1, and
the surface materials of said (A) package and/or said (B) semiconductor element contain one or more of Si, Al and Ag, and
said (C) sealant is in direct contact with the surface materials of said (A) package and/or said (B) semiconductor element and satisfies all of the following conditions (i) to (iii):
(i) said sealant has a functional group capable of forming a hydrogen bond with an oxygen in a metalloxane bond or a hydroxyl group, which is present on the surface of a ceramic or a metal, (ii) the maintenance rate of transmittance with respect to light of 400-nm wavelength before and after being kept at temperature of 200° C. for 500 hours is 80% or more and 110% or less, and (iii) the maintenance rate of transmittance with respect to the light of 400-nm wavelength before and after being irradiated with light having wavelength of 370 nm or longer and center wavelength of 380 nm and radiant intensity of 0.6 kW/m$^2$ for 72 hours is 80% or more and 110% or less.

8. A semiconductor light-emitting device according to claim 7, further satisfying the following condition (iv):

(iv) the ratio of brightness after 500 hours illumination, in which a square semiconductor element measuring 900 μm per side having 460±10 nm of luminous wavelength is illuminated at 85-° C. temperature and 85-% relative humidity for 500 hours in a continuous manner with 350 mA of driving current while maintaining the temperature of the emission surface at 100±10° C., relative to that of just after switched on is 90% or higher.

9. A semiconductor light-emitting device according to claim 7 or claim 8, wherein the surface materials of the (A) package and/or the (B) semiconductor element contain one or more of SiN$_x$, SiC and SiO$_2$.

10. A semiconductor light-emitting device according to claim 7 or claim 8, wherein the surface materials of the (A) package and/or the (B) semiconductor element contain one or more of Al, AlN and Al$_2$O$_3$.

11. A semiconductor light-emitting device according to claim 7 or claim 8, wherein the (B) semiconductor element contains the surface material in its substrate part.

12. A semiconductor light-emitting device according to claim 7 or claim 8, wherein the area of the emission surface of the (B) semiconductor element is 0.15 mm$^2$ or larger.

13. A semiconductor light-emitting device according to claim 7 or claim 8, wherein the surface temperature of the emission surface of the (B) semiconductor element during operation is 80° C. or higher and 200° C. or lower.

14. A semiconductor light-emitting device according to claim 7 or claim 8, wherein the amount of electric power during operation is 0.1 W or larger.

15. A lighting system formed using a semiconductor light-emitting device according to claim 7 or claim 8.

16. An image display formed using a semiconductor light-emitting device according to claim 7 or claim 8.

* * * * *